(12) United States Patent
Noguchi

(10) Patent No.: US 7,518,915 B2
(45) Date of Patent: Apr. 14, 2009

(54) NONVOLATILE SEMICONDUCTOR STORAGE DEVICE

(75) Inventor: Mitsuhiro Noguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 112 days.

(21) Appl. No.: 11/622,303

(22) Filed: Jan. 11, 2007

(65) Prior Publication Data

US 2007/0171720 A1    Jul. 26, 2007

(30) Foreign Application Priority Data

Jan. 23, 2006   (JP)  ............................. 2006-013761
May 19, 2006   (JP)  ............................. 2006-140327

(51) Int. Cl.
*G11C 11/34* (2006.01)

(52) U.S. Cl. ............................. 365/185.05; 365/185.11; 257/318

(58) Field of Classification Search ............ 365/185.11, 365/185.05; 257/315, 316
See application file for complete search history.

(56) References Cited

U.S. PATENT DOCUMENTS 6,411,548 B1 *   6/2002   Sakui et al. ............ 365/185.17
6,819,590 B2 *   11/2004   Goda et al. ............ 365/185.03
6,844,590 B2     1/2005   Goda et al.
6,925,008 B2 *   8/2005   Ichige et al. ........... 365/185.17
6,937,514 B2 *   8/2005   Hasegawa .............. 365/185.12
6,969,660 B2    11/2005   Goda et al.

FOREIGN PATENT DOCUMENTS

JP     2005-79165     3/2005

* cited by examiner

*Primary Examiner*—Son T. Dinh
(74) *Attorney, Agent, or Firm*—Oblon, Spivak, McClelland, Maier & Neustadt, P.C.

(57) ABSTRACT

In a nonvolatile semiconductor storage device having a plurality of NAND strings, each NAND string includes a memory cell block obtained by connecting a plurality of nonvolatile memory cells in series, a first selection gate transistor connected to a data transfer line contact, and a second selection gate transistor connected to a source line contact. The upper surface of an isolation insulating film between adjacent data transfer line contacts is higher than the major surface of a semiconductor substrate in a device area between the first selection gate transistor and data transfer line contact. Alternatively, the upper surface of an isolation insulating film between adjacent source line contacts is higher than the major surface of the semiconductor substrate in a device area between the second selection gate transistor and source line contact.

20 Claims, 36 Drawing Sheets

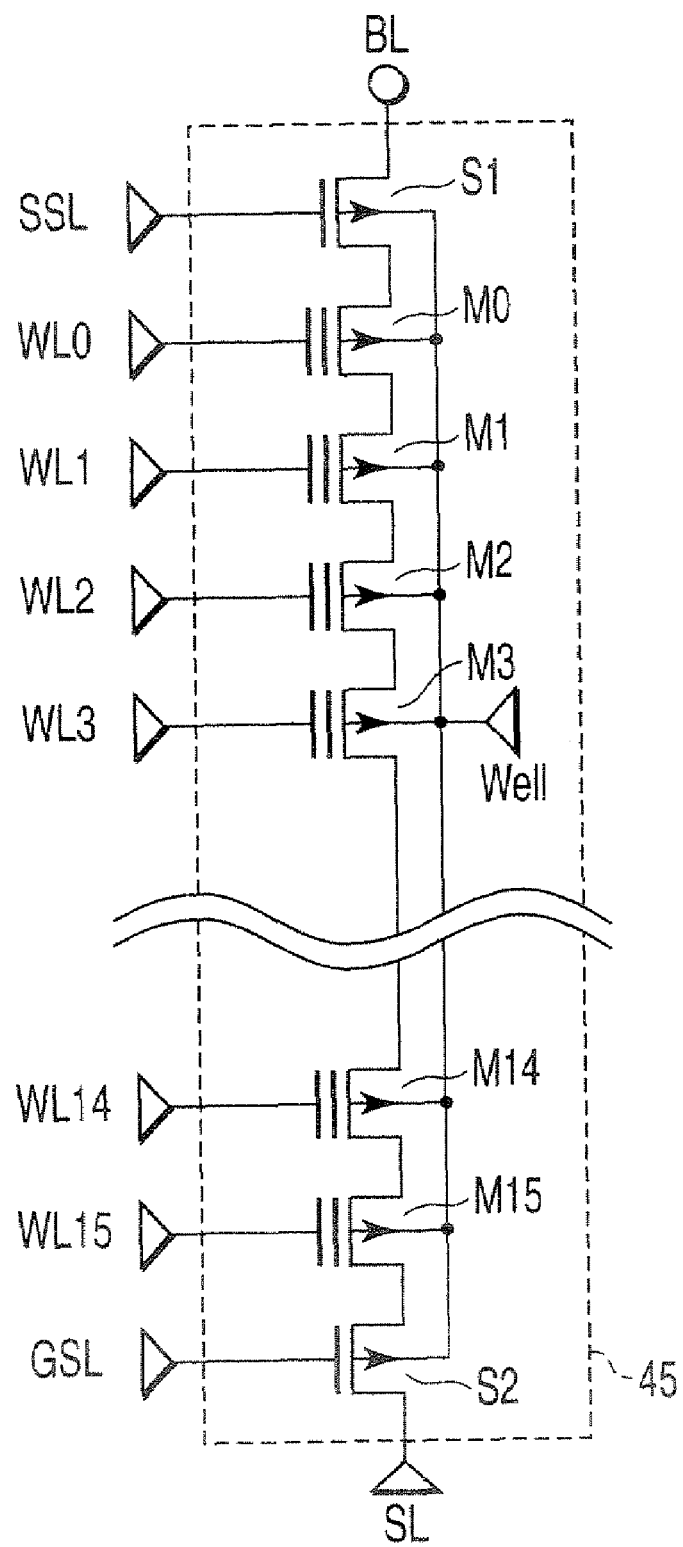
F I G. 1

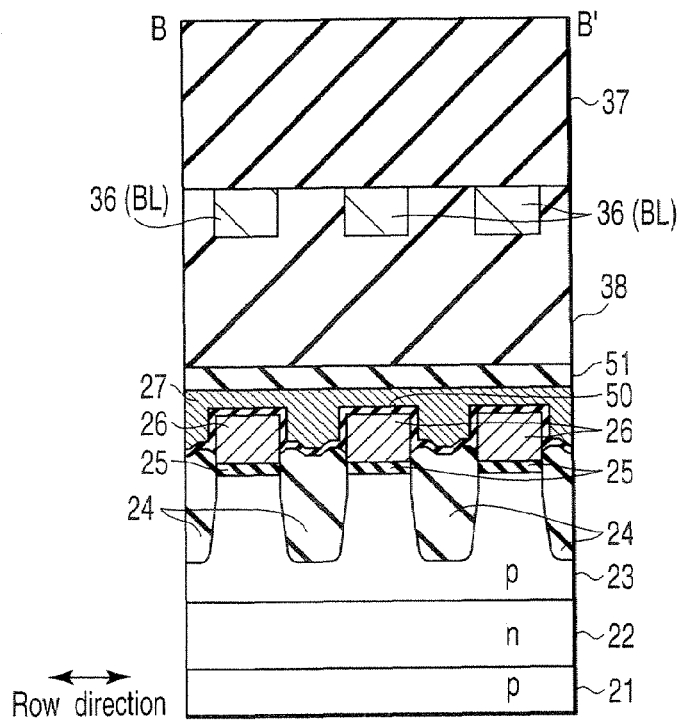
F I G. 29
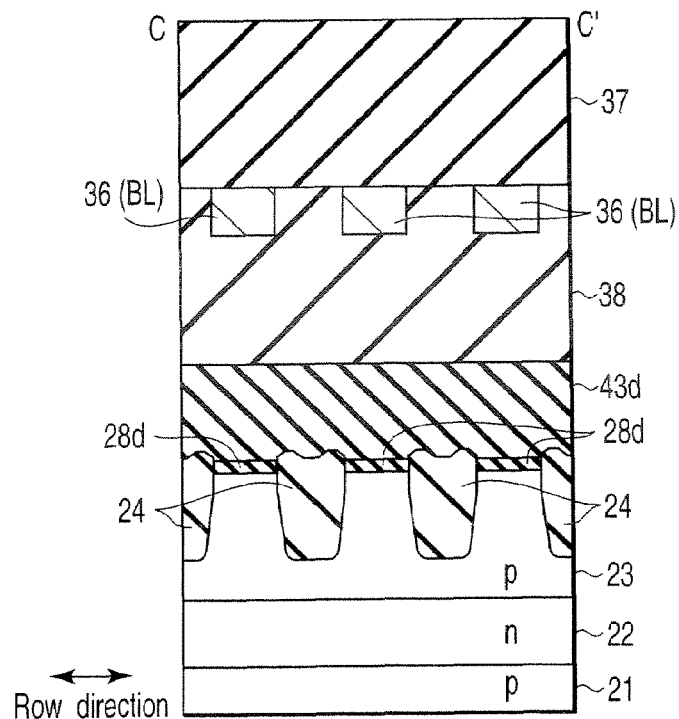
F I G. 30

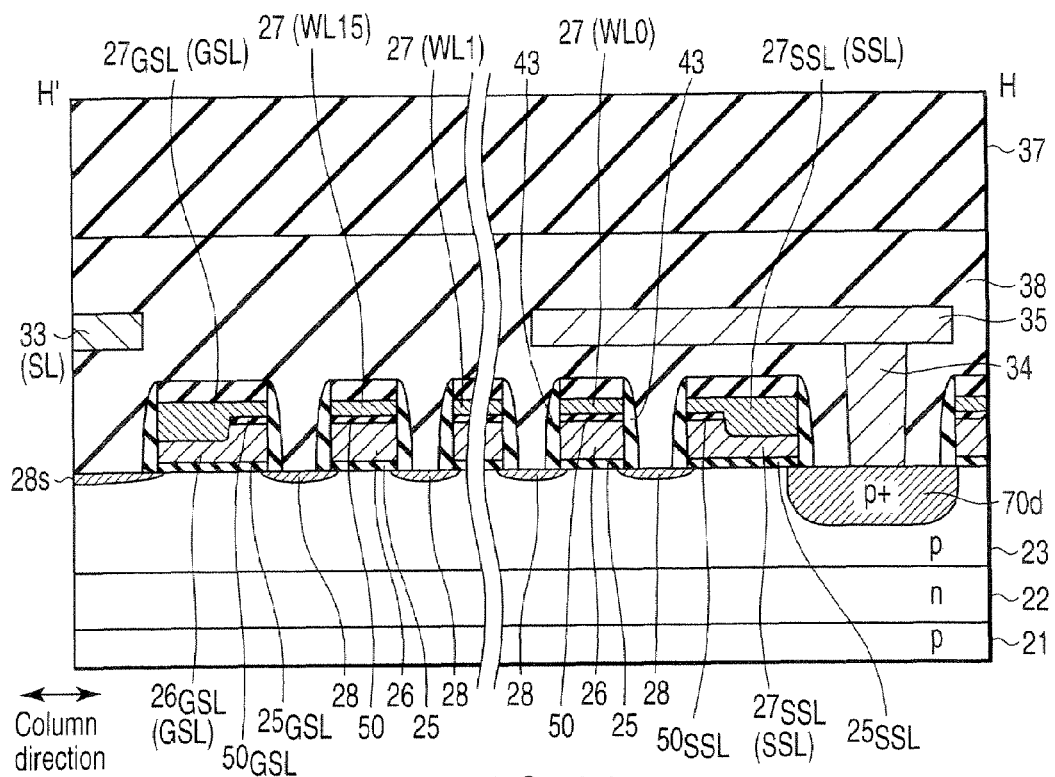
F I G. 4 9
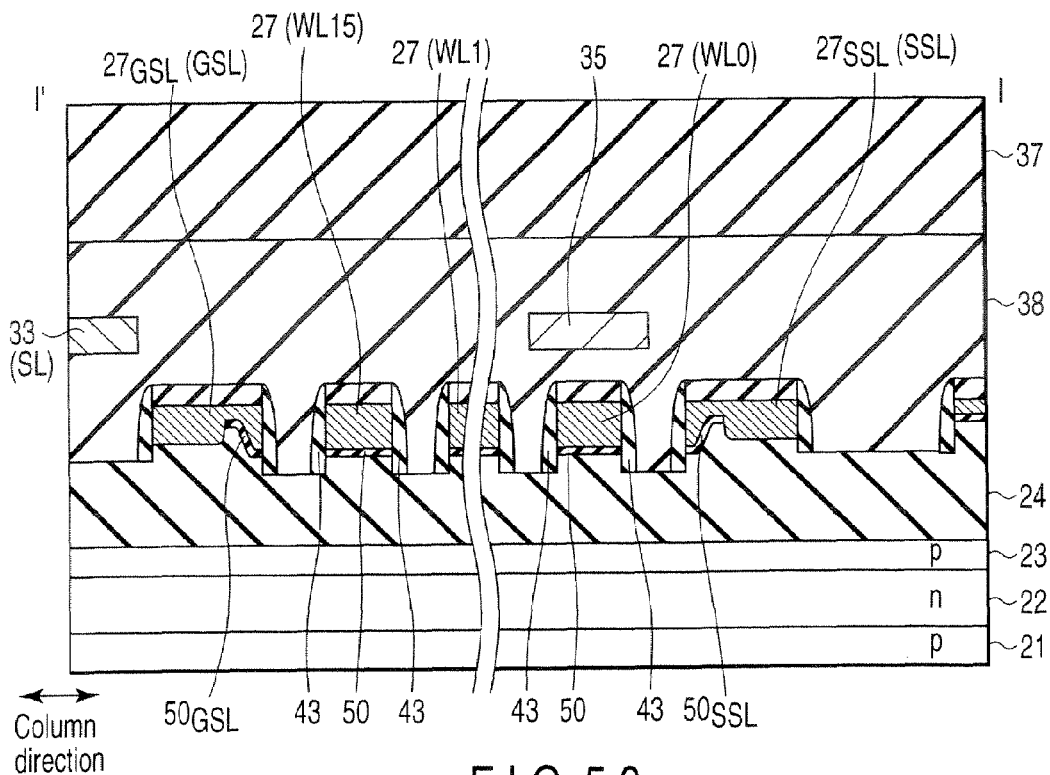
F I G. 5 0

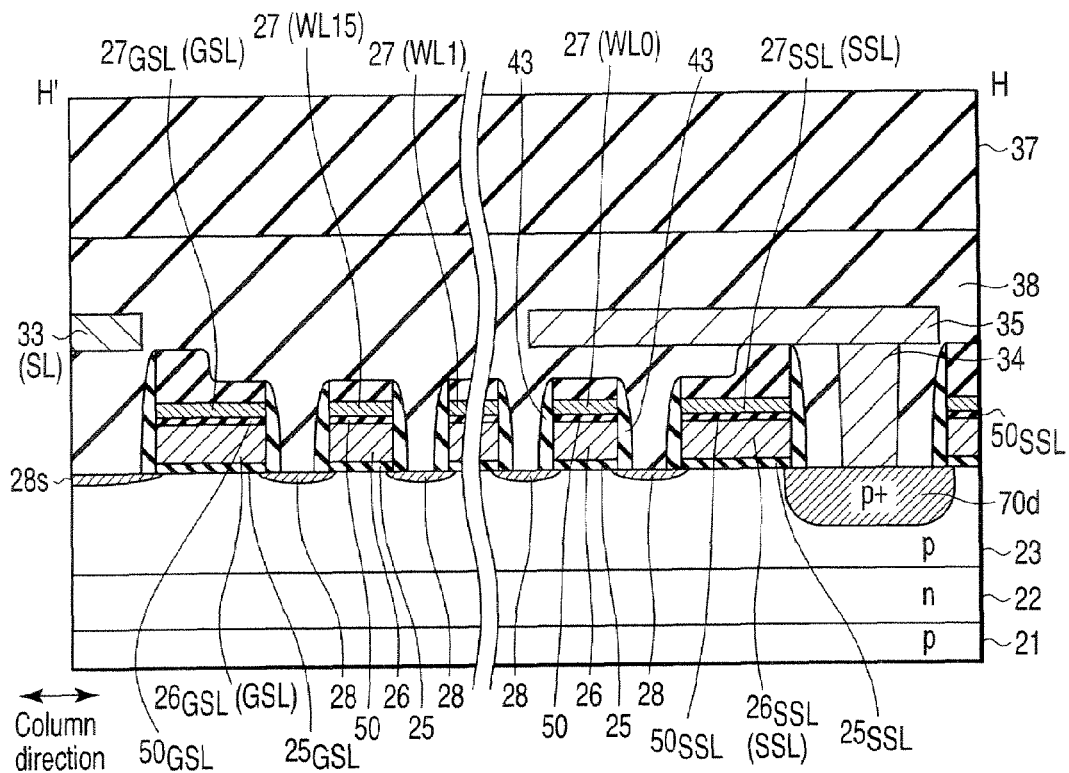
F I G. 5 5
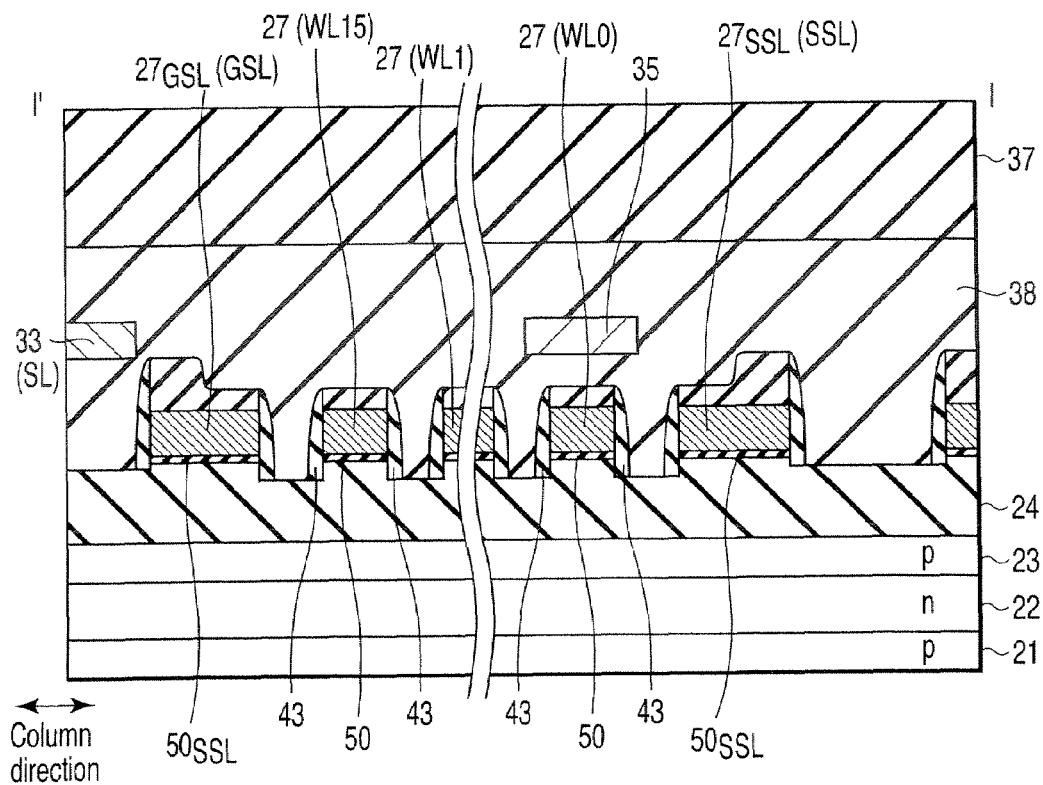
F I G. 5 6

NONVOLATILE SEMICONDUCTOR STORAGE DEVICE

CROSS-REFERENCE TO RELATED APPLICATIONS

This application is based upon and claims the benefit of priority from prior Japanese Patent Applications No. 2006-013761, filed Jan. 23, 2006; and No. 2006-140327, filed May 19, 2006, the entire contents of both of which are incorporated herein by reference.

BACKGROUND OF THE INVENTION

1. Field of the Invention

The present invention relates to a nonvolatile semiconductor storage device which includes a plurality of memory cell blocks comprising nonvolatile semiconductor storage elements each having a floating gate electrode, and selects a memory cell block by a selection gate transistor.

2. Description of the Related Art

A memory cell of an EEPROM generally has a MISFET structure formed by stacking a floating gate electrode (charge storage layer) and control gate electrode on a semiconductor substrate. This nonvolatile memory cell transistor stores data by using the difference between a threshold value in a state in which electric charge is injected to the floating gate electrode and a threshold value in a state in which the electric charge is removed. A tunnel current acts to inject and remove the electric charge via a tunnel insulating film between the floating gate electrode and a substrate channel.

An EEPROM having a NAND cell unit formed by connecting a plurality of memory cells in series is a so-called NAND EEPROM. The NAND EEPROM can increase the memory density because the number of selection transistors is smaller than that of an EEPROM in which each memory cell has a selection gate.

A flash memory erases data by allowing a tunnel current to flow via a tunnel insulating film between a floating gate electrode and substrate channel, so as not to be readily influenced by the short channel effect during data erase. For example, this erase is executed in a plurality of memory cells at the same time in order to increase the number of memory cells to be erased per unit time. Therefore, electrons are extracted from the floating gate electrode to the substrate by applying a positive voltage of 10 V or more, e.g., 20 V to a semiconductor memory cell well in which memory cells are formed.

On the other hand, data write is performed by holding the semiconductor well voltage at zero, and applying a positive voltage of 10 V or more to the source/drain diffusion layers of the memory cell having a charge/discharge capacity smaller than that of the semiconductor well. This makes it possible to reduce the electric power for charging/discharging the well, and increase the operating speed.

To avoid imperfect data write in, e.g., NAND-connected memory cells, it is necessary to adequately decrease the variations in threshold value of unselected memory cells connected in series with a selected memory cell, thereby reducing current variations when data is read out from the selected memory cell. To maintain a narrow threshold value distribution after data write and reduce chip variations, the positive voltage described above must be controlled within the variation range of, e.g., 0.5 V or less. Accordingly, a large leakage current or low breakdown voltage of the control gate electrode or a large threshold value variation causes imperfect data write.

Note that as a related technique of this type, a technique pertaining to an isolation in a NAND flash memory is disclosed (Jpn. Pat. Appln. KOKAI Publication No. 2005-79165).

BRIEF SUMMARY OF THE INVENTION

The first aspect of the present invention is a nonvolatile semiconductor storage device comprising a plurality of juxtaposed NAND strings, each of the plurality of NAND strings comprising: a memory cell block obtained by connecting current paths of a plurality of nonvolatile memory cells in series, each of the plurality of nonvolatile memory cells comprising a floating gate electrode formed on a first insulating film on a device area isolated by an isolation insulating film which forms an isolation in a semiconductor substrate, and a control gate electrode formed on a second insulating film on the floating gate electrode to cover side surfaces and an upper surface of the floating gate electrode; a first selection gate transistor comprising a first gate electrode in which a first electrode layer made of the same electrode material as the floating gate electrode and a second electrode layer made of the same electrode material as the control gate electrode are formed in direct contact with each other through a first hole formed in a portion of a third insulating film made of the same insulating material as the second insulating film, a current path of the first selection gate transistor comprising one end connected to one end of current paths of series-connected nonvolatile memory cells in the memory cell block, and the other end connected to a data transfer line via a data transfer line contact; and a second selection gate transistor comprising a second gate electrode in which a third electrode layer made of the same electrode material as the floating gate electrode and a fourth electrode layer made of the same electrode material as the control gate electrode are formed in direct contact with each other through a second hole formed in a portion of a fourth insulating film made of the same insulating material as the second insulating film, a current path of the second selection gate transistor comprising one end connected to the other end of the current paths of the series-connected nonvolatile memory cells in the memory cell block, and the other end connected to a source line via a source line contact, wherein an upper surface of the isolation insulating film between the data transfer line contacts included in adjacent NAND strings is higher than a major surface of the semiconductor substrate in a device area between the other end of the current path of the first selection gate transistor and the data transfer line contact, or an upper surface of the isolation insulating film between the source line contacts included in adjacent NAND strings is higher than a major surface of the semiconductor substrate in a device area between the other end of the current path of the second selection gate transistor and the source line contact.

The second aspect of the present invention is a nonvolatile semiconductor storage device comprising: a memory cell block obtained by connecting current paths of a plurality of nonvolatile memory cells in series, each of the plurality of nonvolatile memory cells comprising a floating gate electrode formed on a first insulating film on a device area isolated by an isolation insulating film which forms an isolation in a semiconductor substrate, and a control gate electrode formed on a second insulating film on the floating gate electrode to cover side surfaces and an upper surface of the floating gate electrode; a first selection gate transistor comprising a first gate electrode in which a first electrode layer made of the same electrode material as the floating gate electrode and a second electrode layer made of the same electrode material as the control gate electrode are formed in direct contact with each other through a first hole formed in a portion of a third insulating film made of the same insulating material as the second insulating film, a current path of the first selection gate transistor comprising one end connected to one end of current paths of series-connected nonvolatile memory cells in the memory cell block, and the other end connected to a data transfer line via a data transfer line contact; and a second selection gate transistor comprising a second gate electrode in which a third electrode layer made of the same electrode material as the floating gate electrode and a fourth electrode layer made of the same electrode material as the control gate electrode are formed in direct contact with each other through a second hole formed in a portion of a fourth insulating film made of the same insulating material as the second insulating film, a current path of the second selection gate transistor comprising one end connected to the other end of the current paths of the series-connected nonvolatile memory cells in the memory cell block, and the other end connected to a source line via a source line contact, wherein a bottom surface of the third insulating film formed in contact with the first hole on the isolation is higher than a bottom surface of the second insulating film formed on the isolation, or a bottom surface of the fourth insulating film formed in contact with the second hole on the isolation is higher than the bottom surface of the second insulating film formed on the isolation.

The third aspect of the present invention is a nonvolatile semiconductor storage device comprising a plurality of juxtaposed NAND strings, each of the plurality of NAND strings comprising: a memory cell block obtained by connecting current paths of a plurality of nonvolatile memory cells in series, each of the plurality of nonvolatile memory cells comprising a floating gate electrode formed on a first insulating film on a device area isolated by an isolation insulating film which forms an isolation in a semiconductor substrate, and a control gate electrode formed on a second insulating film on the floating gate electrode to cover side surfaces and an upper surface of the floating gate electrode; a first selection gate transistor comprising a first gate electrode in which a first electrode layer made of the same electrode material as the floating gate electrode and a second electrode layer made of the same electrode material as the control gate electrode are formed in direct contact with each other through a first hole formed in a portion of a third insulating film made of the same insulating material as the second insulating film, a current path of the first selection gate transistor comprising one end connected to one end of current paths of series-connected nonvolatile memory cells in the memory cell block, and the other end connected to a data transfer line via a data transfer line contact; and a second selection gate transistor comprising a second gate electrode in which a third electrode layer made of the same electrode material as the floating gate electrode and a fourth electrode layer made of the same electrode material as the control gate electrode are formed in direct contact with each other through a second hole formed in a portion of a fourth insulating film made of the same insulating material as the second insulating film, a current path of the second selection gate transistor comprising one end connected to the other end of the current paths of the series-connected nonvolatile memory cells in the memory cell block, and the other end connected to a source line via a source line contact, wherein an upper surface of the isolation insulating film between the data transfer line contacts included in adjacent NAND strings is higher than an upper surface of the isolation insulating film in a region which is sandwiched between the same electrode materials as the control gate electrode and connects the control gate electrodes included in the adjacent NAND strings, or an upper surface of the isolation insulating film between the source line contacts included in adjacent NAND strings is higher than an upper surface of the isolation insulating film in a region which is sandwiched between the same electrode materials as the control gate electrode and connects the control gate electrodes included in the adjacent NAND strings.

The fourth aspect of the present invention is a nonvolatile semiconductor storage device comprising a plurality of juxtaposed NAND strings, each of the plurality of NAND strings comprising: a memory cell block obtained by connecting current paths of a plurality of nonvolatile memory cells in series, each of the plurality of nonvolatile memory cells comprising a floating gate electrode formed on a first insulating film on a device area isolated by an isolation insulating film which forms an isolation in a semiconductor substrate, and a control gate electrode formed on a second insulating film on the floating gate electrode to cover side surfaces and an upper surface of the floating gate electrode; a first selection gate transistor comprising a first gate electrode in which a third insulating film made of the same insulating material as the second insulating film covers at least a portion of an upper surface of a first electrode layer made of the same electrode material as the floating gate electrode, and a second electrode layer made of the same electrode material as the control gate electrode is formed in direct contact with the first electrode layer to cover an upper surface of the third insulating film, a current path of the first selection gate transistor comprising one end connected to one end of current paths of series-connected nonvolatile memory cells in the memory cell block, and the other end connected to a data transfer line via a data transfer line contact; and a second selection gate transistor comprising a second gate electrode in which a fourth insulating film made of the same insulating material as the second insulating film covers at least a portion of an upper surface of a third electrode layer made of the same electrode material as the floating gate electrode, and a fourth electrode layer made of the same electrode material as the control gate electrode is formed in direct contact with the third electrode layer to cover an upper surface of the fourth insulating film, a current path of the second selection gate transistor comprising one end connected to the other end of the current paths of the series-connected nonvolatile memory cells in the memory cell block, and the other end connected to a source line via a source line contact, wherein an upper surface of the isolation insulating film between the data transfer line contacts included in adjacent NAND strings is higher than a major surface of the semiconductor substrate in a device area between the other end of the current path of the first selection gate transistor and the data transfer line contact, or an upper surface of the isolation insulating film between the source line contacts included in adjacent NAND strings is higher than a major surface of the semiconductor substrate in a device area between the other end of the current path of the second selection gate transistor and the source line contact.

BRIEF DESCRIPTION OF THE SEVERAL VIEWS OF THE DRAWING

FIG. 1 is an equivalent circuit diagram of a NAND string forming a nonvolatile semiconductor storage device according to the first embodiment of the present invention;

FIG. 29 is a sectional view taken along a line B-B' in FIG. 26 and showing nonvolatile memory cells;

FIG. 30 is a sectional view taken along a line C-C' in FIG. 26 and showing a sidewall insulating film of a first selection gate transistor on the side of a data transfer line contact;

FIG. 49 is a sectional view taken along a line H-H' in FIG. 46 and showing the well contact portion;

FIG. 50 is a sectional view taken along a line I-I' in FIG. 46 and showing an isolation;

FIG. 55 is a sectional view taken along a line H-H' in FIG. 52 and showing the well contact portion; and FIG. 56 is a sectional view taken along a line I-I' in FIG. 52 and showing an isolation.

DETAILED DESCRIPTION OF THE INVENTION

Figure 2:
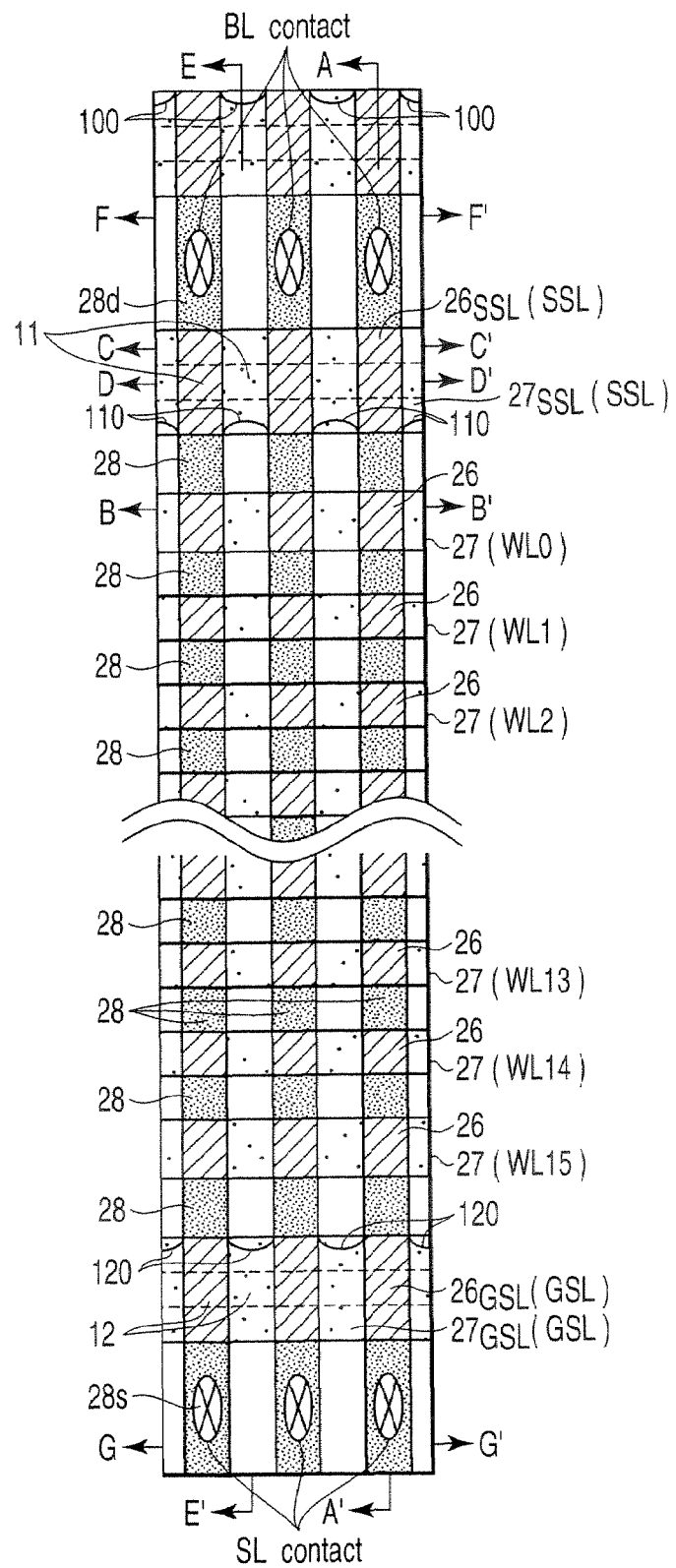
FIG. 2 is a plan view showing the layout of the nonvolatile semiconductor storage device according to the first embodiment of the present invention.

Embodiments of the present invention will be described in detail below with reference to the accompanying drawing. Note that in the following explanation, the same reference numerals denote elements having the same functions and arrangements. Note also that the figures are schematic views, so the relationships between the thickness and planar dimensions, the ratios of the thicknesses of individual layers, and the like are sometimes different from the actual ones.

First Embodiment

FIGS. 1 and 2 illustrate the structure of a nonvolatile semiconductor storage device according to the first embodiment of the present invention. In these figures, the suffixes of symbols represent the differences between the positions of elements used, and elements having the same main symbol indicate parts formed in the same step by using the same material.

FIG. 1 is an equivalent circuit diagram of a NAND string 45. FIG. 2 is a plan view of the layout of a plurality of juxtaposed NAND strings. FIG. 2 shows a structure obtained by juxtaposing three NAND strings shown in FIG. 1. FIG. 2 shows only a structure below control gate electrodes 27 in order to clearly indicate the structures of a memory cell and selection gate transistor.

As shown in FIG. 1, the current paths of nonvolatile memory cells M0 to M15 comprising MOS transistors each having a floating gate electrode (charge storage electrode) 26 connect in series to form a NAND memory cell block. One end of the series-connected current paths of this NAND memory cell block connects to one end of the current path of a first selection gate transistor S1, and connects to a data transfer line (bit line) BL via that end. The other end connects to one end of the current path of a second selection gate transistor S2, and connects to a common source line (source line) SL via that end.

The transistors are formed on a common p-well region (p-type silicon region) 23. The control gate electrodes 27 of the nonvolatile memory cells M0 to M15 connect to data select lines perpendicular to data transfer lines WL0 to WL15.

To select one memory cell block from a plurality of memory cell blocks arranged along the data transfer line BL and connect the selected memory cell block to the data transfer line, a second electrode layer $27_{SSL}$ forming the control electrode of the first selection gate transistor S1 connects to a block select line SSL (first control line). In addition, a fourth electrode layer $27_{GSL}$ forming the control electrode of the second selection gate transistor S2 connects to a block select line GSL (second control line). The NAND memory cell block, first selection gate transistor S1, and second selection gate transistor S2 form a so-called NAND string 45 (region indicated by the broken lines).

This embodiment forms the entire NAND string 45 by the same process, i.e., forms the first and second selection gate transistors S1 and S2 and memory cell elements M0 to M15 by the same process. Accordingly, a first electrode layer $26_{SSL}$ and third electrode layer $26_{GSL}$ as electrode layers made of the same electrode material as the floating gate electrodes 26 of the memory cell elements M0 to M15 are once formed in the selection gate transistors S1 and S2.

Similarly, the first control line SSL and second control line GSL as the control lines of the first and second selection gate transistors S1 and S2 are formed as interconnections made of the same electrode material as in the same layer as the data select lines WL0 to WL15 as the control lines of the memory cell elements.

Also, the NAND string 45 need only have at least one block select line such as the first control line SSL or the second control line GSL. It is desirable to form these block select lines parallel in the same direction as the data select lines WL0 to WL15 in order to increase the density.

This embodiment shows an example in which $16=2^4$ memory cells connect to the NAND string 45. However, it is only necessary to connect a plurality of memory cells to the data transfer line BL and data select lines WL0 to WL15, and $2^n$ (n is a positive integer) is desirable for address decoding.

FIGS. 3, 4, 5, 6, 7, 8, and 9 are sectional views taken along lines A-A', E-E', B-B', C-C', D-D', F-F', and G-G', respectively, in FIG. 2.

Figure 3:
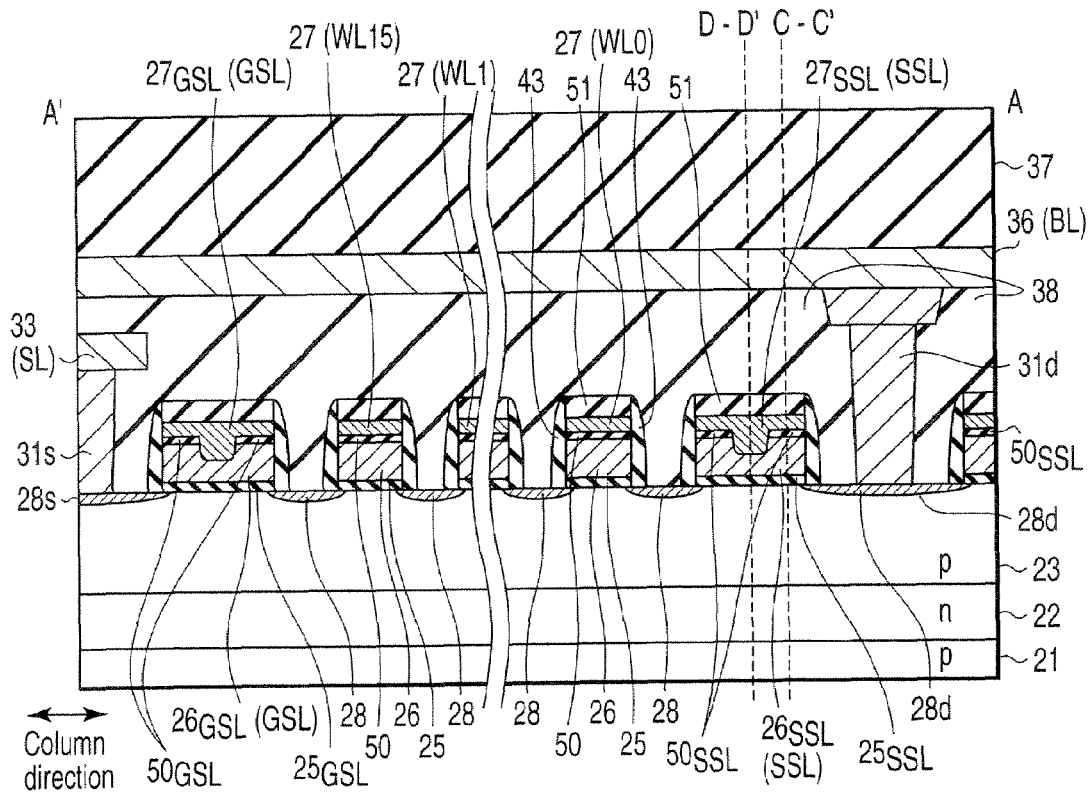
FIG. 3 is a sectional view taken along a line A-A' in FIG. 2 and showing a region including a NAND memory cell block and selection gate transistors.
Figure 4:
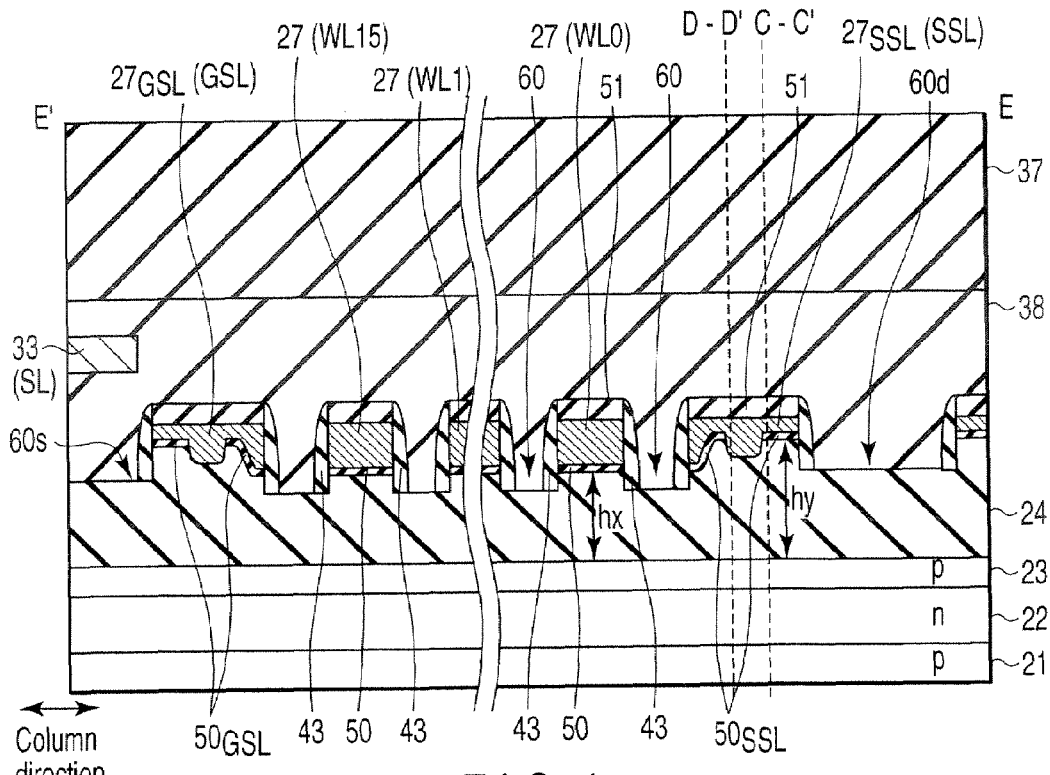
FIG. 4 is a sectional view taken along a line E-E' in FIG. 2 and showing an isolation.
Figure 5:
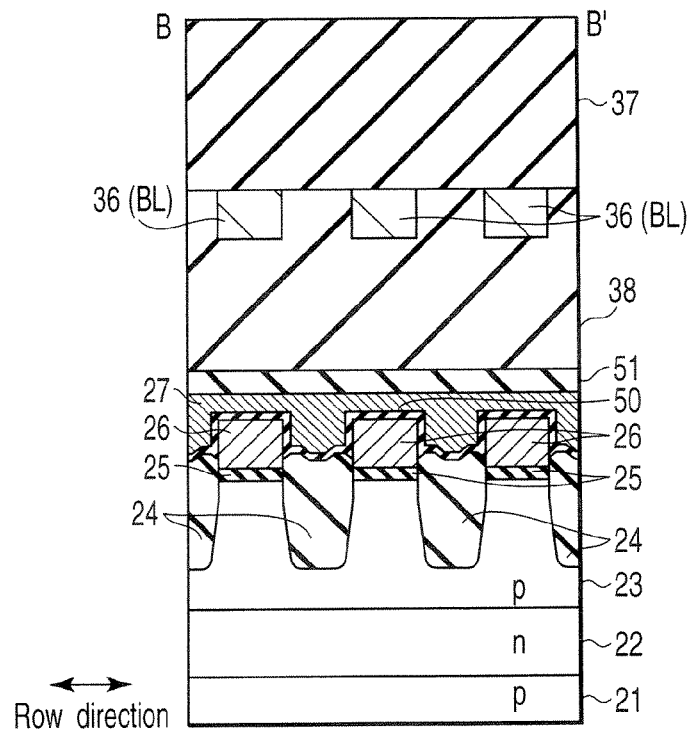
FIG. 5 is a sectional view taken along a line B-B' in FIG. 2 and showing nonvolatile memory cells.
Figure 6:
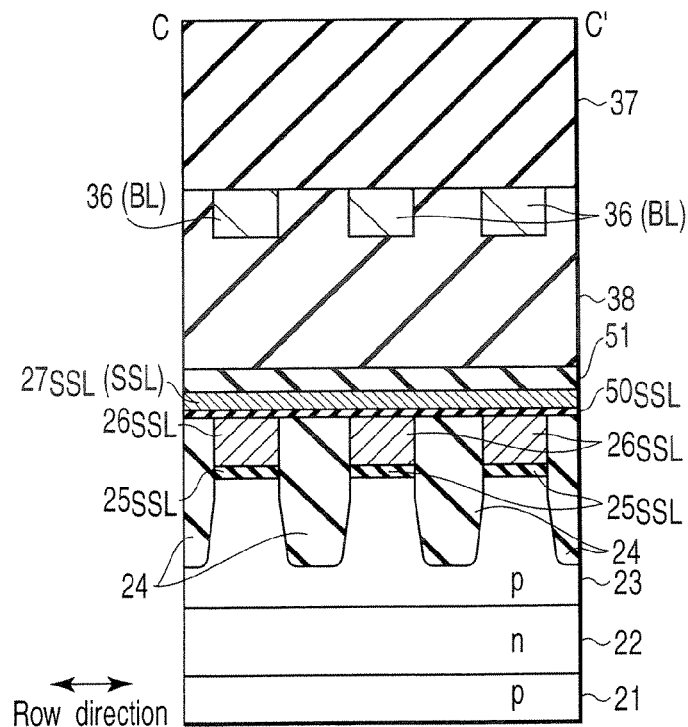
FIG. 6 is a sectional view taken along a line C-C' in FIG. 2 and showing first selection gate transistors.
Figure 7:
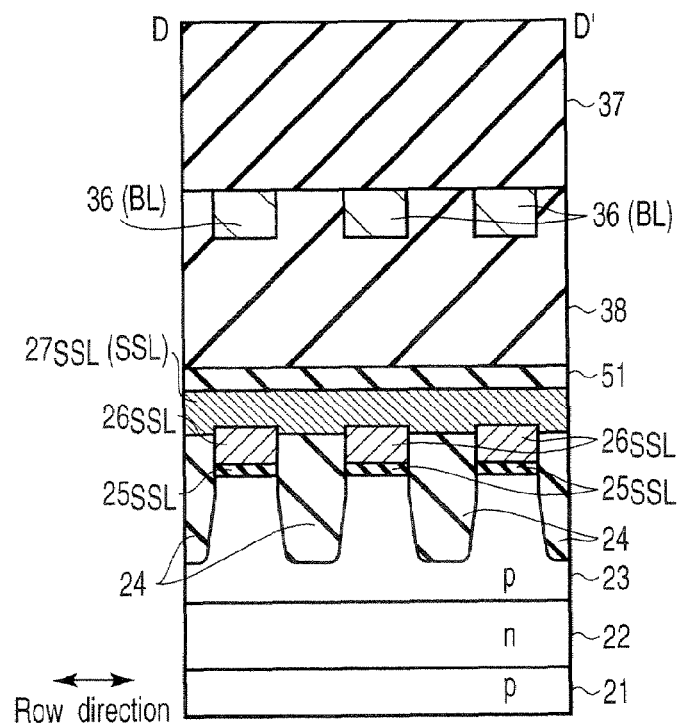
FIG. 7 is a sectional view taken along a line D-D' in FIG. 2 and showing a slit-like hole in an insulating film of the first selection gate transistor.
Figure 8:
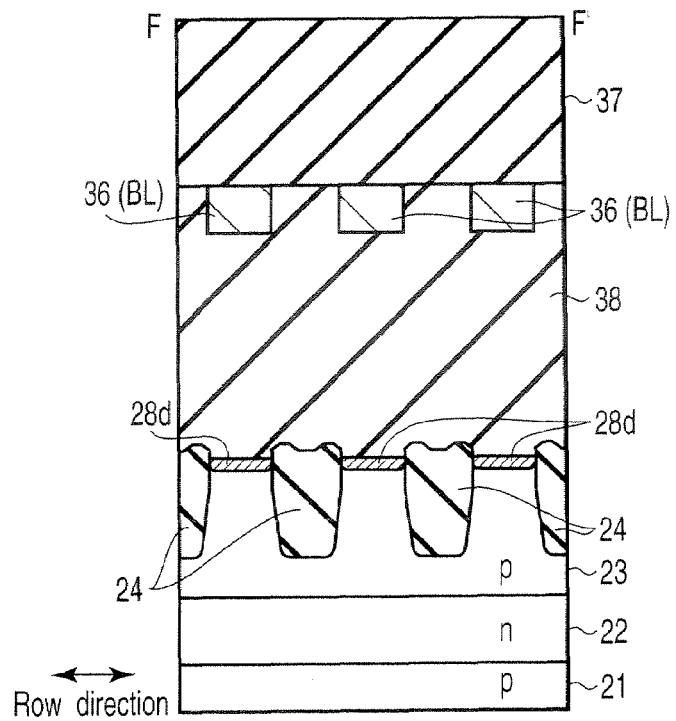
FIG. 8 is a sectional view taken along a line F-F' in FIG. 2 and showing drain electrodes.
Figure 9:
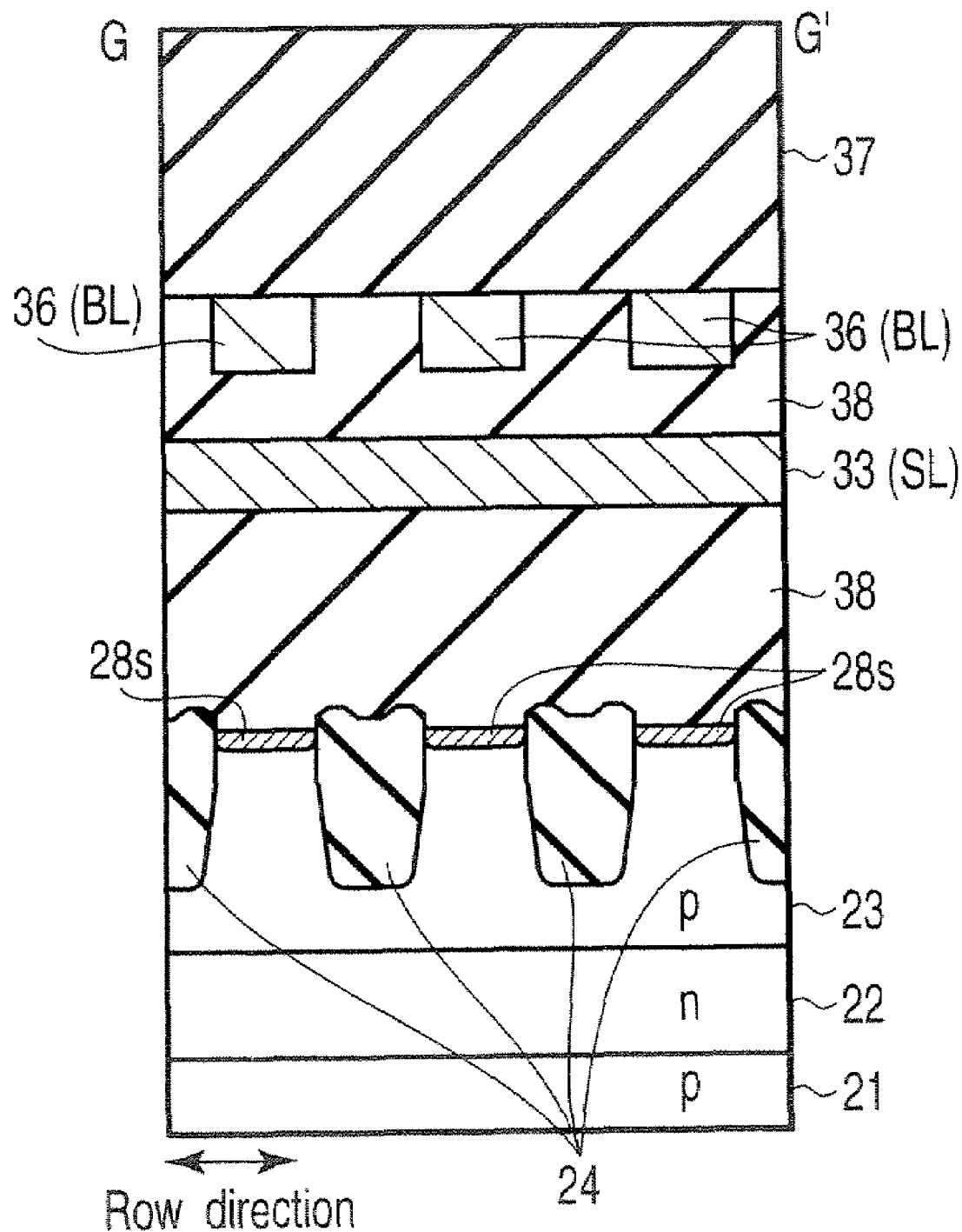
FIG. 9 is a sectional view taken along a line G-G' in FIG. 2 and showing source electrodes.

FIG. 3 is an A-A' sectional view of a region including the NAND cell block and selection gate transistors. FIG. 4 is an E-E' sectional view of isolations. FIG. 5 is a B-B' sectional view of memory cell portions. FIGS. 6 and 7 are a C-C' sectional view and D-D' sectional view, respectively, of the first selection gate transistor S1. FIG. 7 shows the section of a slit-like hole (to be described later) formed in a block insulating film. FIGS. 8 and 9 are an F-F' sectional view and G-G' sectional view of drain electrodes and source electrodes, respectively.

Referring to FIGS. 2, 3, 5, and 6, first insulating films 25, $25_{SSL}$, and $25_{GSL}$ as tunnel gate insulating films made of, e.g., a 3- to 15-nm-thick silicon oxide film or oxynitride film are formed on the p-well region 23 having a boron impurity concentration of, e.g., $10^{14}$ to $10^{19}$ cm$^{-3}$.

On the first insulating films 25, $25_{SSL}$, and $25_{GSL}$, the floating gate electrodes 26 made of, e.g., polysilicon to which phosphorus or arsenic is doped at a concentration of $10^{18}$ to $10^{21}$ cm$^{-3}$ and the first electrode layer $26_{SSL}$ and third electrode layer $26_{GSL}$ as electrode layers made of the same electrode material as the floating gate electrodes 26 are formed to have a thickness of 10 to 500 nm.

These elements are formed in self-alignment with the p-well region 23 on a region where an isolation insulating film 24 made of, e.g., a silicon oxide film is not formed. That is, the first insulating film 25 and floating gate electrode 26 are deposited on the entire surface of the p-well region 23 as a semiconductor region and patterned, and etching is performed to the p-well region 23. In addition, the p-well region 23 is etched to a depth of, e.g., 0.05 to 0.5 μm. The isolation insulating film 24 is buried in the etched portion. Since the first insulating film 25 and floating gate electrode 26 can be formed on the entire flat surface with no steps, film formation can be performed with uniform characteristics having improved uniformity.

Figure 10:
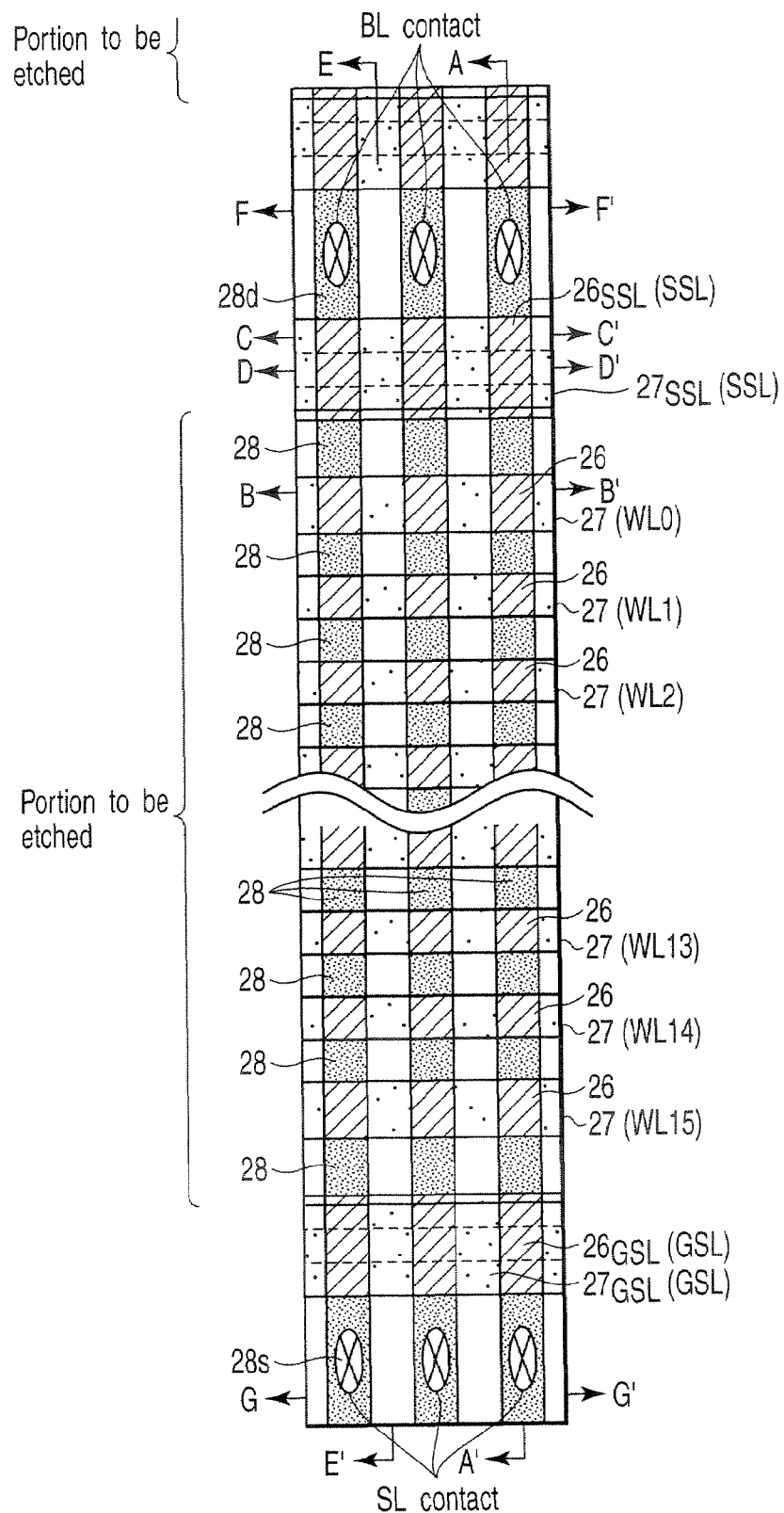
FIG. 10 is a view showing the etching range of an isolation insulating film in the plan view of the layout of the nonvolatile semiconductor storage device according to the first embodiment of the present invention.

When etching the isolation insulating film 24 after that in order to expose the side surfaces of the floating gate electrode 26, this embodiment does not etch the entire surface of the memory cell string shown in FIG. 2 but etches a range shown in FIG. 10 by using, e.g., a resist and lithography process. That is, this embodiment etches the memory cell portions so as not to etch at least a region including a data transfer line contact $31_d$ and a region including a source line contact $31_s$.

On the obtained structure, block insulating films 50 (second insulating film), $50_{SSL}$ (third insulating film), and $50_{GSL}$ (fourth insulating film) made of, e.g., a silicon oxide film, oxynitride film, or silicon oxide film/silicon nitride film/silicon oxide film having a thickness of 5 to 30 nm are formed.

The control gate electrodes 27 made of polysilicon to which an impurity such as phosphorus, arsenic, or boron is doped at a concentration of $10^{17}$ to $10^{21}$ cm$^{-3}$, a stacked structure of tungsten silicide (WSi) and polysilicon, or a stacked structure of NiSi, MoSi, TiSi, CoSi, and polysilicon and the second electrode layer 27$_{SSL}$ and fourth electrode layer 27$_{GSL}$ made of the same electrode material as the control gate electrodes 27 are formed to have a thickness of 10 to 500 nm via the second, third, and fourth insulating films 50, 50$_{SSL}$, and 50$_{GSL}$. The control gate electrodes 27 are formed to the block boundaries in the horizontal direction of the drawing surface in FIG. 2 so as to be connected between adjacent memory cell blocks shown in FIG. 2, thereby forming the data select lines WL0 to WL15. FIG. 5 also shows the way the control gate electrode 27 connects to the control gate electrode of an adjacent block via the upper portion of the isolation insulating film 24.

Likewise, as shown in FIGS. 6 and 7, the second electrode layer 27$_{SSL}$ and fourth electrode layer 27$_{GSL}$ connect to the second electrode layer and fourth electrode layer of a memory cell block which is adjacent to the isolation insulating film 24 between them, via the upper portion of the isolation insulating film 24, thereby forming the first control line SSL and second control line GSL.

Note that an n-type silicon region 22 isolates the p-well region 23, so a voltage can be applied independently of a p-type semiconductor substrate 21. This is desirable to suppress the power consumption by reducing the boosting circuit load during data erase.

In the gate shape of this embodiment, the isolation insulating film 24 covers the sidewalls of the p-well region 23, so etching before the formation of the floating gate electrodes 26 does not expose the p-well region 23. This makes it possible to prevent the floating gate electrodes 26 from being formed below the p-well region 23.

Accordingly, no gate field concentration easily occurs or no parasitic transistor having a low threshold value easily forms in the boundary between the p-well region 23 and isolation insulating film 24. Since this further prevents easy occurrence of a so-called sidewalk phenomenon in which a write threshold value decreases due to field concentration, highly reliable transistors can be formed.

As shown in FIG. 3, sidewall insulating films 43 made of, e.g., a 5- to 200-nm-thick silicon nitride film or silicon oxide film are formed on the two sides of each of these gate electrodes. N-type diffusion layers 28 each serving as the source electrode or drain electrode of each memory cell are formed in the p-well region 23 with the sidewall insulating films 43 interposed between them.

The n-type diffusion layers 28, floating gate electrode 26, and control gate electrode 27 form a floating gate type EEPROM cell which uses the electric charge amount stored in the floating gate electrode 26 as an information amount. The gate length is 0.01 to 0.5 μm (both inclusive).

The source-drain n-type diffusion layers 28 are formed to a depth of 10 to 500 nm to make the surface concentration of, e.g., phosphorus, arsenic, or antimony be $10^{17}$ to $10^{21}$ cm$^{-3}$. Furthermore, adjacent memory cells share the n-type diffusion layers 28 to achieve the NAND connection in which the current paths of memory cells connect in series.

Referring to FIG. 3, the first electrode layer 26$_{SSL}$ and third electrode layer 26$_{GSL}$ are gate electrodes connected to block select lines corresponding to the first control line SSL and second control line GSL, respectively, and made of the same layer as the floating gate electrodes 26 of the floating gate type EEPROM. The gate length of the first electrode layer 26$_{SSL}$ and third electrode layer 26$_{GSL}$ is, e.g., 0.02 to 1 μm (both inclusive) which is longer than the gate length of the memory cell gate electrode. This makes it possible to ensure a high on/off ratio of block selection to non-selection, thereby preventing write errors and read errors.

An n-type diffusion layer 28$_d$ as a drain electrode connected to one end of the current path (channel) of the first selection gate transistor S1 connects to a data transfer line 36 (BL) via the data transfer line contact 31$_d$. Data transfer lines 36 are formed to the boundaries between the NAND strings in the vertical direction of the drawing surface in FIG. 2 so as to connect to each other between adjacent NAND strings. The data transfer line 36 (BL) is made of a material such as tungsten, tungsten silicide, titanium, titanium nitride, or aluminum.

An n-type diffusion layer 28$_s$ as a source electrode connected to one end of the current path (channel) of the second selection gate transistor S2 connects to a source line 33 (SL) via the source line contact 31$_s$. Source lines 33 (SL) are formed to the NAND string boundaries in the horizontal direction of the drawing surface in FIG. 2 so as to connect to each other between adjacent NAND strings. It is of course also possible to form a source line by forming the n-type diffusion layer (source electrode) 28$_s$ to the NAND string boundaries in the horizontal direction of the drawing surface.

The data transfer line contacts 31$_d$ and source line contact 31$_s$ may also be filled with, e.g., polysilicon which is doped to be an n-type or p-type, tungsten, tungsten silicide, Al, TiN, or Ti, thereby forming conductor regions. In addition, portions between the transistors and the source line 33 and data transfer line 36 are filled with an interlayer dielectric film 38 made of, e.g., SiO$_2$ or SiN. Furthermore, an insulating film protective layer 37 made of, e.g., SiO$_2$, SiN, or polyimide and an upper interconnection (not shown) made of, e.g., W, Al, or Cu are formed on the data transfer line 36.

In the first and second selection gate transistors connected by the selection gate control lines SSL (first control line) and GSL (second control line), as indicated by the broken lines in FIG. 2, the third and fourth insulating films 50$_{SSL}$ and 50$_{GSL}$ formed are etched to form slit-like holes over adjacent NAND strings with the isolations interposed between them. The slit-like hole formed in the third insulating film 50$_{SSL}$ is a first hole 11. The slit-like hole formed in the fourth insulating film 50$_{GSL}$ is a second hole 12.

In a device area, therefore, the first electrode layer 26$_{SSL}$ and second electrode layer 27$_{SSL}$ connect to each other through the first hole 11 to form the first gate electrode as the gate electrode of the selection gate transistor S1, and the third electrode layer 26$_{GSL}$ and fourth electrode layer 27$_{GSL}$ connect to each other through the second hole 12 to form the second gate electrode as the gate electrode of the selection gate transistor S2. This makes it possible to improve the cutoff of the selection gate transistors S1 and S2, and prevent a shift of the threshold value caused by electric charge stored in the first electrode layer 26$_{GSL}$ and third electrode layer 26$_{SSL}$.

Also, when the third insulating film 50$_{SSL}$ and fourth insulating film 50$_{GSL}$ are etched to form slit-like holes, the first electrode layer 26$_{SSL}$ and third electrode layer 26$_{GSL}$ made of the same electrode material as the floating gate electrodes 26 below the holes 11 and 12 are partially etched in the device area. As shown in FIG. 3, therefore, when the second electrode layer 27$_{SSL}$ and fourth electrode layer 27$_{GSL}$ made of the same electrode material as the control gate electrodes 27 are respectively formed on the first electrode layer 26$_{SSL}$ and third electrode layer 26$_{GSL}$, the second electrode layer 27$_{SSL}$ and fourth electrode layer 27$_{GSL}$ protrude downward through the first hole 11 and second hole 12 and come in direct contact with the first electrode layer $26_{SSL}$ and third electrode layer $26_{GSL}$, respectively. The second electrode layer $27_{SSL}$ and fourth electrode layer $27_{GSL}$ thus protrude into the first electrode layer $26_{SSL}$ and third electrode layer $26_{GSL}$, respectively, thereby increasing the contact area between the first electrode layer $26_{SSL}$ and second electrode layer $27_{SSL}$ and between the third electrode layer $26_{GSL}$ and fourth electrode layer $27_{GSL}$, and decreasing the resistance in these contact portions.

Furthermore, the third insulating film $50_{SSL}$ and fourth insulating film $50_{GSL}$ are present in the isolation sandwiched between the device areas as well, and in direct contact with the upper surface of the isolation insulating film 24 as shown in FIG. 6. In addition, as indicated by the broken lines in FIG. 2, the first hole 11 and second hole 12 are open in the isolation as well. Accordingly, as shown in FIG. 7, the second electrode layer $27_{SSL}$ and fourth electrode layer $27_{GSL}$ extending to the isolation come in direct contact with the upper surface of the isolation insulating film 24 through the first hole 11 and second hole 12.

Even in this case, the isolation insulating film 24 below the holes 11 and 12 is partially etched. In the isolation, therefore, as shown in FIG. 4, the second electrode layer $27_{SSL}$ and fourth electrode layer $27_{GSL}$ protrude downward through the first hole 11 and second hole 12 and come in direct contact with the isolation insulating film 24.

As described above, when etching the isolation insulating film 24, this embodiment etches the region including the memory cell portions so as not to etch the region including the data transfer line contact $31_d$ and the region including the source line contact $31_s$ as shown in FIG. 10. Reference numerals 100, 110, and 120 in FIG. 2 denote the boundaries between the etched and unetched regions on the isolation insulating film 24.

In this embodiment, as indicated by the boundaries 100, 110, and 120, etching of the region including the memory cell portions does not reach the regions where the third and fourth insulating films $50_{SSL}$ and $50_{GSL}$ are etched to form slit-like holes. That is, the regions where the third and fourth insulating films $50_{SSL}$ and $50_{GSL}$ are etched to form slit-like holes are not etched when the isolation insulating film 24 is etched.

As shown in FIG. 4, therefore, on the isolation insulating film 24 for forming isolations, a height $h_y$ of at least portions in contact with the slit-like holes of the third and fourth insulating films $50_{SSL}$ and $50_{GSL}$ connected to the first and second selection gate transistor portions is larger than a height $h_x$ of the second insulating film 50 connected to the memory cell portion.

For comparison, FIGS. 11, 12, 13, 14, 15, 16, and 17 show sectional views respectively corresponding to FIGS. 3, 4, 5, 6, 7, 8, and 9, when the isolation insulating film 24 in the region including the selection gate transistors shown in FIG. 2 is etched back (when non-masking isolation etch back is performed) unlike in this embodiment. Similar to FIGS. 3 to 9, FIGS. 11, 12, 13, 14, 15, 16, and 17 are sectional views taken along the lines A-A', E-E', B-B', C - C', D-D, F-F', and G-G', respectively, in FIG. 2.

Figure 15:
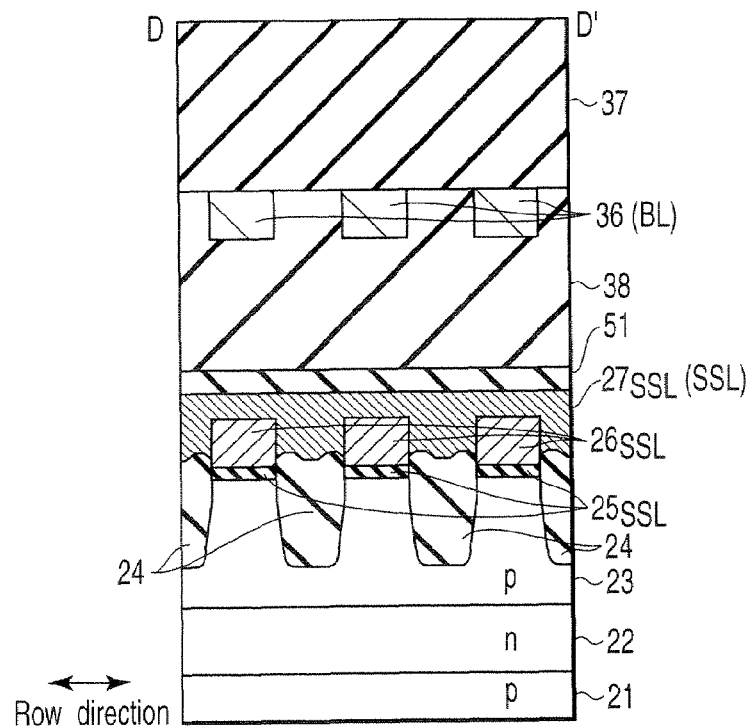
FIG. 15 is a sectional view taken along the line D-D' in FIG. 2 and showing a slit-like hole in an insulating film of the first selection gate transistor, when non-masking isolation etch back is performed.

The bottom surface of the second electrode layer $27_{SSL}$ formed in contact with the upper surface of the isolation insulating film 24 in the slit-like hole described above is higher in this embodiment shown in FIG. 7 than that in the case shown in FIG. 15 in which non-masking isolation etch back is performed.

This makes it possible to prevent the proximity of the second electrode layer $27_{SSL}$ to the p-well region 23 of the memory cell as shown in FIG. 15, thereby separating the second electrode layer $27_{SSL}$ from the p-well region 23 as shown in FIG. 7. Accordingly, the influence of the memory cell on the p-well region 23 when the gate voltage changes can be smaller than that in the case shown in FIG. 15 in which the first electrode layer $26_{SSL}$ protrudes upward from the isolation insulating film 24.

That is, in this embodiment in which the voltage of the first electrode layer $26_{SSL}$ changes, the effect by which the line of electric force from the gate end reaches the upper region of the p-well region 23 and generates electric charge in the p-well region 23 can be made smaller than that when non-masking isolation etch back is performed. Therefore, it is possible to suppress the problem of the decrease in selection gate transistor threshold value caused by the electric charge generated in the p-well region 23 by the above effect.

For a NAND string selected so as not to write data in it during programming, the first selection gate transistor S1 is turned on by raising the gate electrode to a high potential to store electric charge in the NAND string, and then turned off by slightly lowing the potential of the gate electrode, thereby floating the NAND string. In this state, if the threshold value of the first selection gate transistor S1 is too low, the electric charge stored in the NAND string 45 escapes to the data transfer line 36 (BL) to cause a write error. However, this embodiment of the present invention can implement a highly reliable nonvolatile semiconductor device capable of suppressing write errors in cells by avoiding the decrease in threshold value.

Also, non-masking isolation etch back has the problem that the variation in bottom surface height of the second electrode layer $27_{SSL}$ and fourth electrode layer $27_{GSL}$ on the isolation insulating film 24 increases because the variation in etching depth of non-masking isolation etch back is added in addition to the variation in etching depth when the third and fourth insulating films $50_{SSL}$ and $50_{GSL}$ are etched to form slit-like holes and the variation in floating gate film thickness. This variation is reflected on the variation in selection gate transistor threshold value to cause the extremely low threshold value.

As described previously, however, this embodiment selectively etches the isolation insulating film 24 in the region including the memory cells, so the slit and its periphery of the selection gate transistor are not etched as shown in FIG. 10. Accordingly, the variation in etching depth of non-masking isolation etch back is not added to the variation in bottom surface height of the second electrode layer $27_{SSL}$ and fourth electrode layer $27_{GSL}$ on the isolation insulating film 24. This makes it possible to make the variation in selection gate transistor threshold value smaller than that when non-masking isolation etch back is performed. Therefore, it is possible to avoid the large decrease in selection gate transistor threshold value, which can occur if the variation is large. This also achieves the effect of suppressing write errors in cells.

Furthermore, micropatterning increases the capacitive coupling between adjacent cells, and this increases the influence of the depletion layer in the p-well region 23. Accordingly, it is necessary to further increase the opposing area between the floating gate electrode 26 and control gate electrode 27 sandwiching the second insulating film 50 between them.

If non-masking isolation etch back largely exposes the side surfaces of the floating gate electrode 26, the bottom surface of the second electrode layer $27_{SSL}$ in the isolation approaches the p-well region 23 as shown in FIG. 15. Consequently, the decrease and variation in selection gate transistor threshold value pose a big problem. However, this embodiment can alleviate this problem.

Generally, if a high threshold value is set to compensate for the variation in selection gate transistor threshold value, the data transfer line 36 (BL) cannot supply any sufficiently high voltage to the NAND string 45, so the threshold value setting margin is limited to a narrow margin. However, this embodiment can suppress the decrease in selection gate transistor threshold value, and hence can readily secure this margin. This obviates the need to increase the impurity concentration of the channel in order to increase the threshold value of the selection gate transistor. Accordingly, it is possible to prevent junction breakdown voltage deterioration between the source electrode and drain electrode and junction leakage deterioration which occurs when 0 V is applied to the gate, thereby preventing a leakage from the data transfer line.

Also, as micropatterning progresses, the length in the direction parallel to the substrate (direction of the section in FIG. 11) of the p-well region 23 for forming the data transfer line contact $31_d$ (BL contact) and source line contact $31_s$ (SL contact) becomes much larger than 3F, i.e., a triple of a minimum design width F of the cell.

Figure 12:
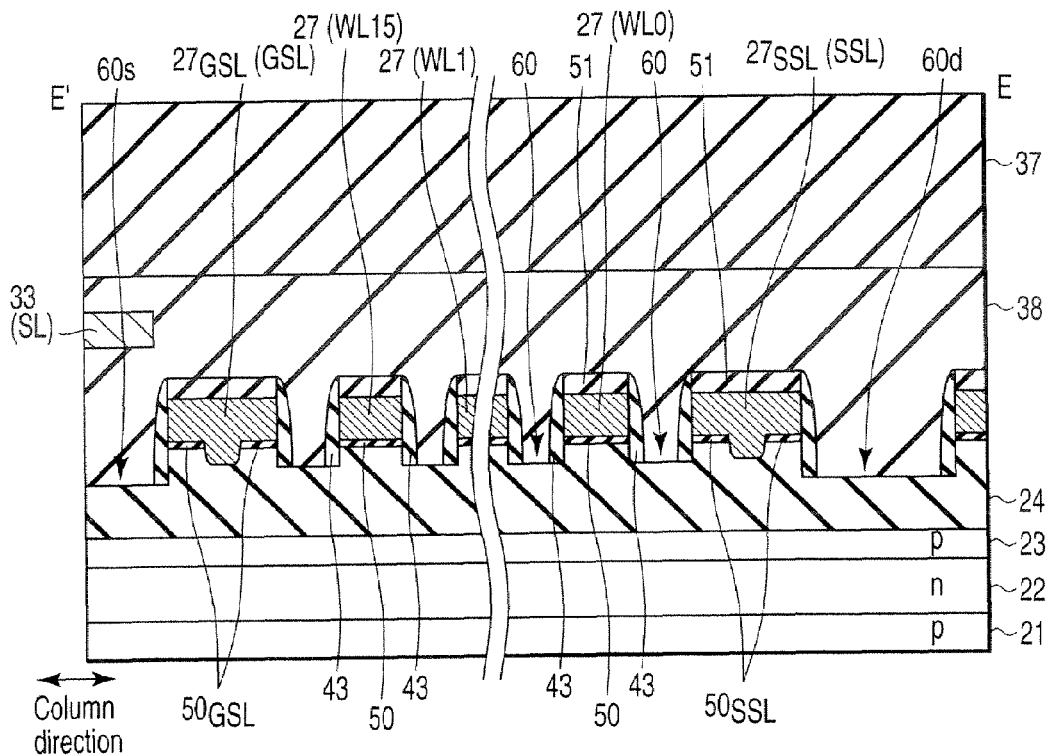
FIG. 12 is a sectional view taken along the line E-E' in FIG. 2 and showing an isolation, when non-masking isolation etch back is performed.
Figure 13:
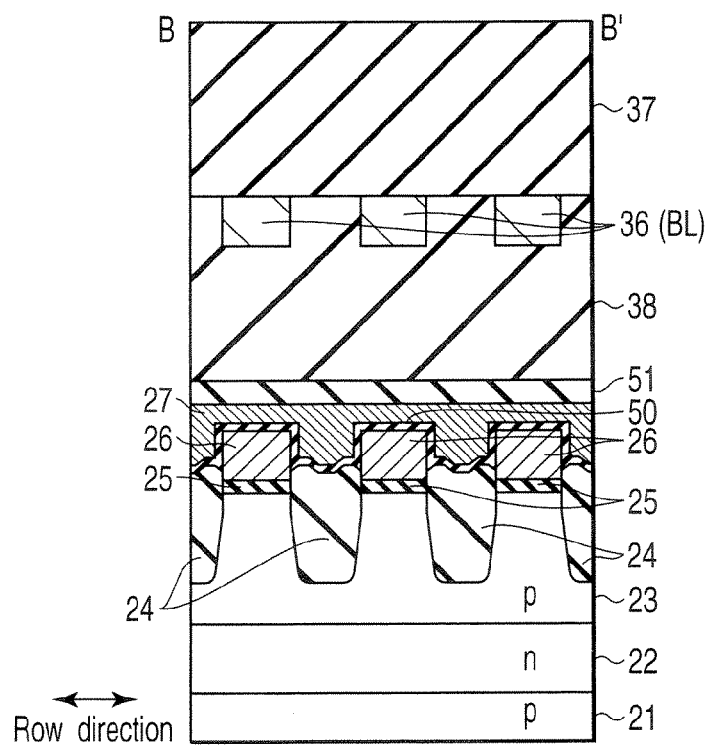
FIG. 13 is a sectional view taken along the line B-B' in FIG. 2 and showing nonvolatile memory cells, when non-masking isolation etch back is performed.
Figure 14:
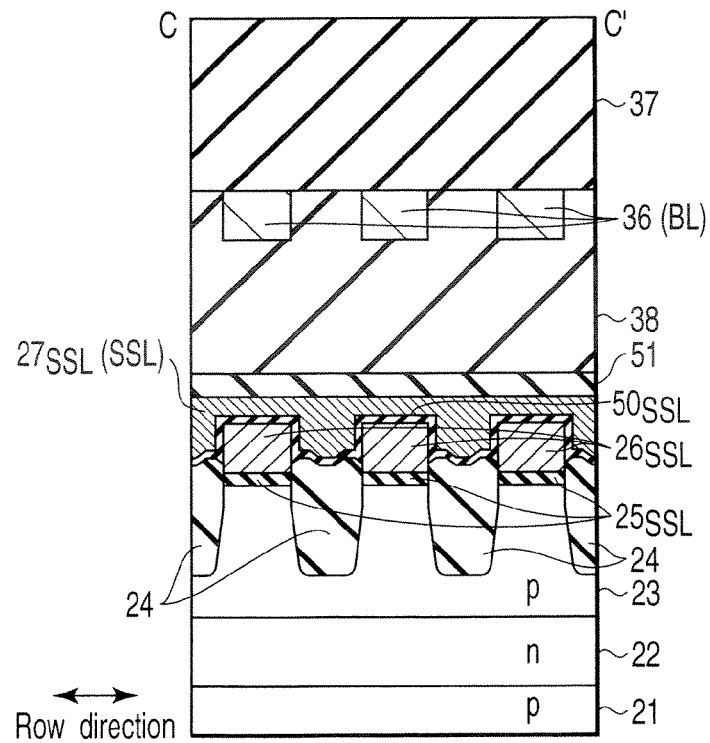
FIG. 14 is a sectional view taken along the line C-C' in FIG. 2 and showing first selection gate transistors, when non-masking isolation etch back is performed.

Accordingly, as shown in FIG. 12, when non-masking isolation etch back is performed on the isolation insulating film 24, the micro-loading effect of anisotropic etching for gate electrode processing etches an isolation surface $60_d$ on the side of the data transfer line contact $31_d$ and an isolation surface $60_s$ on the side of the source line contact $31_s$ deeper than an isolation surface 60 on the memory cell side. The micro-loading effect is a phenomenon in which the etching rate of dry etching changes in accordance with the density of a pattern to be processed.

Figure 16:
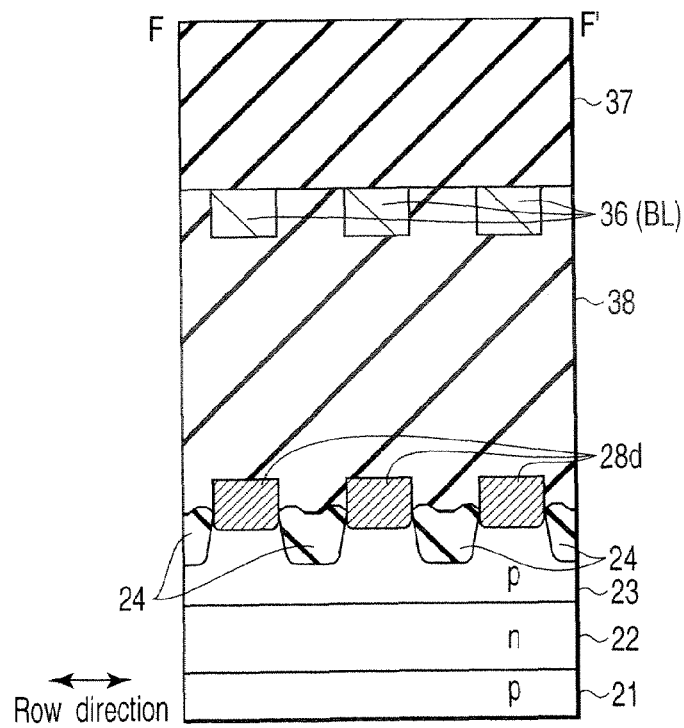
FIG. 16 is a sectional view taken along the line F-F' in FIG. 2 and showing drain electrodes, when non-masking isolation etch back is performed.
Figure 17:
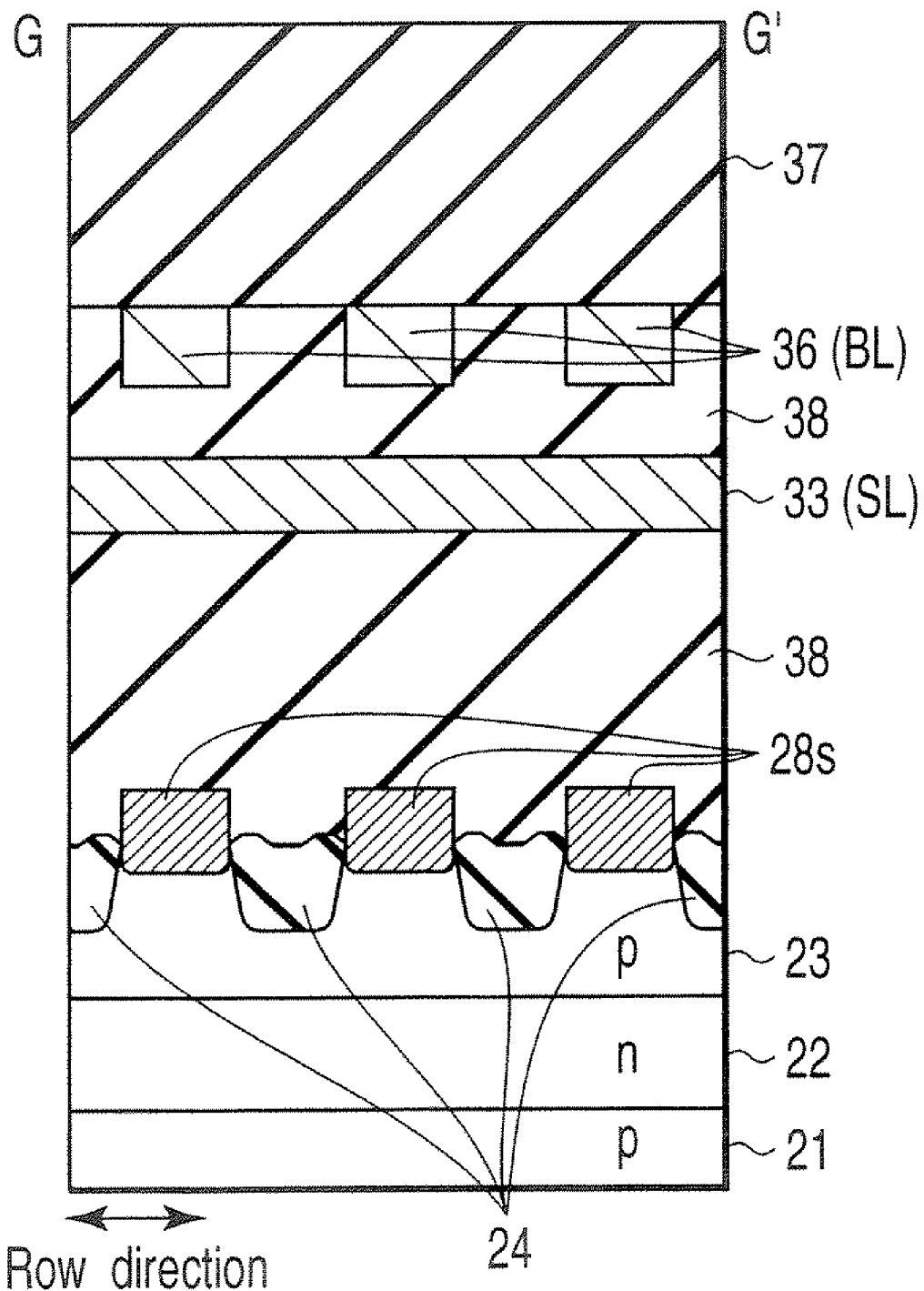
FIG. 17 is a sectional view taken along the line G-G' in FIG. 2 and showing source electrodes, when non-masking isolation etch back is performed.

Consequently, as shown in FIGS. 16 and 17, the upper surface of the isolation insulating film 24 becomes lower than that of the p-well region 23 in the device area.

By contrast, this embodiment does not etch back the entire surface of the isolation insulating film 24 as shown in FIG. 10. As shown in FIG. 4, therefore, the isolation surface $60_d$ on the side of the data transfer line contact $31_d$ and the isolation surface $60_s$ on the side of the source line contact $31_s$ can be higher than the isolation surface 60 on the memory cell side.

In addition, as shown in FIGS. 8 and 9, the upper surface of the isolation insulating film 24 in contact with the p-well region 23 for forming the junctions (drain electrode $28_d$ and source electrode $28_s$) for the data transfer line contact (BL contact) and source line contact (SL contact) can be kept higher than that of the p-well region 23 for junction formation in the device area.

That is, the upper surface of the isolation insulating film 24 in the isolation sandwiched between the BL contacts or SL contacts included in adjacent NAND strings shown in FIG. 2 is higher than that of the p-well region 23 in the device area. The height of the upper surface of the p-well region 23 in the device area is, e.g., the height of the major surface of the p-well region 23 as the semiconductor substrate in the device area between one end of the current path of the first selection gate transistor S1 and the data transfer line contact $31_d$, or the height of the major surface of the p-well region 23 as the semiconductor substrate in the device area between one end of the second selection gate transistor S2 and the source line contact $31_s$.

The existence of the isolation insulating film 24 as described above makes it possible to prevent n-type ions for forming the source electrode $28_s$ and drain electrode $28_d$ from being implanted from those side surfaces of the p-well region 23 of the memory cell, which are in contact with the isolation insulating film 24. This prevents the formation of a deep junction.

Figure 11:
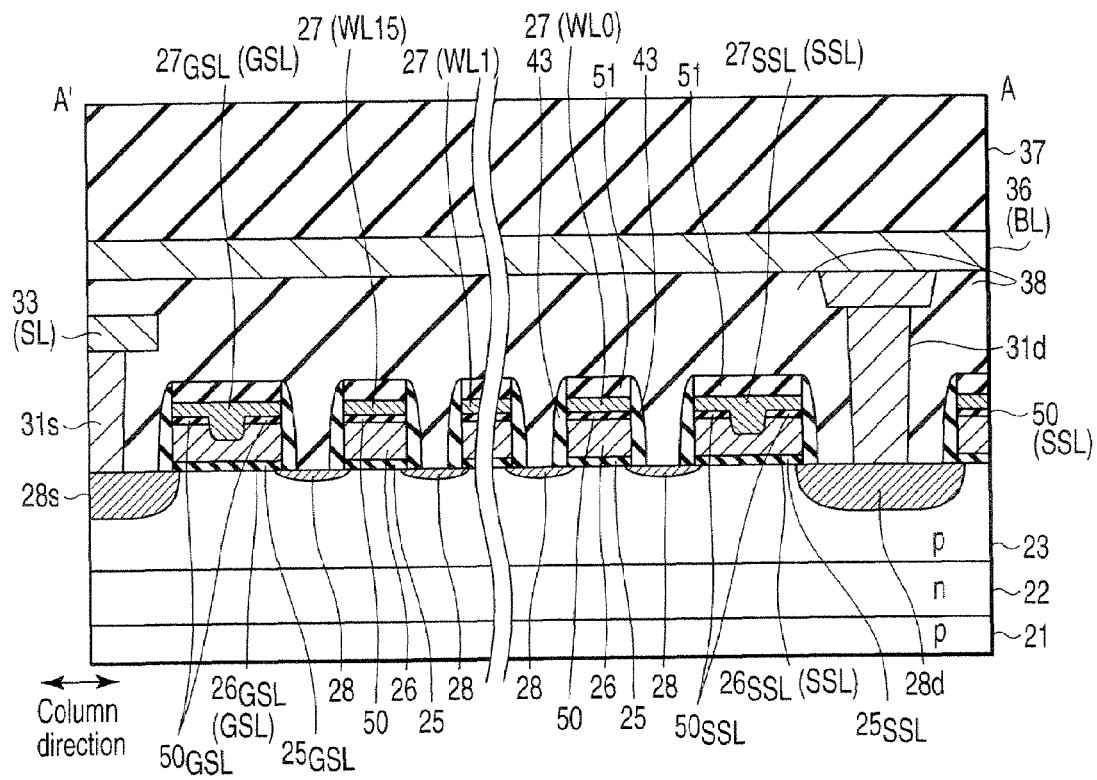
FIG. 11 is a sectional view taken along the line A-A' in FIG. 2 and showing a region including a NAND memory cell block and selection gate transistors, when non-masking isolation etch back is performed.

Since no such effect is obtained when non-masking isolation etch back is performed, the source electrode $28_s$ or drain electrode $28_d$ forms as a deep junction as shown in FIG. 11. As a consequence, a leakage produced through the selection gate transistor S2 increases, and this makes cutoff difficult.

As described previously, however, this embodiment can increase the height of the upper surface of the isolation insulating film 24 as indicated by the isolation surfaces $60_d$ and $60_s$ shown in FIG. 4, or as shown in FIGS. 8 and 9. As shown in FIG. 3, therefore, it is possible to form the source electrode $28_s$ and drain electrode $28_d$ as shallow junctions, and avoid the above problem. Also, no punch through easily occurs via the isolation insulating film 24 between the drain electrodes $28_d$ even in the BL contact $31_d$ on the data transfer line side. Accordingly, it is possible to solve the problem that electrical isolation between the data transfer lines (BL) is difficult to maintain.

As described above, in the conventional nonvolatile semiconductor storage device in which the floating gate electrodes and isolations are formed in self-alignment by using non-masking isolation etch back, the same electrode material as the floating gate electrode 26 largely protrudes upward from the upper surface of the isolation insulating film 24 even in the selection gate transistor region.

Consequently, the height of the isolation insulating film 24 in the portions where the third and fourth insulating films $50_{SSL}$ and $50_{GSL}$ are to be etched to form slit-like holes decreases, so the second electrode layer $27_{SSL}$ approaches the p-well region 23 of the memory cell. Since the second electrode layer $27_{SSL}$ approaches the p-well region 23 of the memory cell, the voltage of the floating gate electrode 26 changes, and this increases the effect by which the line of electric force from the gate end reaches the upper semiconductor region of the p-well region 23 to generate electric charge in the p-well region 23. This poses the problem that the threshold value of the selection gate transistor decreases.

As a result, the electric charge stored to prevent data write in a NAND string selected so as not to write data in it during programming escapes to the data transfer line 36. This causes write errors in cells.

Also, when non-masking isolation etch back is used, the variation in upper surface height of the isolation insulating film 24, i.e., the variation in bottom surface height of the second electrode layer $27_{SSL}$ and fourth electrode layer $27_{GSL}$ in the isolation includes not only the variation in film thickness of the floating gate electrode and the variation in etching depth when the third insulating film $50_{SSL}$ and fourth insulating film $50_{GSL}$ are etched to form slit-like holes, but also the variation in etching depth of the isolation insulating film 24. This increases the variation accordingly. As a consequence, the threshold value of the selection gate transistor further decreases in some cases.

In the structure of the nonvolatile semiconductor storage device of this embodiment of the present invention, the slit portion and its periphery of the selection gate transistor are not etched as shown in FIG. 10 when the isolation insulating film 24 is etched. This decreases the protrusion of the first and third electrode layers $26_{SSL}$ and $26_{GSL}$ made of the same electrode material as the floating gate electrode 26 from the upper surface of the isolation insulating film 24 in the selection gate transistor region.

That is, as shown in FIG. 7, it is possible to prevent the bottom surfaces of the second electrode layer $27_{SSL}$ and fourth electrode layer $27_{GSL}$ in the isolation from approaching the p-well region 23 of the memory cell. As a consequence, a selection gate transistor which suppresses the decrease and variation in threshold value can be implemented.

Accordingly, it is possible to prevent the problem that the electric charge selectively stored in a NAND string so as not to write data during programming escapes to the data transfer line, and improve the write characteristics of a cell or the read disturbance characteristics of an unselected data transfer line.

Furthermore, even when the length of the p-well region 23 for forming the data transfer line (BL) contact 31$_d$ or source line (SL) contact 31$_s$ becomes three times the minimum design width of the cell or more as micropatterning progresses, the isolation insulating film 24 can be formed to a position higher than the upper surface of the p-well region 23 of the memory cell. Accordingly, the upper surface of the isolation insulating film 24 can be kept high even if anisotropic etching of gate electrode processing causes the microloading effect.

This prevents n-type ions for forming the source electrode 28$_s$ and drain electrode 28$_d$ from being implanted from those side surfaces of the p-well region 23 of the memory cell, which are in contact with the isolation. Immediately below the gate, therefore, the junction depth of the source electrode 28$_s$ and drain electrode 28$_d$ of the selection gate transistor cannot be larger than that of the n-type diffusion layer 28 connected to the memory cell and serving as the source or drain electrode.

This makes it possible to prevent the problem that the increase in junction depth of the source electrode 28$_s$ and drain electrode 28$_d$ increases the leakage produced through the selection gate transistor S2 or makes cutoff difficult. It is also possible to suppress punch through between the drain electrodes 28$_d$ in the BL contact on the data transfer line side, thereby maintaining good electrical isolation between the data transfer lines BL.

Second Embodiment

Figure 18:
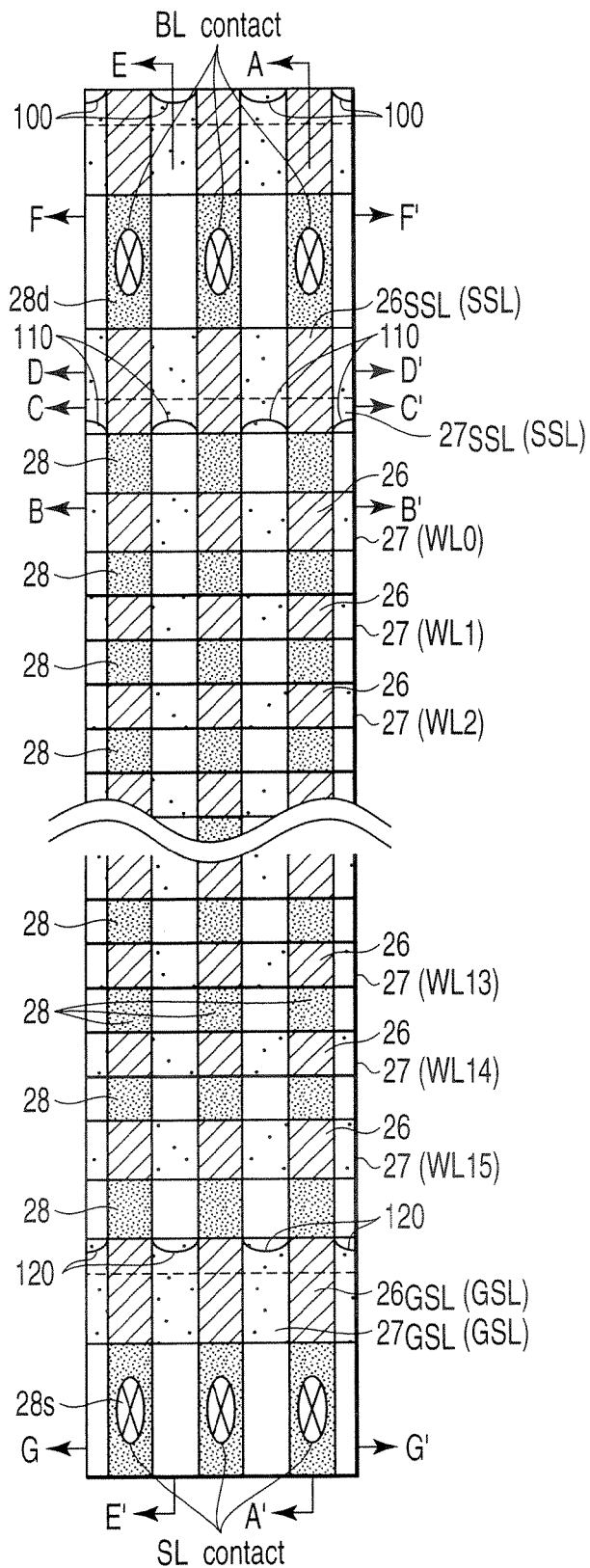
FIG. 18 is a plan view showing the layout of a nonvolatile semiconductor storage device according to the second embodiment of the present invention.

FIG. 18 is a plan view of the layout of a nonvolatile semiconductor storage device according to the second embodiment of the present invention. Note that in the following description, the same reference numerals as in FIG. 2 denote the same parts, and a detailed explanation thereof will be omitted. Note also that the suffixes of symbols represent the differences between the positions of elements used, and elements having the same main symbol indicate parts formed in the same step by using the same material.

FIG. 18 shows a structure obtained by juxtaposing three NAND strings shown in the equivalent circuit diagram of FIG. 1. FIG. 18 shows only a structure below gate electrodes 27 in order to clearly indicate the cell structure. Referring to FIG. 18, nonvolatile memory cells M0 to M15 comprising MOS transistors each having a floating gate electrode 26 connect in series, and one end connects to a data transfer line via a selection transistor S1. The other end connects to a common source line via a selection transistor S2.

The nonvolatile semiconductor storage device according to this embodiment shown in FIG. 18 differs from the first embodiment shown in FIG. 2 in that third and fourth insulating films 50$_{SSL}$ and 50$_{GSL}$ are etched away in a wide region including slit-like regions shown in the first embodiment. That is, the third insulating film 50$_{SSL}$ and fourth insulating film 50$_{GSL}$ are etched away in the regions of BL contacts and SL contacts surrounded by the broken lines in FIG. 18.

Figure 19:
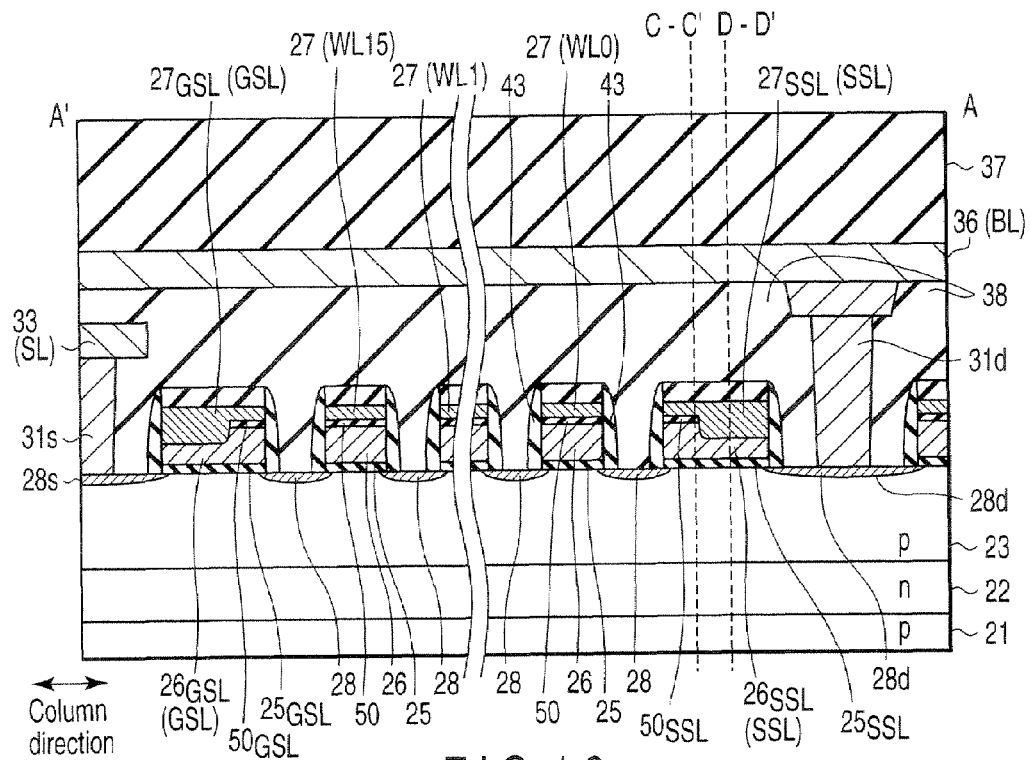
FIG. 19 is a sectional view taken along a line A-A' in FIG. 18 and showing a region including a NAND memory cell block and selection gate transistors.
Figure 20:
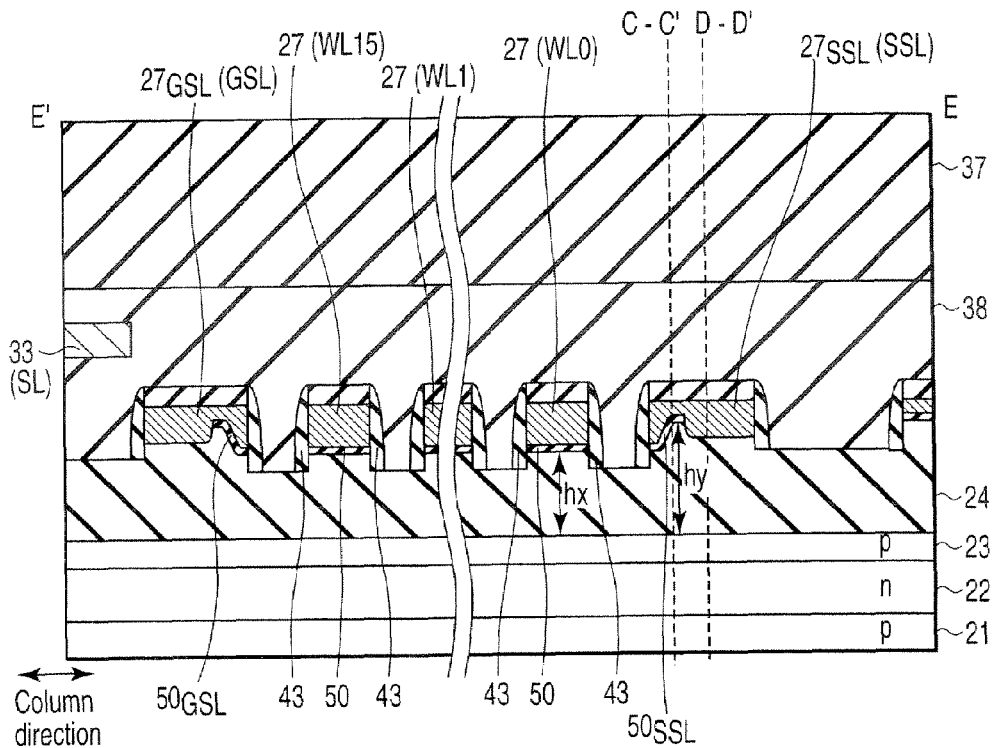
FIG. 20 is a sectional view taken along a line E-E' in FIG. 18 and showing an isolation.

FIG. 19 is a sectional view taken along a line A-A' in FIG. 18 and showing a region including a NAND memory cell block and selection gate transistors. FIG. 20 is a sectional view taken along a line E-E' in FIG. 18 and showing isolations.

Figure 21:
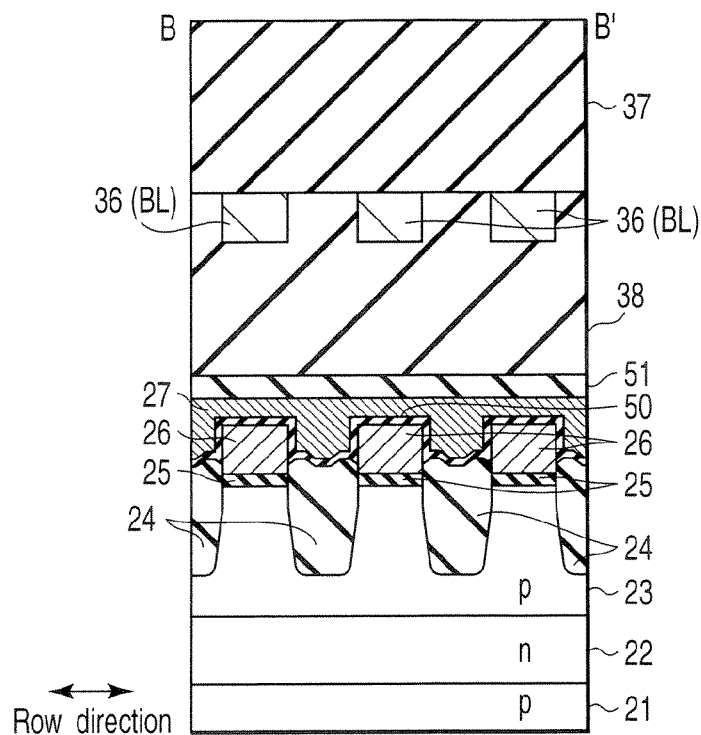
FIG. 21 is a sectional view taken along a line B-B' in FIG. 18 and showing nonvolatile memory cells.
Figure 22:
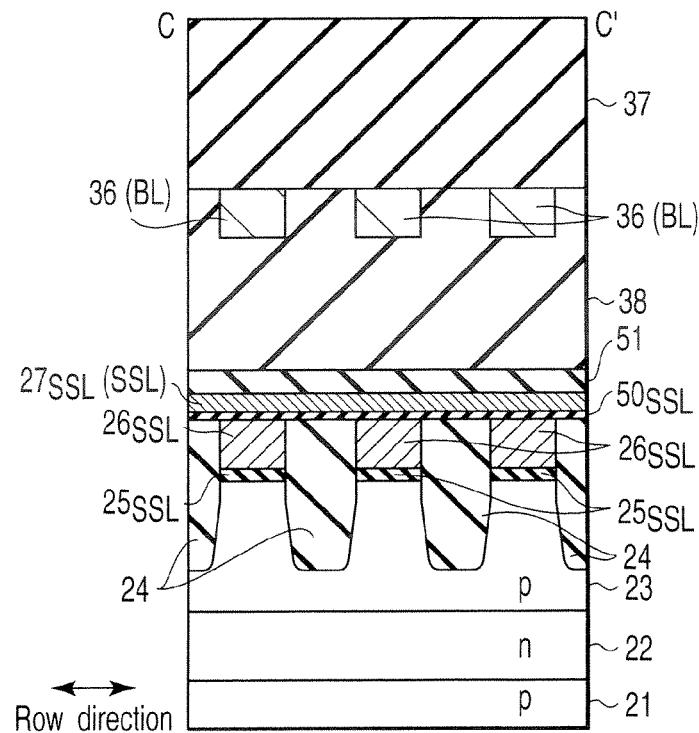
FIG. 22 is a sectional view taken along a line C-C' in FIG. 18 and showing first selection gate transistors.
Figure 23:
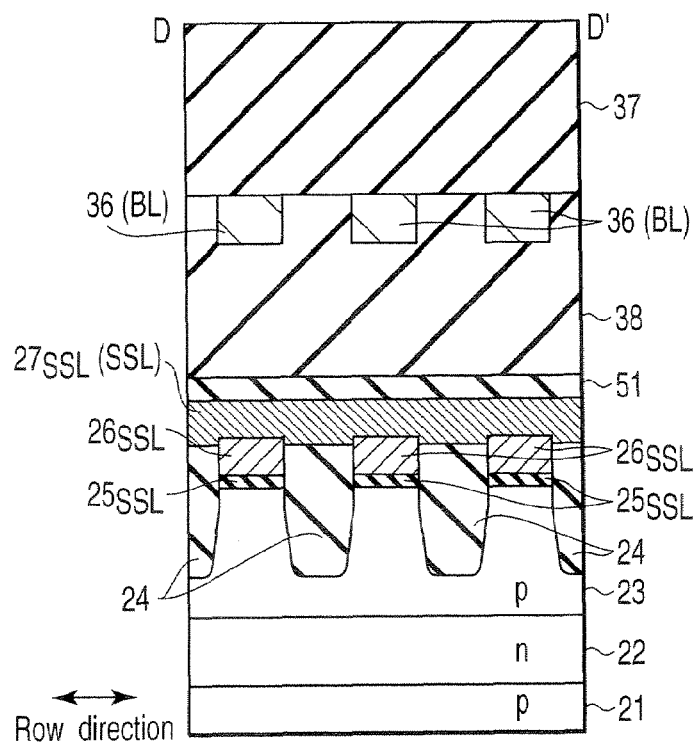
FIG. 23 is a sectional view taken along a line D-D' in FIG. 18 and showing a slit-like hole in an insulating film of the first selection gate transistor.

FIG. 21 is a sectional view taken along a line B-B' in FIG. 18 and showing memory cell portions. FIGS. 22 and 23 are sectional views taken along lines C-C' and D-D', respectively, in FIG. 18 and showing the first selection gate transistor S1. FIG. 23 shows the section of holes in the third insulating film 50$_{SSL}$ and fourth insulating film 50$_{GSL}$ open wide as indicated by the broken lines in FIG. 18.

Figure 24:
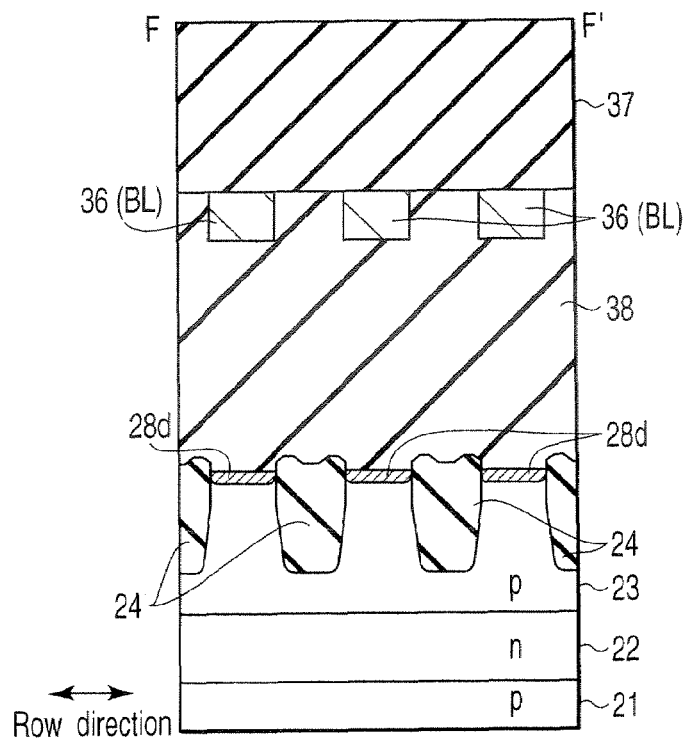
FIG. 24 is a sectional view taken along a line F-F' in FIG. 18 and showing drain electrodes.
Figure 25:
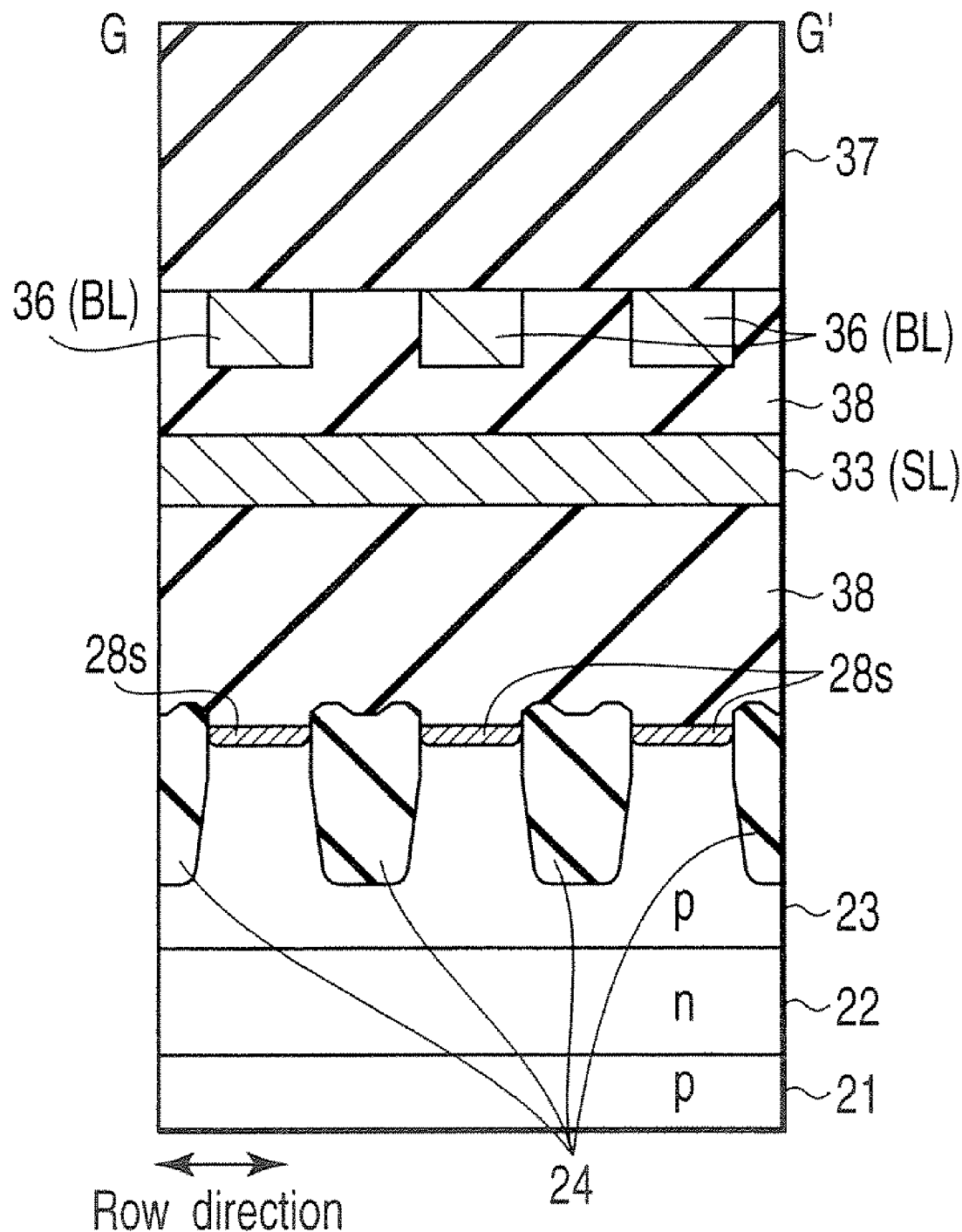
FIG. 25 is a sectional view taken along a line G-G' in FIG. 18 and showing source electrodes.

FIGS. 24 and 25 are sectional views taken along lines F-F' and G-G' in FIG. 18 and showing drain electrodes and source electrodes, respectively.

As in the first embodiment, when etching an isolation insulating film 24 in order to expose the side surfaces of the floating gate electrode 26, this embodiment does not etch the entire surface of the memory cell string shown in FIG. 18 but etches the same range as shown in FIG. 10.

That is, this embodiment etches the memory cell portions so as not to etch at least a region including a data transfer line contact 31$_d$ and a region including a source line contact 31$_s$. Reference numerals 100, 110, and 120 in FIG. 18 denote the boundaries between the etched and unetched regions on the isolation insulating film 24.

In this embodiment, as indicated by the boundaries 100, 110, and 120, etching of the region including the memory cell portion does not reach the regions, indicated by the broken lines in FIG. 18, where the third and fourth insulating films 50$_{SSL}$ and 50$_{GSL}$ are etched to form holes. That is, the regions where the third and fourth insulating films 50$_{SSL}$ and 50$_{GSL}$ are etched to form holes do not undergo etching when the isolation insulating film 24 is etched.

As shown in FIG. 20, therefore, on the isolation insulating film 24 for forming isolations, a height $h_y$ of at least portions in contact with the holes of the third and fourth insulating films 50$_{SSL}$ and 50$_{GSL}$ connected to the first and second selection gate transistor portions is larger than a height $h_x$ of a second insulating film 50 connected to the memory cell portion.

The nonvolatile semiconductor storage device according to this embodiment has the structure capable of obtaining the same effects as in the first embodiment. Therefore, as in the first embodiment, a selection gate transistor which suppresses the decrease and variation in threshold value can be implemented.

Accordingly, it is possible to prevent the problem that electric charge selectively stored in a NAND string so as not to write data during programming escapes to the data transfer line, and improve the write characteristics of a cell or the read disturb characteristics of an unselected data transfer line.

This embodiment forms holes by etching the third and fourth insulating films 50$_{SSL}$ and 50$_{GSL}$ in that region surrounded by the broken lines in FIG. 18, which is common to NAND strings adjacent to each other with the isolation interposed between them. That is, the hole region reaches the data transfer line contact side or source line contact side of the selection gate transistor.

Since, therefore, etching can be performed in the etching area wider than that in the first embodiment which forms slit-like holes, it is possible to use inexpensive lithography having a resolution lower than that in the first embodiment. It is also possible to use an inexpensive etching apparatus because no fine etching trenches need be formed.

Third Embodiment

Figure 26:
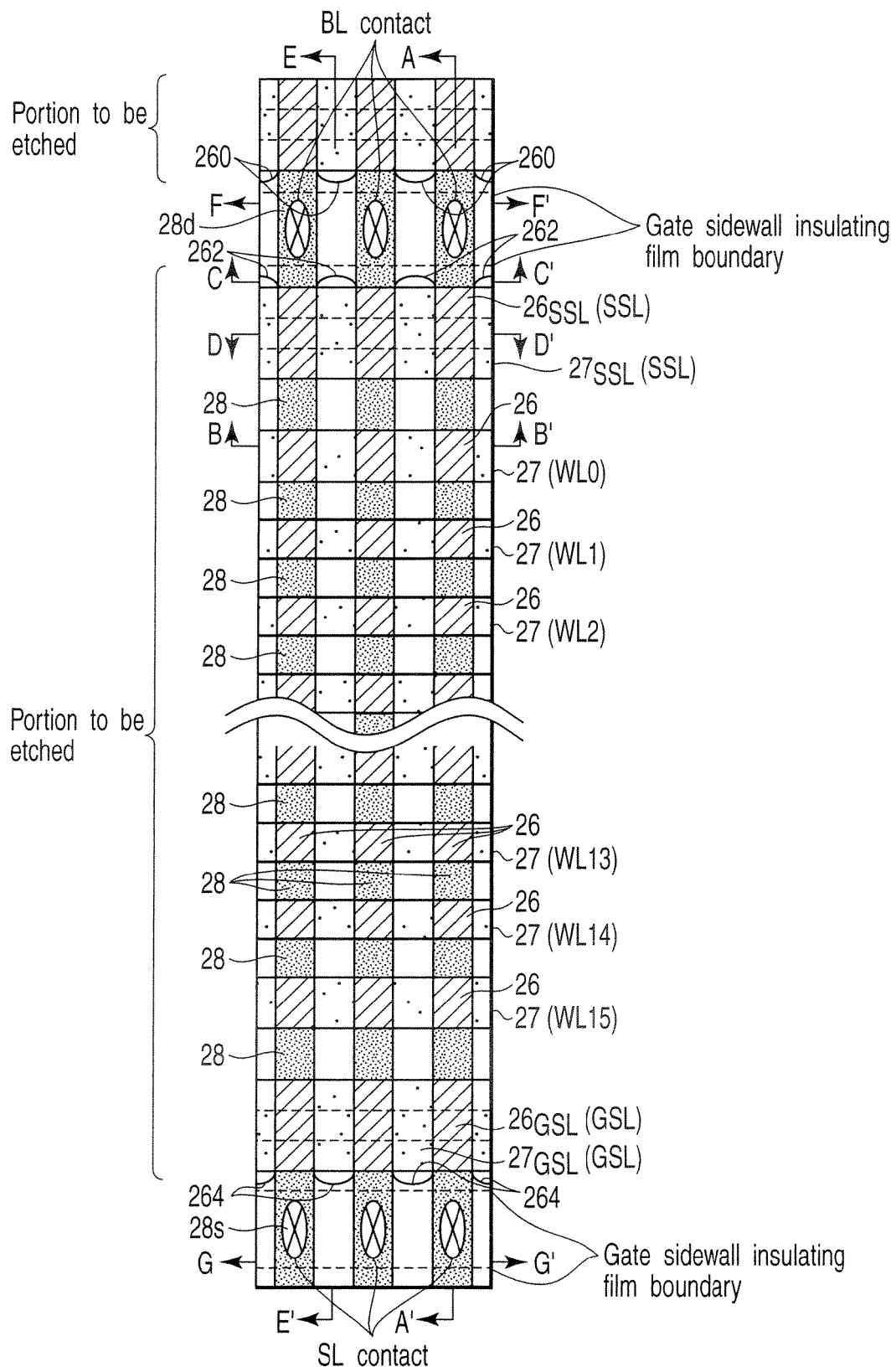
FIG. 26 is a plan view showing the layout of a nonvolatile semiconductor storage device according to the third embodiment of the present invention.

FIG. 26 is a plan view of the layout of a nonvolatile semiconductor storage device according to the third embodiment of the present invention. Note that the same reference numerals as in the nonvolatile semiconductor storage devices according to the first and second embodiments denote the same parts, and a detailed explanation thereof will be omitted. Note also that the suffixes of symbols represent the differences between the positions of elements used, and elements having the same main symbol indicate parts formed in the same step by using the same material.

FIG. 26 shows a structure obtained by juxtaposing three NAND strings shown in the equivalent circuit diagram of FIG. 1. FIG. 26 particularly shows only a structure below control gate electrodes 27 in order to clearly indicate the cell structure. Referring to FIG. 26, nonvolatile memory cells M0 to M15 comprising MOS transistors each having a floating gate electrode 26 connect in series, and one end connects to a data transfer line via a selection transistor S1. The other end connects to a common source line via a selection transistor S2.

Figure 27:
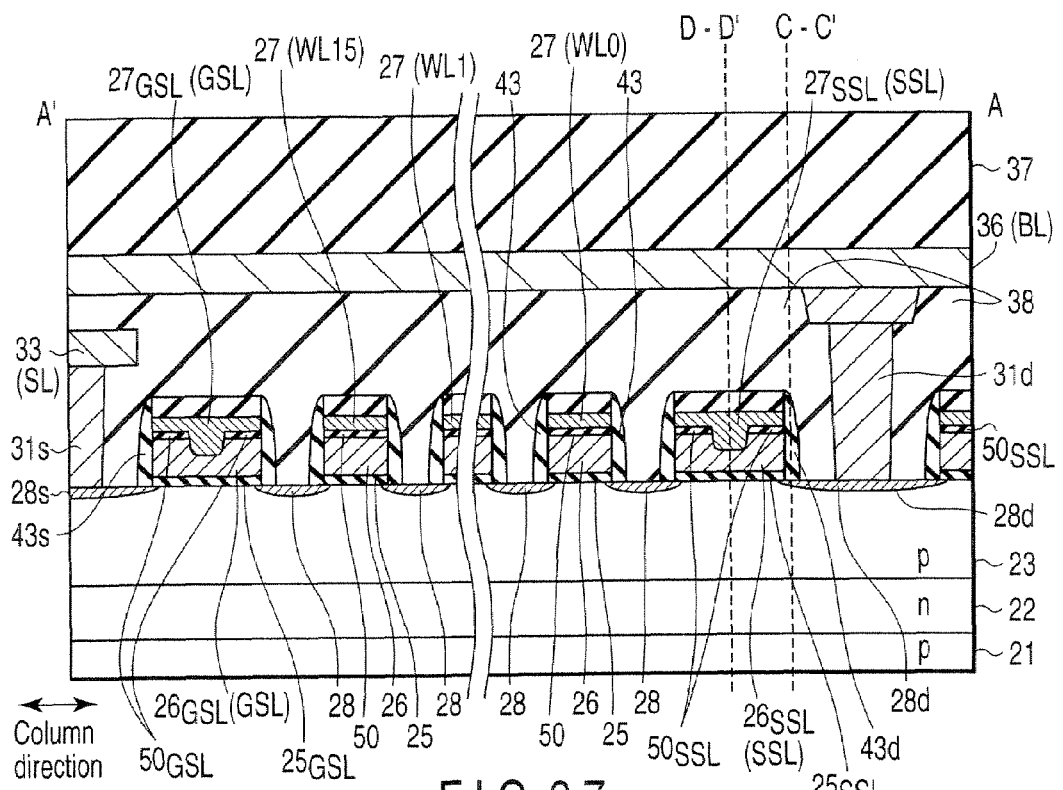
FIG. 27 is a sectional view taken along a line A-A' in FIG. 26 and showing a region including a NAND memory cell block and selection gate transistors.
Figure 28:
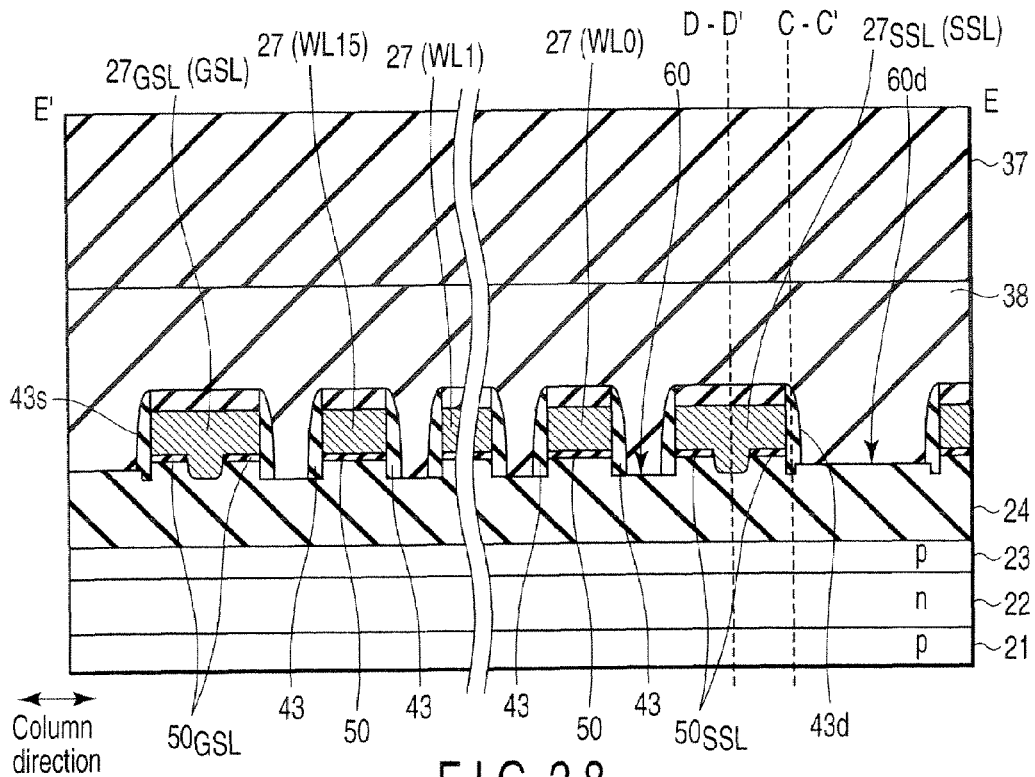
FIG. 28 is a sectional view taken along a line E-E' in FIG. 26 and showing an isolation.

FIG. 27 is a sectional view taken along a line A-A' in FIG. 26 and showing a region including a NAND cell block and selection gate transistors. FIG. 28 is a sectional view taken along a line E-E1 in FIG. 26 and showing isolations.

Figure 31:
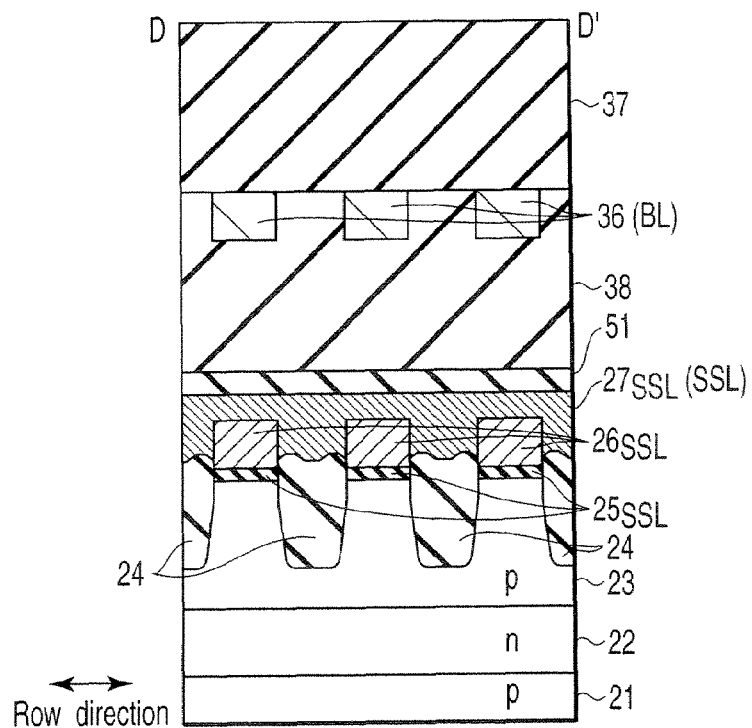
FIG. 31 is a sectional view taken along a line D-D' in FIG. 26 and showing a slit-like hole in an insulating film of the first selection gate transistor.

FIG. 29 is a sectional view taken along a line B-B' in FIG. 26 and showing memory cell portions. FIGS. 30 and 31 are sectional views taken along lines C-C' and D-D', respectively, in FIG. 26 and showing the first selection gate transistor S1. FIG. 30 particularly shows the section of a sidewall insulating film $43_d$ of the first selection gate transistor S1 on the side of a data transfer line contact $31_d$. FIG. 31 shows the section of slit-like holes (to be described later) formed in a third insulating film $50_{SSL}$ and fourth insulating film $50_{GSL}$.

Figure 32:
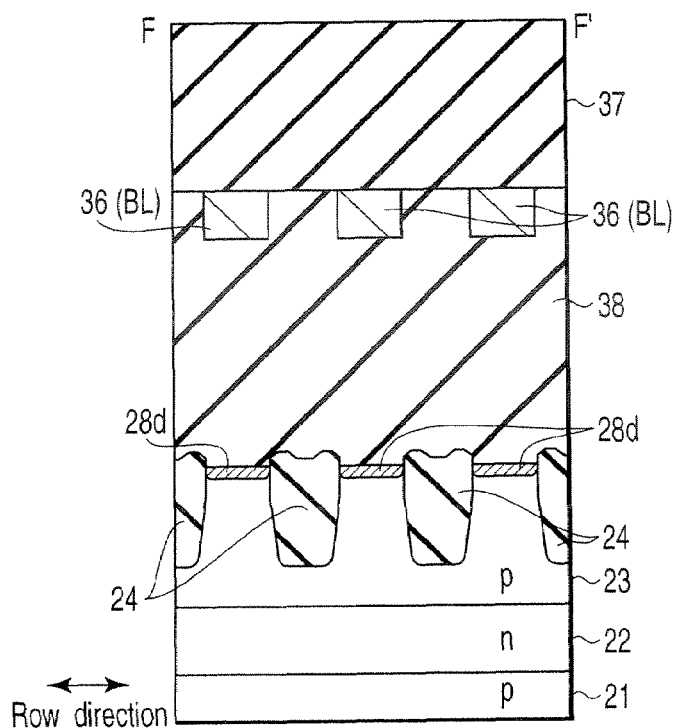
FIG. 32 is a sectional view taken along a line F-F' in FIG. 26 and showing drain electrodes.
Figure 33:
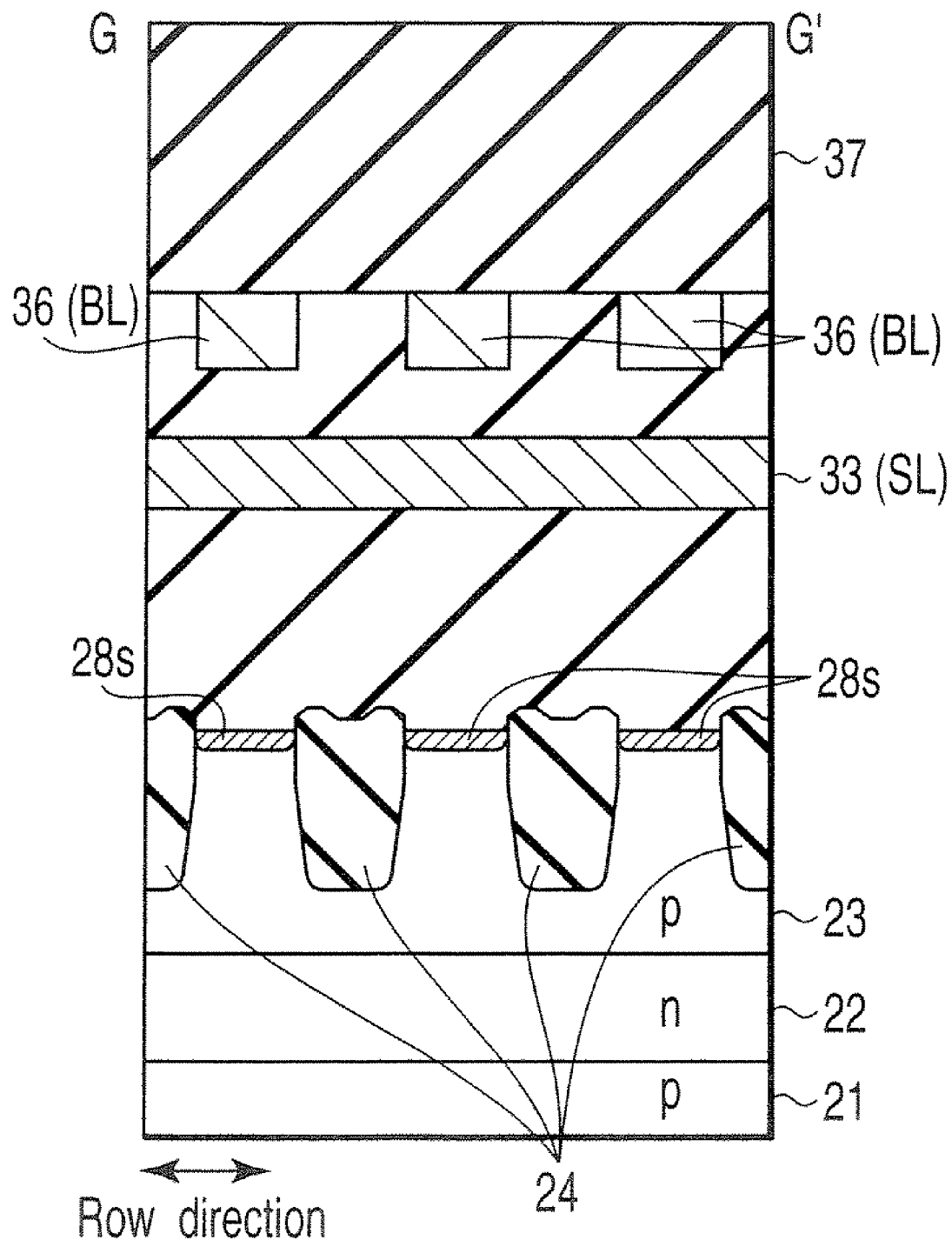
FIG. 33 is a sectional view taken along a line G-G' in FIG. 26 and showing source electrodes.

FIGS. 32 and 33 are sectional views taken along lines F-F' and G-G' in FIG. 26 and showing drain electrodes and source electrodes, respectively.

Compared to the first and second embodiments, this embodiment forms steps on an isolation insulating film 24, as shown below the gate sidewall insulating film $43_d$ in FIG. 28, on the sides of a BL contact $31_d$ and SL contact $31_s$ of the selection gate transistors. Referring to FIG. 28, therefore, an isolation surface $60_d$ on the side of the data transfer line contact $31_d$ and an isolation surface $60_s$ on the side of the source line contact $31_s$ are higher than an isolation surface 60 on the memory cell side.

As in the first and second embodiments, when etching the isolation insulating film 24 in order to expose the side surfaces of the floating gate electrode 26, this embodiment does not etch the entire surface of the memory cell string shown in FIG. 26. As indicated by dotted-line boundaries in FIG. 26, this embodiment does not etch regions including at least the data transfer line contact $31_d$ and source line contact $31_s$ but etches a region including the memory cell portions by using, e.g., a resist and lithography process.

Reference numerals 260, 262, and 264 in FIG. 26 denote the actual boundaries between the etched and unetched regions on the isolation insulating film 24. The positions of the boundaries 260, 262, and 264 are closer to the data transfer line contact $31_d$ and source line contact $31_s$ in this embodiment than in the first and second embodiments.

Accordingly, the etching boundaries 260, 262, and 264 form below the gate sidewall insulating film $43_d$ when the isolation insulating film 24 is etched. That is, the etching boundaries 260, 262, and 264 when the isolation insulating film 24 is etched do not overlap the slit-like holes formed by etching the third and fourth insulating films $50_{SSL}$ and $50_{GSL}$.

This makes it possible to increase the distances between the etching boundaries 260, 262, and 264 and those slit-like holes in the third and fourth insulating films $50_{SSL}$ and $50_{GSL}$, which bring second and fourth electrode layers $27_{SSL}$ and $27_{GSL}$ into contact with first and third electrode layers $26_{SSL}$ and $26_{GSL}$, respectively, in the selection gate transistors.

Accordingly, it is possible to reduce those variations in height of the second and fourth electrode layers $27_{SSL}$ and $27_{GSL}$ formed on the isolation insulating film 24 via the third and fourth insulating films $50_{SSL}$ and $50_{GSL}$, which are produced when the etching boundaries 260, 262, and 264 come close to and overlap the slit-like holes.

In addition, the etching boundaries 260, 262, and 264 do not form below the first and third electrode layers $26_{SSL}$ and $26_{GSL}$ as the gate electrodes of the selection gate transistors. Therefore, it is possible to equalize the heights of the first and third electrode layers $26_{SSL}$ and $26_{GSL}$ on the sides of the source and drain electrodes of the selection gate transistors, and further increase the uniformity of etching of the first and third electrode layers $26_{SSL}$ and $26_{GSL}$.

As in the first and second embodiments, this embodiment can also prevent n-type ions for forming a source electrode $28_s$ and drain electrode $28_d$ from being injected from those side surfaces of a p-well region 23 of the memory cell, which are in contact with the isolation insulating film 24, thereby preventing the formation of deep junctions.

Consequently, it is possible to prevent the problem that leakage produced through the selection gate transistor S2 increases to make cutoff difficult. It is also possible to prevent easy occurrence of punch through via the isolation insulating film 24 between the drain electrodes $28_d$ in the BL contact $31_d$ on the data transfer line side, thereby preventing the problem that electrical isolation between the data transfer lines (BL) becomes difficult to hold.

Fourth Embodiment

Figure 34:
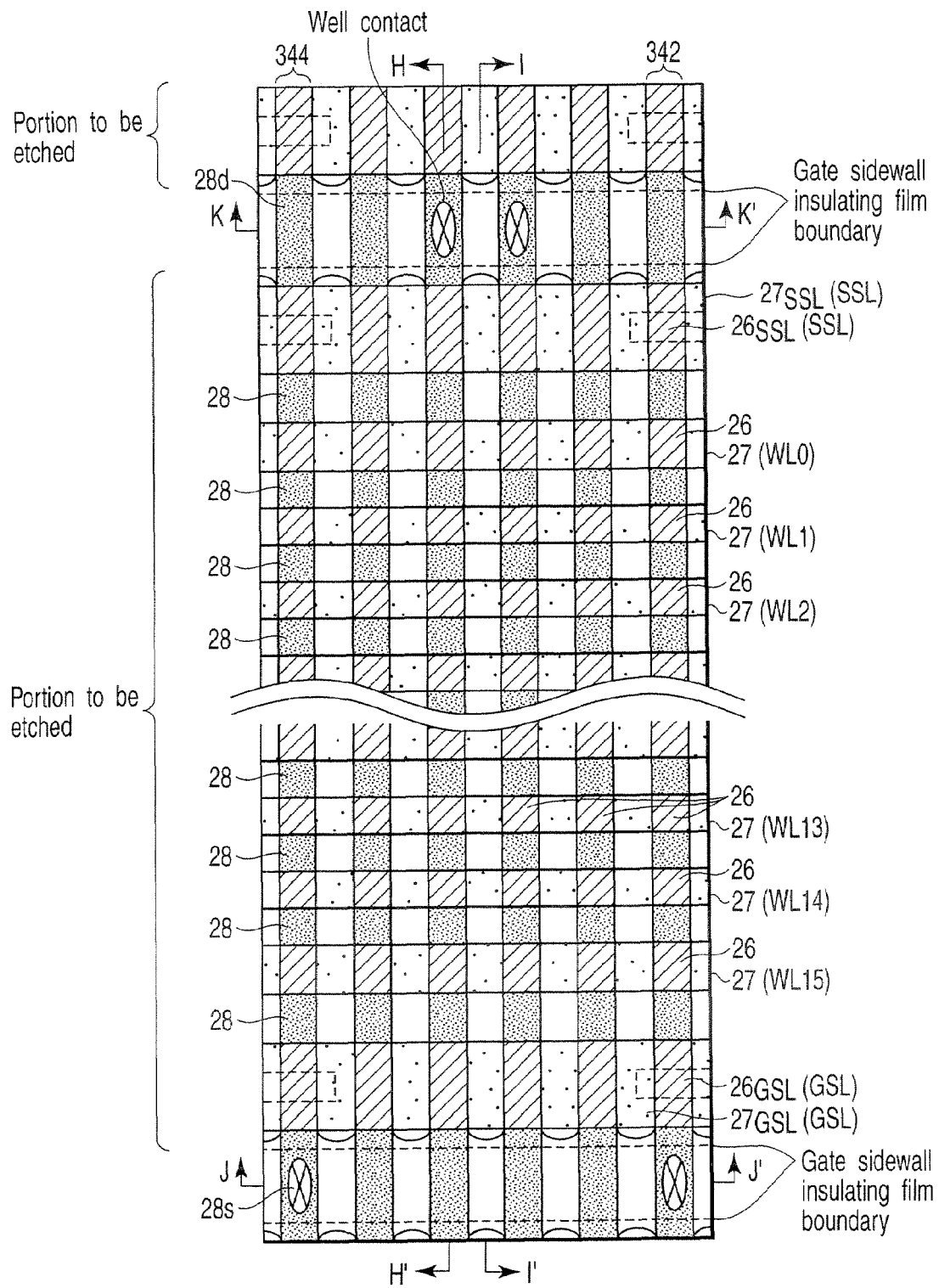
FIG. 34 is a plan view showing the layout of well contact portions of a nonvolatile semiconductor storage device according to the fourth embodiment of the present invention.

FIG. 34 is a plan view of the layout of well contact portions of a nonvolatile semiconductor storage device according to the fourth embodiment of the present invention. Note that the same reference numerals as in the first to third embodiments denote the same parts, and a detailed explanation thereof will be omitted. Note also that the suffixes of symbols represent the differences between the positions of elements used, and elements having the same main symbol indicate parts formed in the same step by using the same material.

Figure 35:
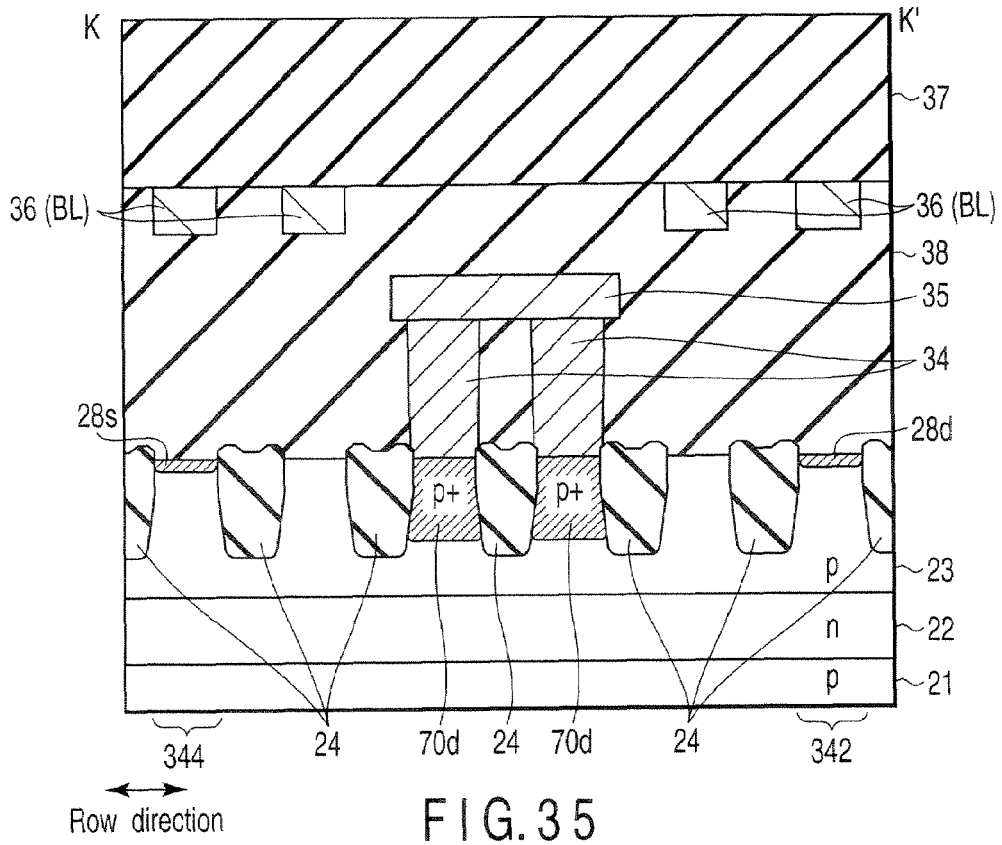
FIG. 35 is a sectional view taken along a line K-K' in FIG. 34 and showing the well contact portions.
Figure 36:
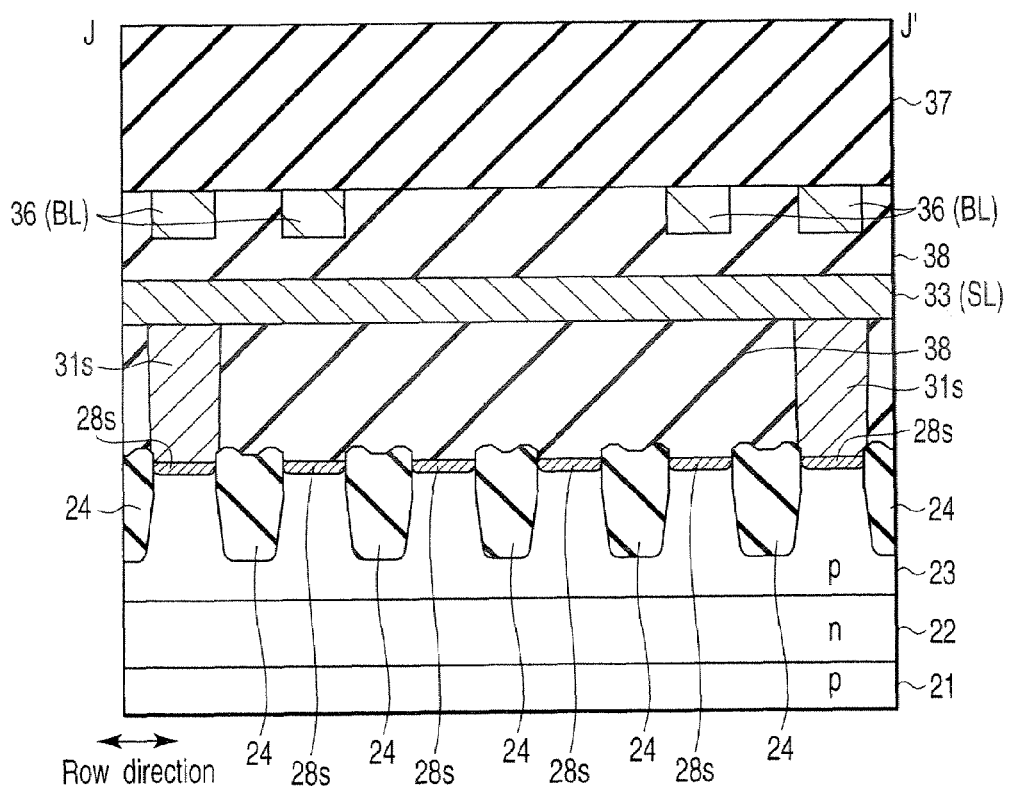
FIG. 36 is a sectional view taken along a line J-J' in FIG. 34 and showing source line contacts.
Figure 37:
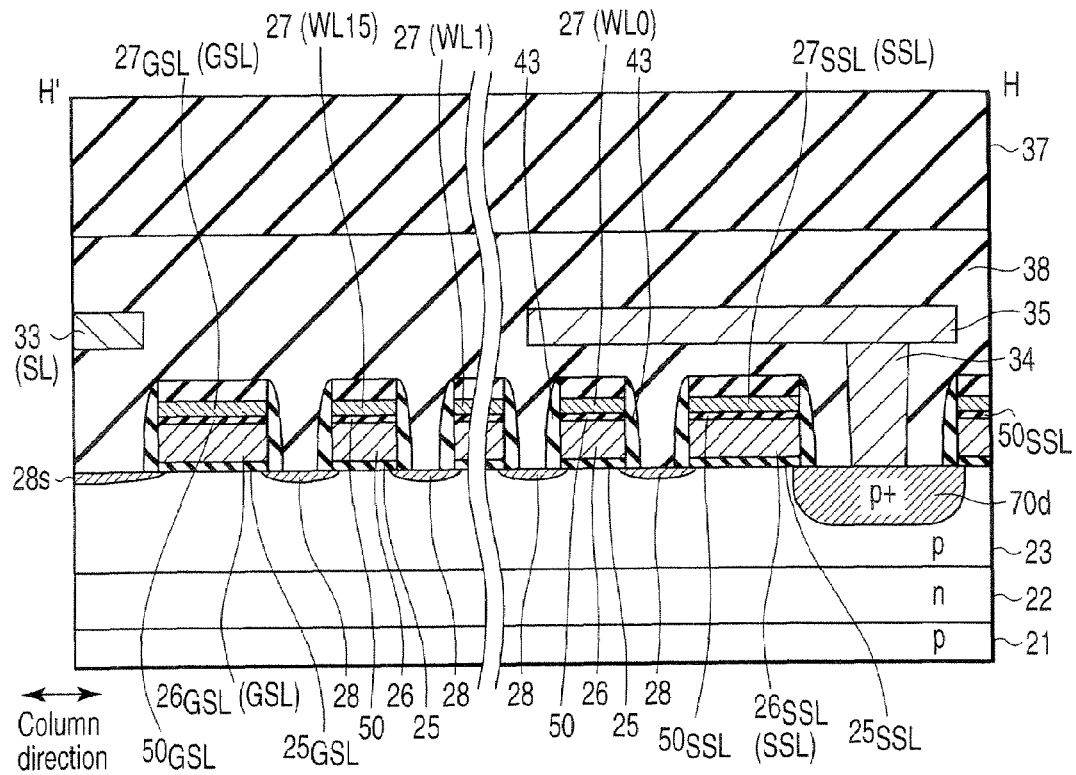
FIG. 37 is a sectional view taken along a line H-H' in FIG. 34 and showing the well contact portion.
Figure 38:
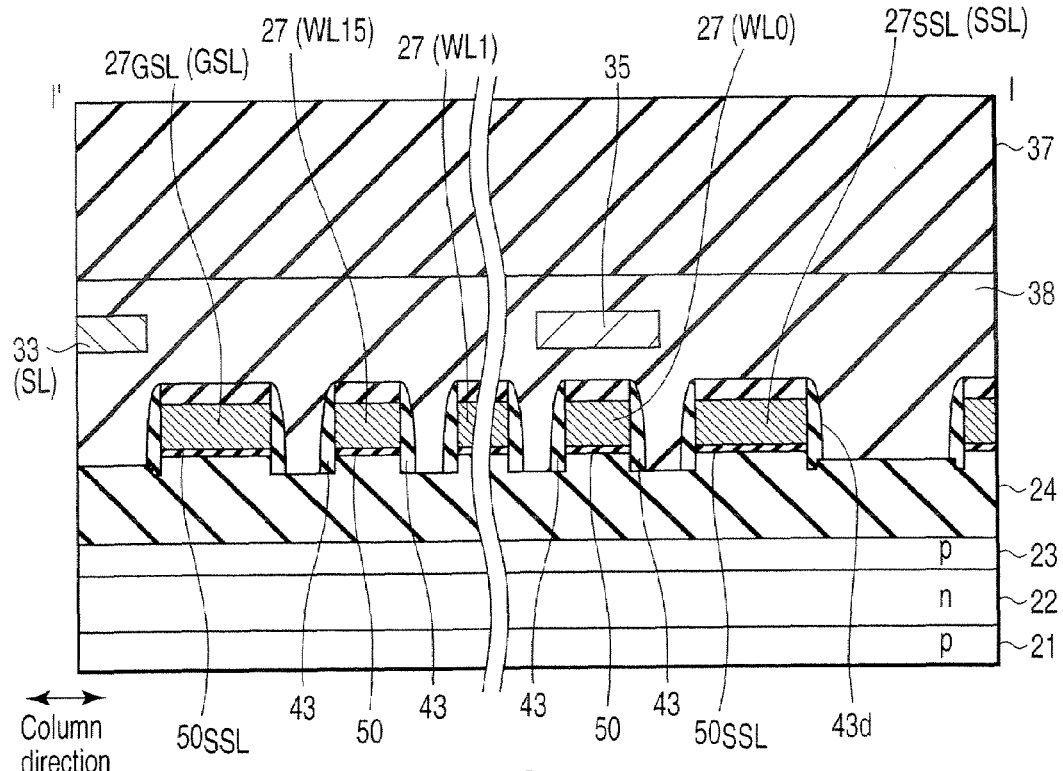
FIG. 38 is a sectional view taken along a line I-I' in FIG. 34 and showing an isolation.

FIGS. 35 and 36 are sectional views taken along lines K-K' and J-J', respectively, in FIG. 34. FIGS. 37 and 38 are sectional views taken along lines H-H' and I-I', respectively, in FIG. 34.

This embodiment is directed to a well contact portion formed between memory cell string portions of the NAND flash memory according to the third embodiment. FIG. 34 shows cell p-well contact portions 34 formed along the row direction parallel to NAND strings. As will be described later, the well contact portion 34 is a contact formed to hold a cell p-well region 23 at a constant potential.

Figure 39:
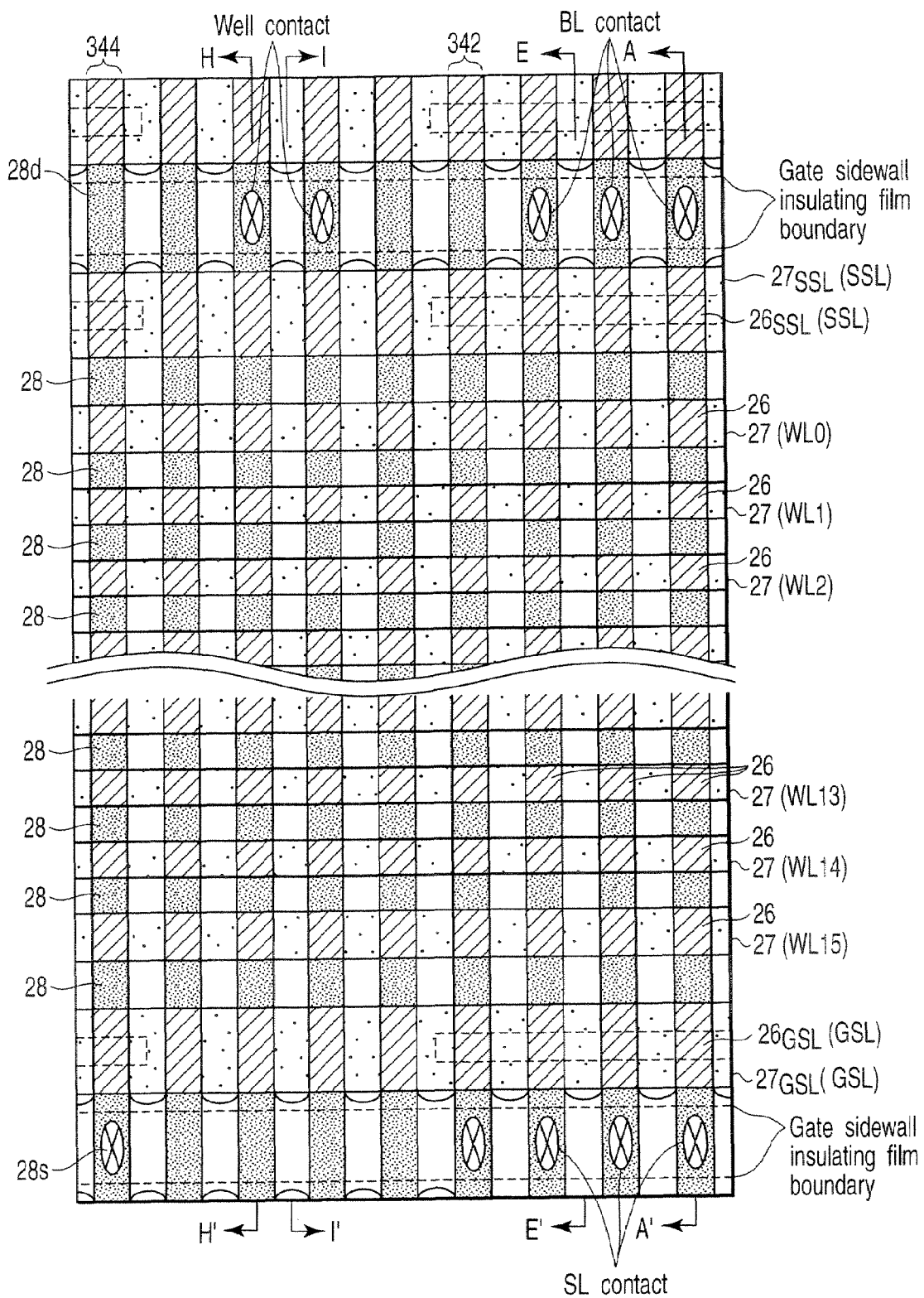
FIG. 39 is a plan view showing the layout of memory cell string portions and the well contact portions of the nonvolatile semiconductor storage device according to the fourth embodiment of the present invention.

FIG. 39 shows a state in which the well contact portions shown in FIG. 34 are formed parallel to NAND strings having the data transfer line (BL) contacts shown in FIG. 26. Strings 342 and 344 on the two sides in FIG. 34 are so-called dummy cell regions 342 and 344 in which semiconductor regions and data transfer lines 36 are formed in the same manner as in the NAND string.

As shown in FIG. 39, no data transfer line (BL) contacts are formed in the dummy cell regions 342 and 344, so the distance between the cell p-well contact 34 and a data transfer line (BL) contact $31_d$ can be secured.

Also, as is apparent from FIG. 35, a region having no n-type source/drain region is formed between an n-type source/drain region $28_d$ and p$^+$-type region $70_d$ of the dummy cell regions 342 and 344. This makes it possible to ensure a breakdown voltage between the source/drain region $28_d$ and p$^+$-type region $70_d$ of the dummy cell regions 342 and 344. An n-type region may also be formed in this region if the breakdown voltage between the n-type region $28_d$ and p$^+$-type region $70_d$ poses no problem.

As shown in FIG. 37, the well contact 34 is formed in the cell p-well region 23 via the p$^+$-type region $70_d$. The potential of the cell p-well region 23 can be held constant by connecting the well contact 34 to, e.g., an interconnection layer 35 and connecting the interconnection layer 35 to a power supply (not shown), thereby forming a contact electrode for the cell p-well region 23.

A diffusion layer for forming the p$^+$-type region $70_d$ is formed at a depth of 10 to 500 nm by using, e.g., boron to make the surface concentration be $10^{17}$ to $10^{21}$ cm$^{-3}$. Embodiments from this embodiment to the seventh embodiment (to be presented later) show contacts having the same pitch as the cell pitch of the data transfer line (BL) contacts of memory cells as the well contacts 34. However, if the contacts do not penetrate through an isolation insulating film 24, it is possible to use peripheral contacts having a diameter of, e.g., 60 to 200 nm which is larger than the diameter of the data transfer line contacts as in the conventional devices.

Figure 40:
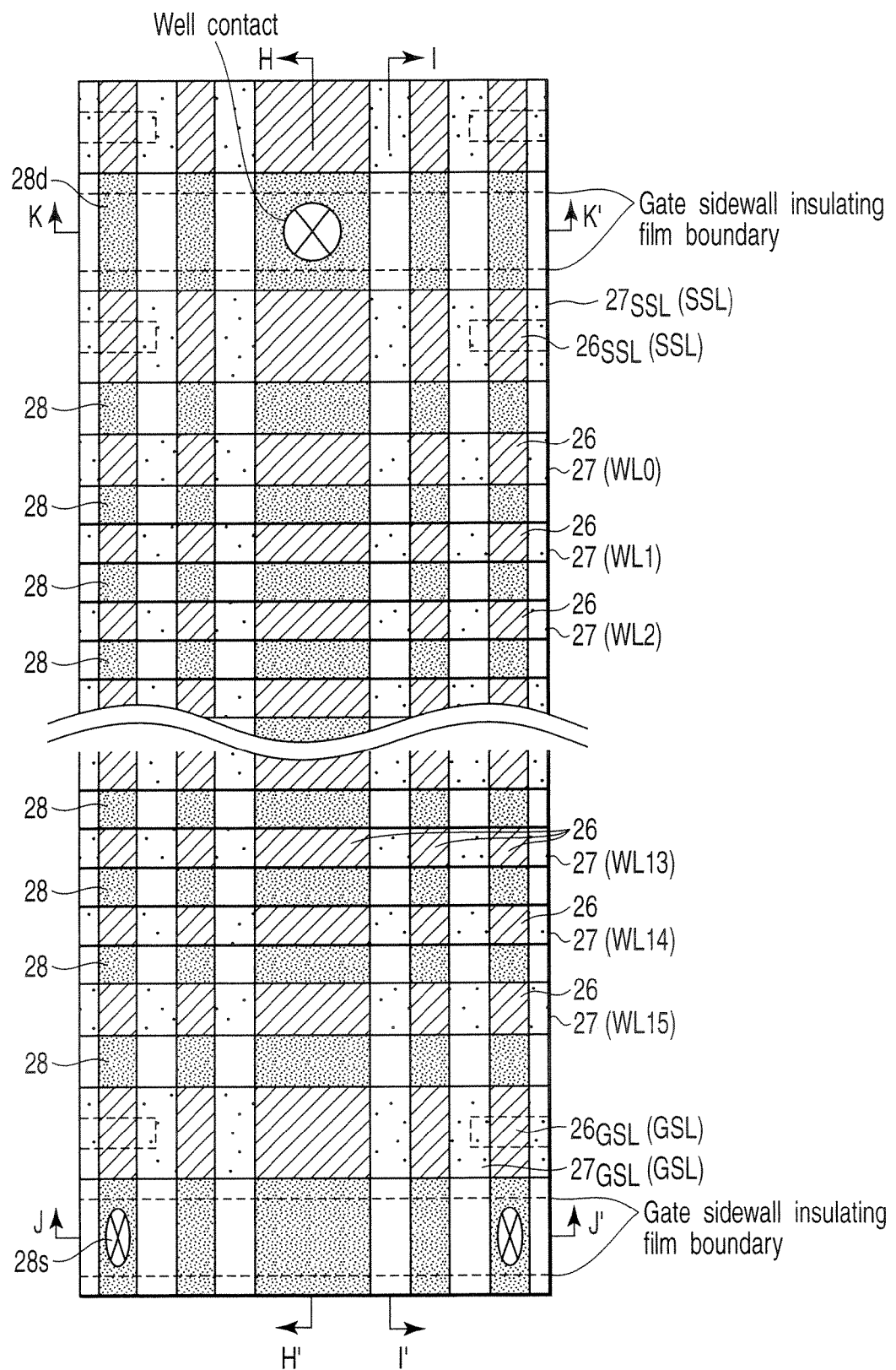
FIG. 40 is a plan view showing the layout of a conventional well contact portion.
Figure 41:
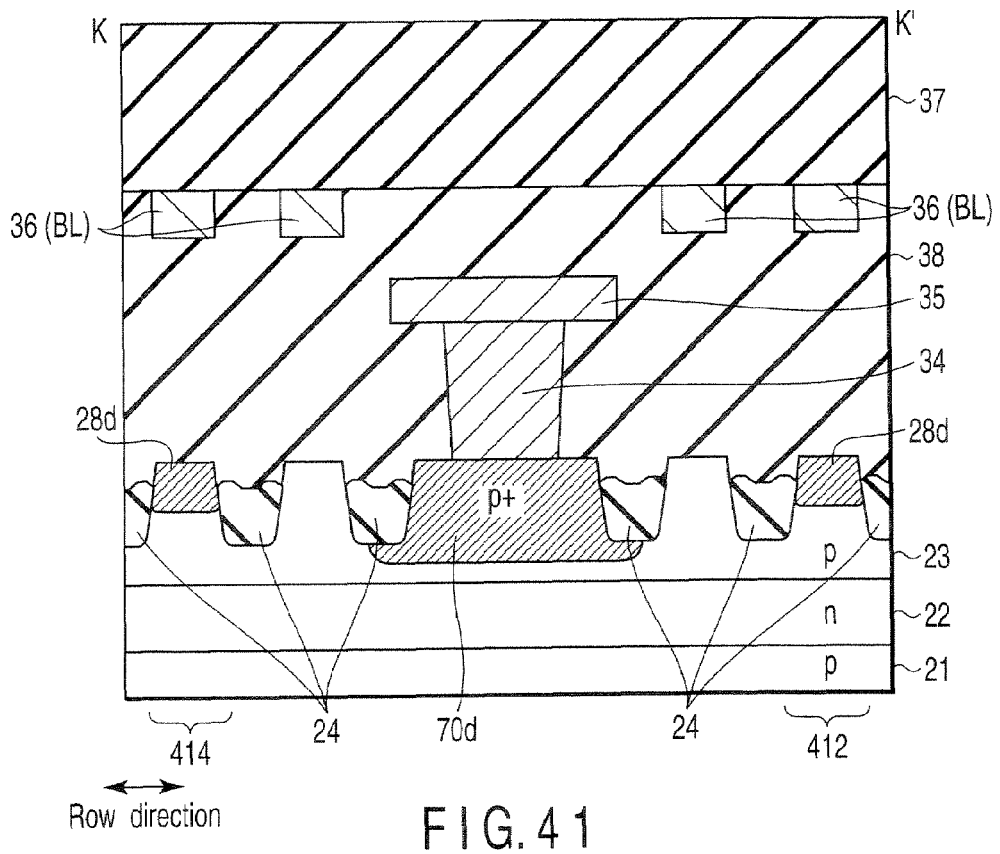
FIG. 41 is a sectional view taken along a line K-K' in FIG. 40 and showing the well contact portion.
Figure 42:
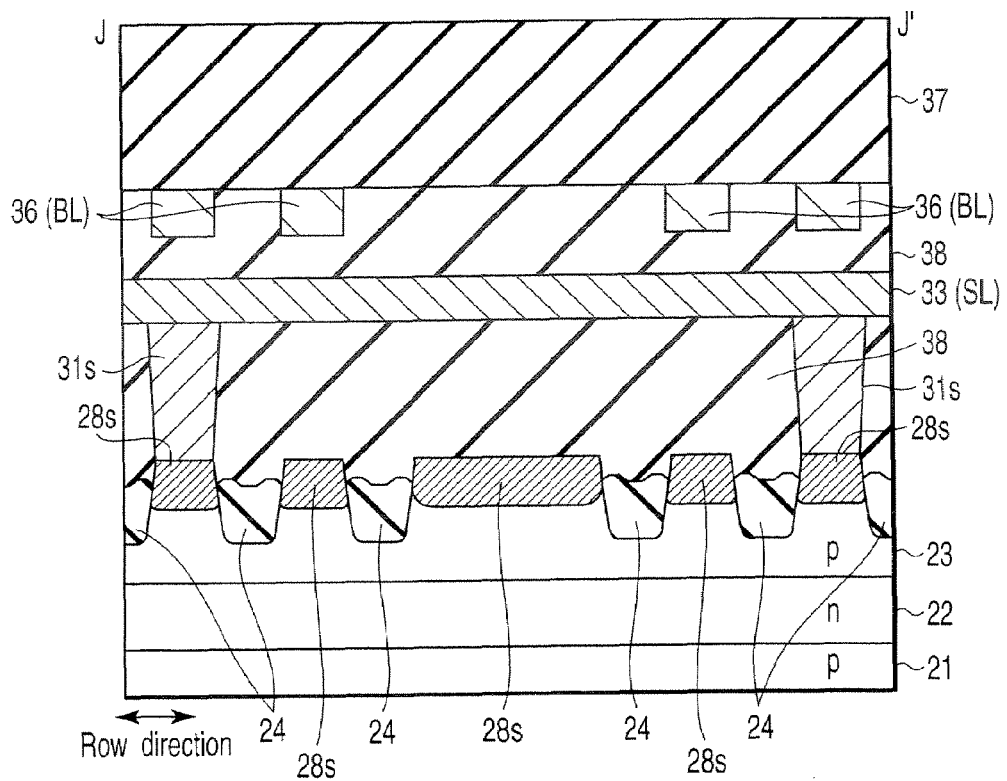
FIG. 42 is a sectional view taken along a line J-J' in FIG. 40 and showing source line contacts.

As shown in FIG. 40, the conventional method forms a semiconductor region wider than a semiconductor region of a NAND string, and forms a p$^+$-type region in this portion. FIG. 40 is a plan view showing a well contact portion formed between NAND string portions of the conventional NAND flash memory parallel to the row direction of these strings. FIGS. 41 and 42 are sectional views taken along lines K-K' and J-J', respectively, in FIG. 40.

FIG. 41 particularly shows a cell p-well contact formed parallel to a NAND string having data transfer line contacts. The two sides in FIG. 41 are so-called dummy cell regions 412 and 414 in which semiconductor regions and data transfer lines 36 are formed in the same manner as in the NAND string. Since no data transfer line contacts are formed in the dummy cell regions 412 and 414, the distance between a cell p-well contact 34 and data transfer line contact $31_d$ can be secured.

When forming a well contact, as shown in FIG. 41, the conventional method forms a semiconductor region wider than a semiconductor region of a NAND string, and forms a p$^+$-type region $70_d$ in this portion. Accordingly, this method requires lithography to break the periodicity between the semiconductor region and an isolation. This makes it very difficult to make the width of a semiconductor region adjacent to the semiconductor region having the p$^+$-type region $70_d$ equal to that of a semiconductor region of a NAND string in the center of a cell array where the periodicity is high.

For example, pattern collapse occurs if the width of the semiconductor region adjacent to the semiconductor region having the p$^+$-type region $70_d$ is smaller than that of the semiconductor region of the NAND string in the center of the cell array where the periodicity is high.

By contrast, if the width of the semiconductor region adjacent to the semiconductor region having the p$^+$-type region $70_d$ is smaller than that of the semiconductor region of the NAND string in the center of the cell array where the periodicity is high, the width of the isolation insulating film 24 adjacent to the semiconductor region having the p$^+$-type region $70_d$ decreases. Consequently, the burying aspect ratio of the isolation insulating film 24 increases to cause a defect by which the isolation insulating film 24 does not completely fill the buried region.

Both the cases lead to a short circuit of adjacent control gate electrodes 27, thereby decreasing the yield and deteriorating the reliability.

As shown in FIG. 35, however, this embodiment forms the p$^+$-type region $70_d$ serving as a cell p-well contact region in a device area having the same width and the same isolation width as the semiconductor region of the NAND string. This obviates the need for lithography which breaks the periodicity between the semiconductor region and isolation. Therefore, a semiconductor region and isolation can be formed at a narrower pitch while the periodicity is assured.

This makes it possible to avoid the pattern collapse which may occur in the conventional method described above, and the defect by which the isolation insulating film 24 does not completely fill the buried region, thereby improving the burying uniformity of isolation, the yield, and the reliability.

In the nonvolatile semiconductor storage device according to this embodiment, as shown in FIG. 35, in the semiconductor region 23 for forming the cell well contacts 34, the isolation insulating film 24 can be kept higher than the side surfaces of the cell p-well region 23 when compared to the conventional device shown in FIG. 41.

Since the upper surface of the isolation insulating film 24 is higher than that of the cell p-well region 23 as described above, it is possible to prevent ions for forming the p$^+$-type region $70_d$ for reducing the contact resistance from being implanted deep from the side surfaces of the cell p-well region 23.

If the p$^+$-type region $70_d$ is formed deep particularly to the lower corner of the isolation insulating film 24, stress concentration readily occurs in this corner. Consequently, the concentrated stress combines with a crystal defect of ion implantation to form a dislocation line from the vicinity of the corner. If this dislocation line penetrates to the cell p-well region 23, an n-type well 22, and a p-type substrate 21, leakage or a breakdown voltage defect occurs through the dislocation line. However, this embodiment can reduce the occurrence of this problem by preventing the p$^+$-type region $70_d$ from reaching the lower corner of the isolation.

The p$^+$-type region often extends deeper especially because boron as a p-type impurity has a larger diffusion constant as an impurity in an Si semiconductor than that of an impurity for forming the n-type source/drain electrode. However, the use of the structure explained in this embodiment can prevent the leakage and breakdown voltage defect occurring through the dislocation line. Also, since the p$^+$-type region $70_d$ can be formed shallow as described above, the distance to the nearby n-type source/drain region $28_d$ can be held. Accordingly, the breakdown voltage between the p$^+$-type region $70_d$ and n-type source/drain region $28_d$ can be assured.

Fifth Embodiment

Figure 43:
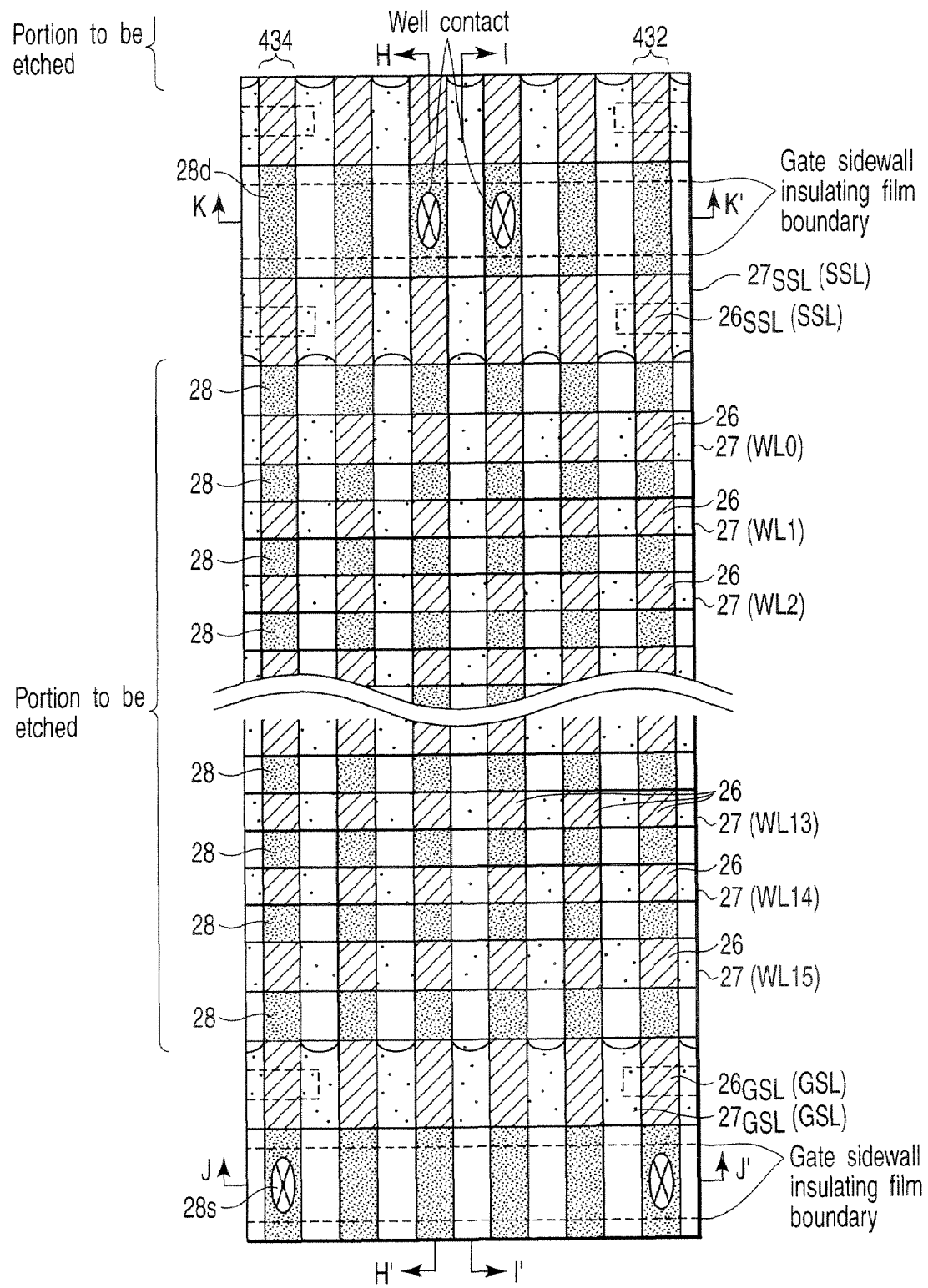
FIG. 43 is a plan view showing the layout of well contact portions of a nonvolatile semiconductor storage device according to the fifth embodiment of the present invention.

FIG. 43 is a plan view of the layout of well contact portions of a nonvolatile semiconductor storage device according to the fifth embodiment of the present invention. Note that the same reference numerals as in the first to fourth embodiments denote the same parts, and a detailed explanation thereof will be omitted. Note also that the suffixes of symbols represent the differences between the positions of elements used, and elements having the same main symbol indicate parts formed in the same step by using the same material.

Figure 44:
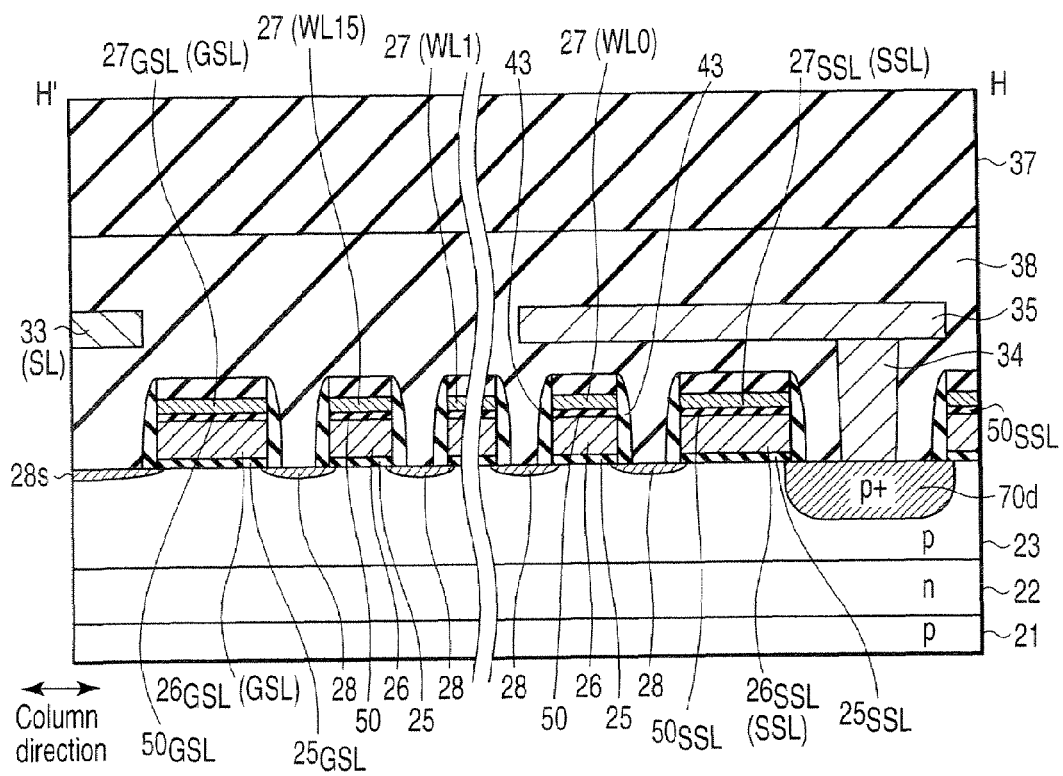
FIG. 44 is a sectional view taken along a line H-H' in FIG. 43 and showing the well contact portion.
Figure 45:
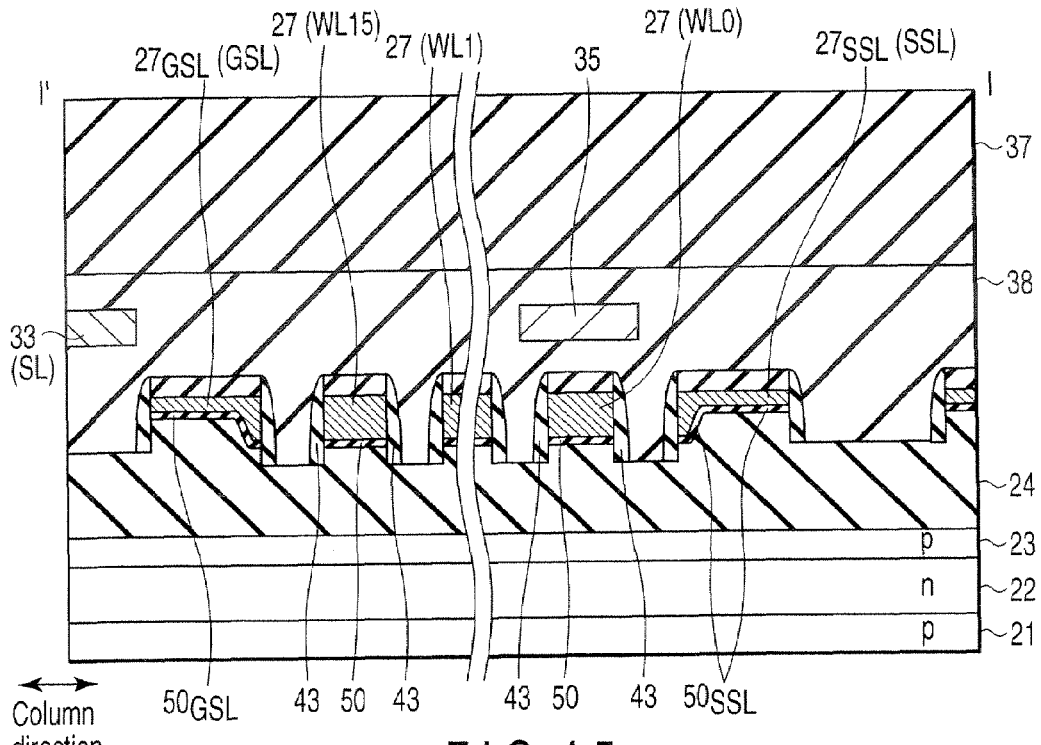
FIG. 45 is a sectional view taken along a line I-I' in FIG. 43 and showing an isolation.

FIGS. 44 and 45 are sectional views taken along lines H-H' and I-I', respectively, in FIG. 43. Sectional views taken along lines K-K' and J-J' in FIG. 43 are the same as FIGS. 35 and 36, respectively, so these sectional views are omitted.

This embodiment is directed to a well contact portion formed between memory cell string portions of the NAND flash memory according to the first embodiment. FIG. 43 shows well contact portions 34 formed along the row direction parallel to NAND strings having the data transfer line contacts shown in FIG. 2. The well contact portion 34 is a contact formed to hold a cell p-well region 23 at a constant potential.

As shown in FIG. 35, this embodiment also forms a p$^+$-type region $70_d$ serving as a cell p-well contact region in a device area having the same width and the same isolation width as a semiconductor region of a NAND string.

In the conventional structure in which the second electrode layer $27_{SSL}$ and the p-well region 23 of the memory cell are close to each other as shown in FIG. 15, the threshold value decreases even in a selection gate transistor close to the p-well contact portion 34 shown in FIG. 44. Especially in the portion where no slit-like holes are formed by etching the third and fourth insulating films $50_{SSL}$ and $50_{GSL}$, the amount of the effective insulating film from the second and fourth electrode layers $27_{SSL}$ and $27_{GSL}$ as the control gate electrodes to the substrate increases by the amount of the third and fourth insulating films $50_{SSL}$ and $50_{GSL}$. Accordingly, the transconductance viewed from the second and fourth electrode layers $27_{SSL}$ and $27_{GSL}$ further decreases to worsen the cutoff characteristic of the transistor.

In dummy cell regions 432 and 434 and the p-well contact portions 34, therefore, the problem that the electric charge selectively stored in the NAND string escapes to the data transfer line readily arises, and this applies the write stress to portions (memory cells connected to WL0 to WL15) having the same shape as memory cells shown in FIG. 44. The application of the write and erase stresses increases the leakage current of the memory cell data select lines WL0 to WL15.

By contrast, the use of the structure of this embodiment in which the second electrode layer $27_{SSL}$ can be separated from the p-well region 23 as shown in FIG. 7 makes it possible to implement a highly reliable nonvolatile semiconductor storage device which suppresses write errors in cells even in the well contact portions 34.

As in the first embodiment, this embodiment can also suppress the decrease in threshold value of the selection gate transistor in the memory cell block, and can further decrease the variation in threshold value. Accordingly, it is possible to avoid the problem that electric charge selectively stored in a NAND string so as not to write data during programming escapes to the data transfer line, and obtain the effect of suppressing write errors in memory cells.

Sixth Embodiment

Figure 46:
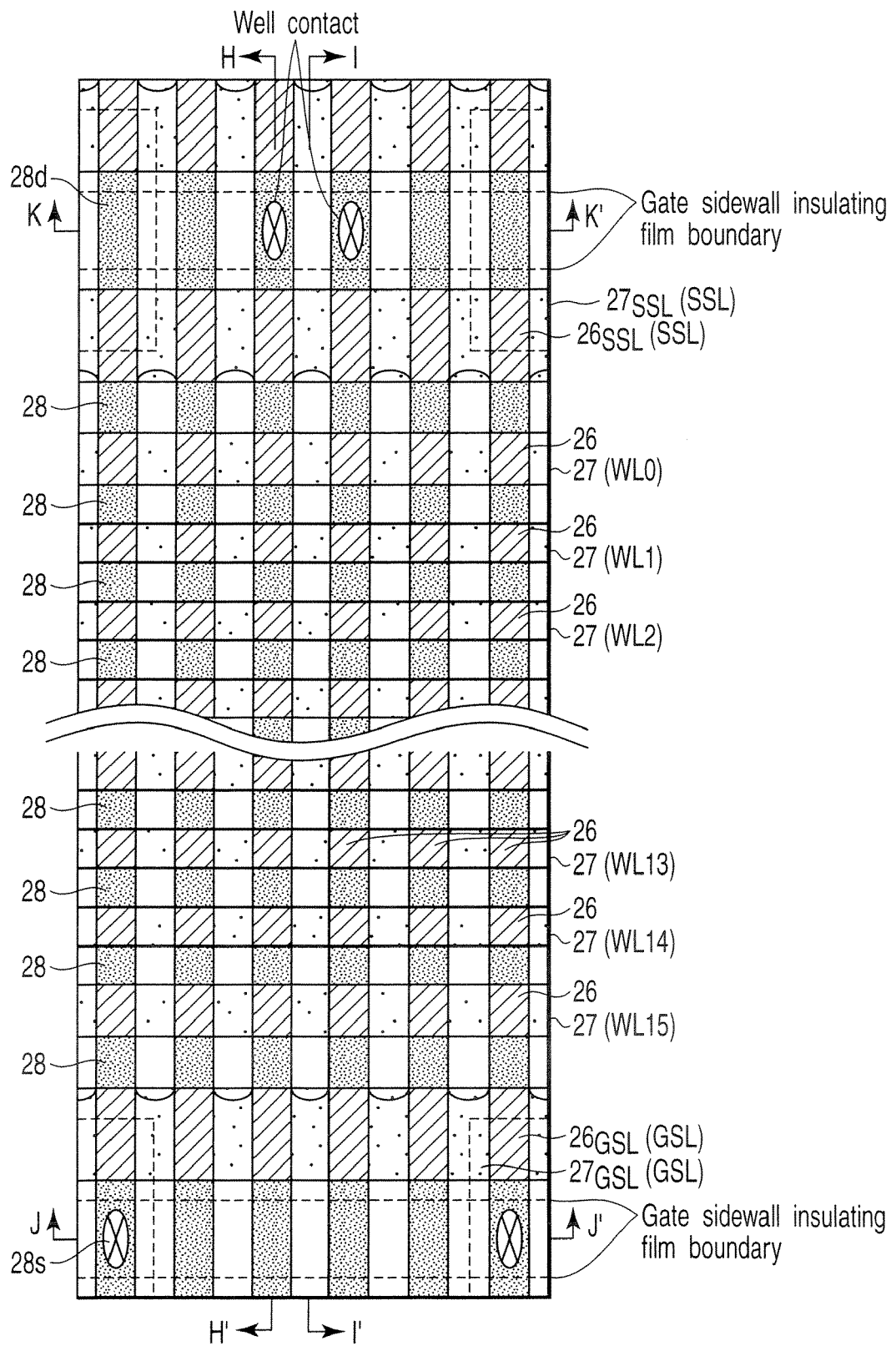
FIG. 46 is a plan view showing the layout of well contact portions of a nonvolatile semiconductor storage device according to the sixth embodiment of the present invention.

FIG. 46 is a plan view of the layout of well contact portions of a nonvolatile semiconductor storage device according to the sixth embodiment of the present invention. Note that the same reference numerals as in the first to fifth embodiments denote the same parts, and a detailed explanation thereof will be omitted. Note also that the suffixes of symbols represent the differences between the positions of elements used, and elements having the same main symbol indicate parts formed in the same step by using the same material.

Figure 47:
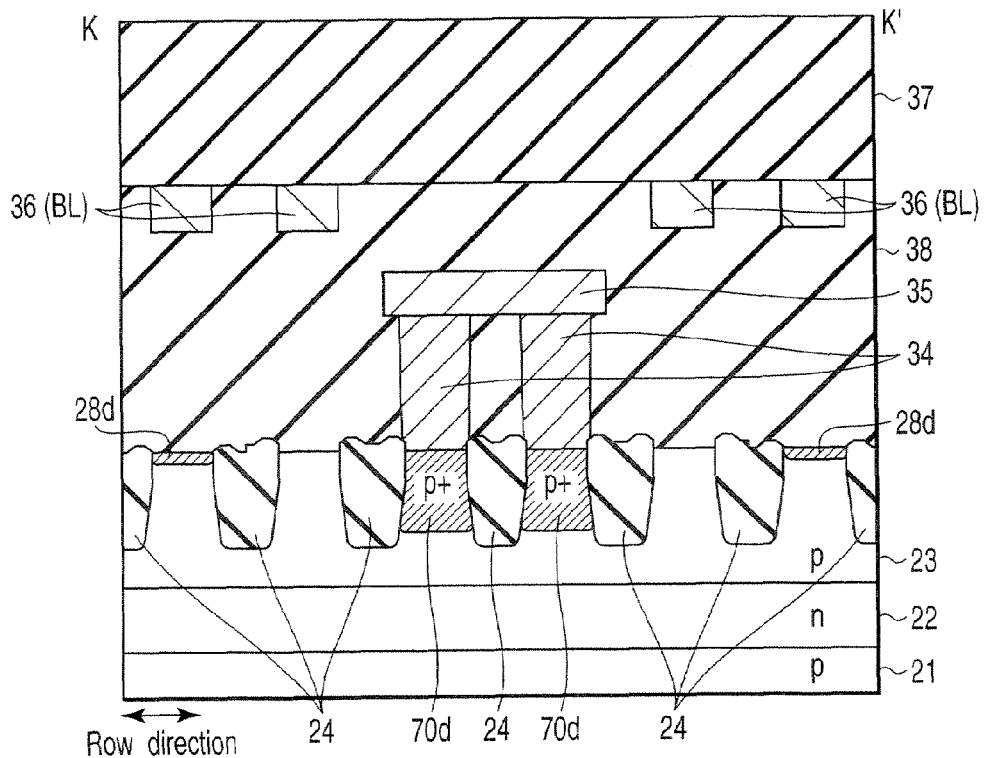
FIG. 47 is a sectional view taken along a line K-K' in FIG. 46 and showing the well contact portions.
Figure 48:
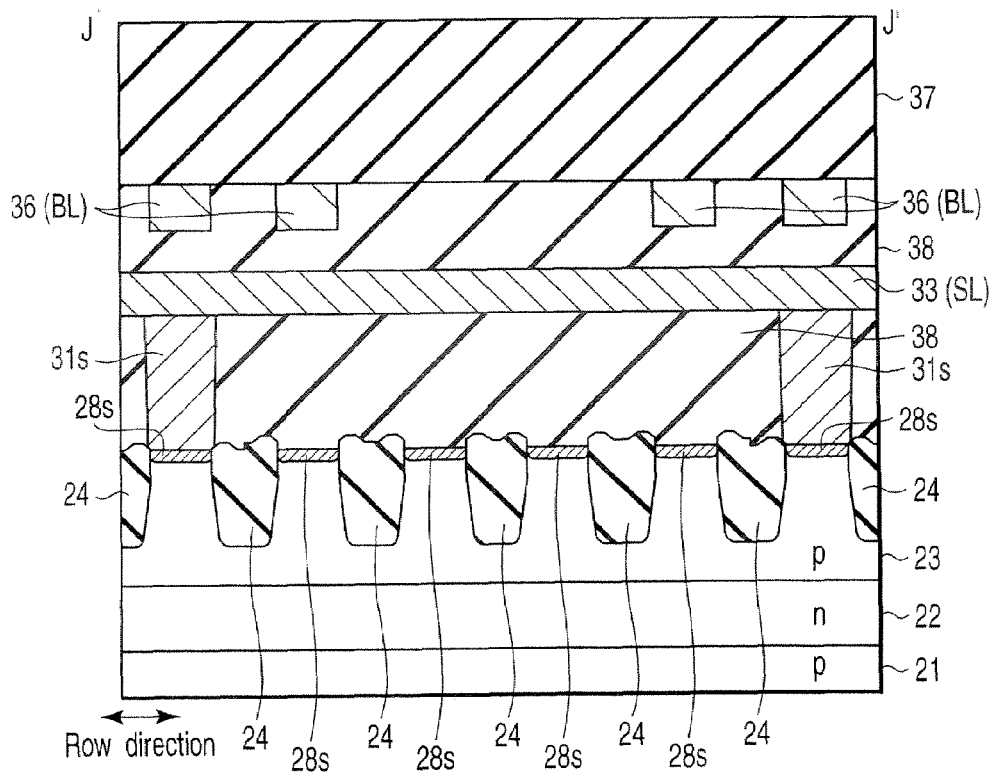
FIG. 48 is a sectional view taken along a line J-J' in FIG. 46 and showing source line contacts.

FIGS. 47 and 48 are sectional views taken along lines K-K' and J-J', respectively, in FIG. 46. FIGS. 49 and 50 are sectional views taken along lines H-H' and I-I', respectively, in FIG. 46.

This embodiment is directed to a well contact portion formed between memory cell string portions of the NAND flash memory according to the second embodiment. FIG. 46 shows well contact portions 34 formed along the row direction parallel to NAND strings having the data transfer line contacts shown in FIG. 18. The well contact portion 34 is a contact formed to hold a cell p-well region 23 at a constant potential.

As shown in FIG. 47, this embodiment also forms p$^+$-type regions $70_d$ serving as cell p-well contact regions in a device area having the same width and the same isolation width as a semiconductor region of a NAND string.

This embodiment achieves the following effects in addition to the effects obtained in the fifth embodiment.

For example, this embodiment forms holes in third and fourth insulating films $50_{SSL}$ and $50_{GSL}$ by patterns enclosed with the broken lines in FIG. 46, and hence can perform etching in a wide etching area. Therefore, it is possible to use inexpensive lithography having a resolution lower than that in the first or fifth embodiment. It is also possible to use an inexpensive etching apparatus because no fine etching trenches need be formed.

Seventh Embodiment

Figure 51:
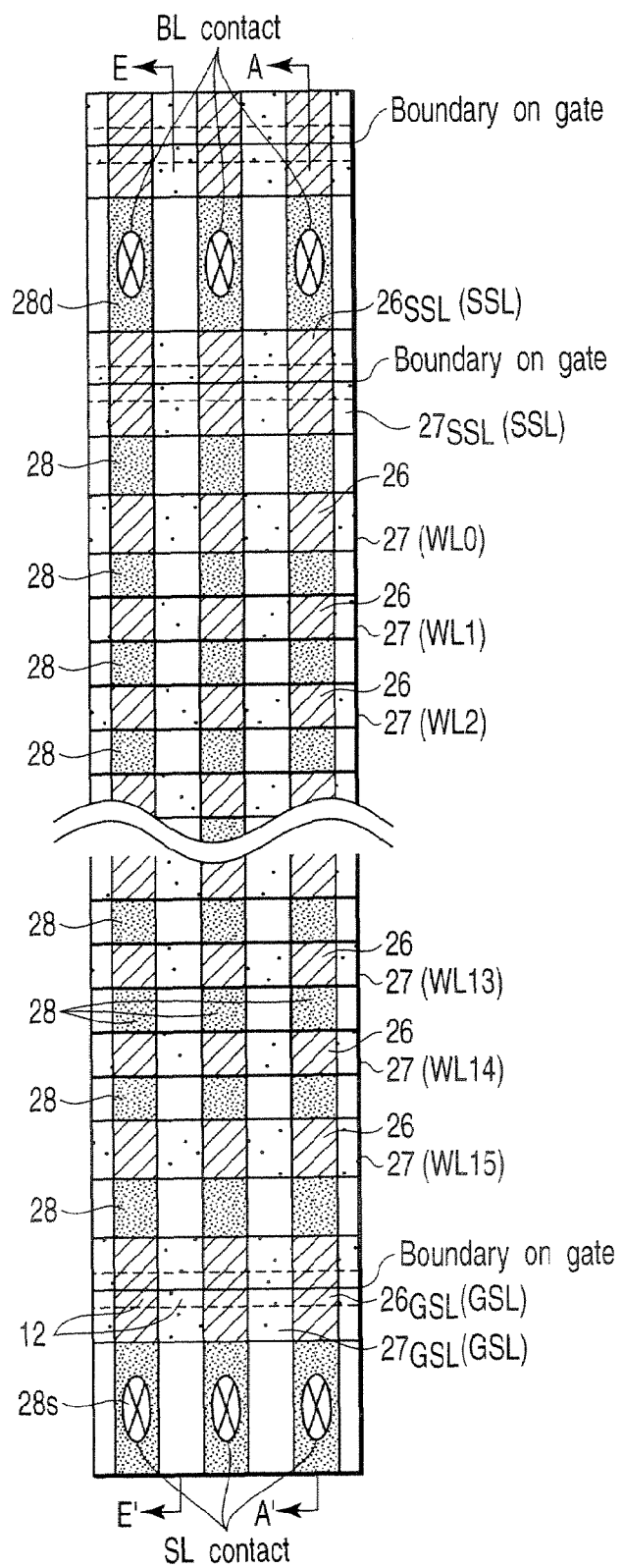
FIG. 51 is a plan view showing the layout of a nonvolatile semiconductor storage device according to the seventh embodiment of the present invention.
Figure 52:
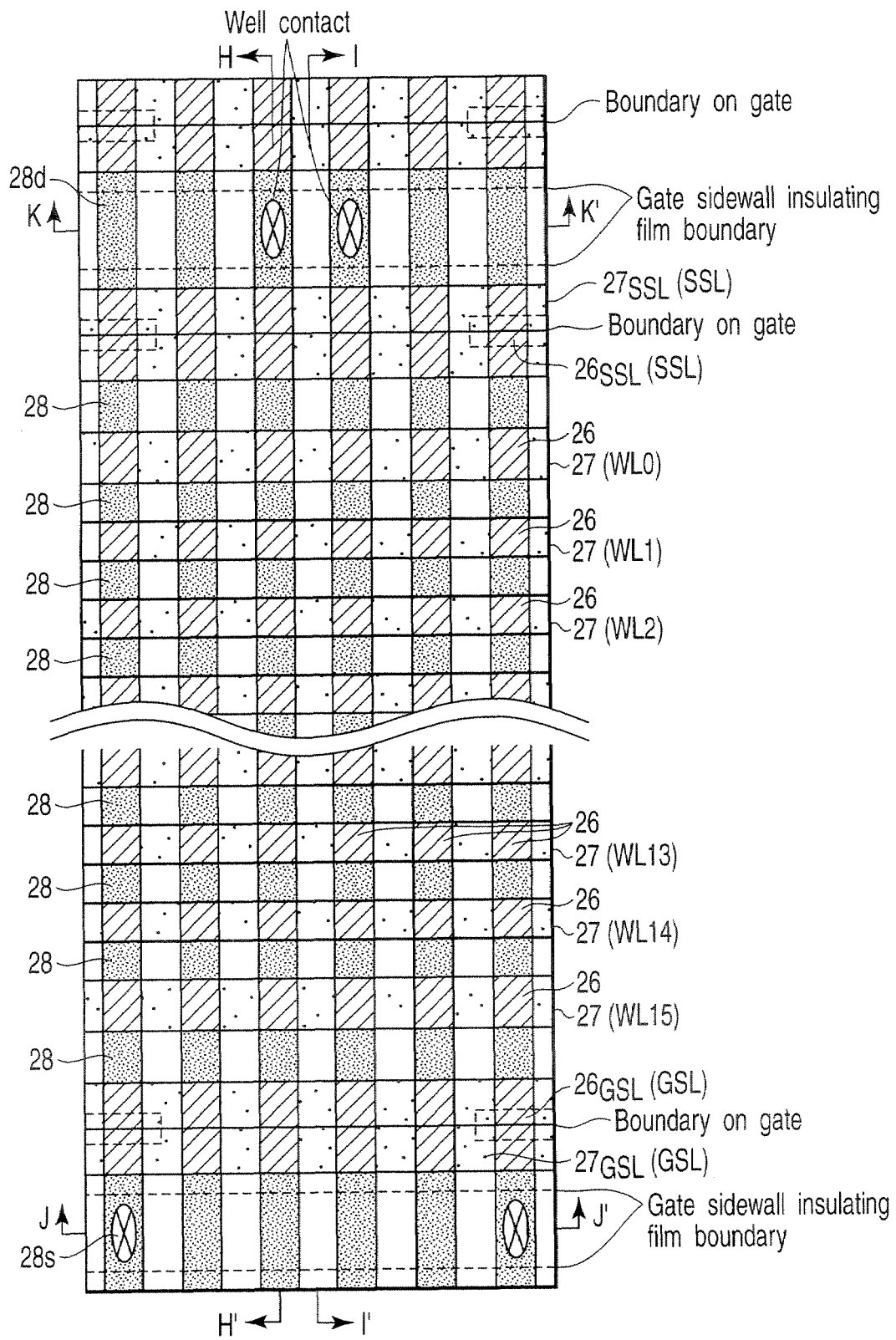
FIG. 52 is a plan view showing the layout of well contact portions of the nonvolatile semiconductor storage device according to the seventh embodiment of the present invention.

FIG. 51 is a plan view of the layout of memory cell string portions of a nonvolatile semiconductor storage device according to the seventh embodiment of the present invention. FIG. 52 is a plan view of the layout of well contact portions formed parallel to the memory cell string portions.

Note that in the following description, the same reference numerals as in the first to sixth embodiments denote the same parts, and a detailed explanation thereof will be omitted. Note also that the suffixes of symbols represent the differences between the positions of elements used, and elements having the same main symbol indicate parts formed in the same step by using the same material.

FIG. 51 shows a structure obtained by juxtaposing three NAND strings shown in the equivalent circuit diagram of FIG. 1. FIG. 51 shows only a structure below gate electrodes 27 in order to clearly indicate the cell structure. Referring to FIG. 51, nonvolatile memory cells M0 to M15 comprising MOS transistors each having a floating gate electrode 26 connect in series, and one end connects to a data transfer line via a selection transistor S1. The other end connects to a common source line via a selection transistor S2.

Figure 53:
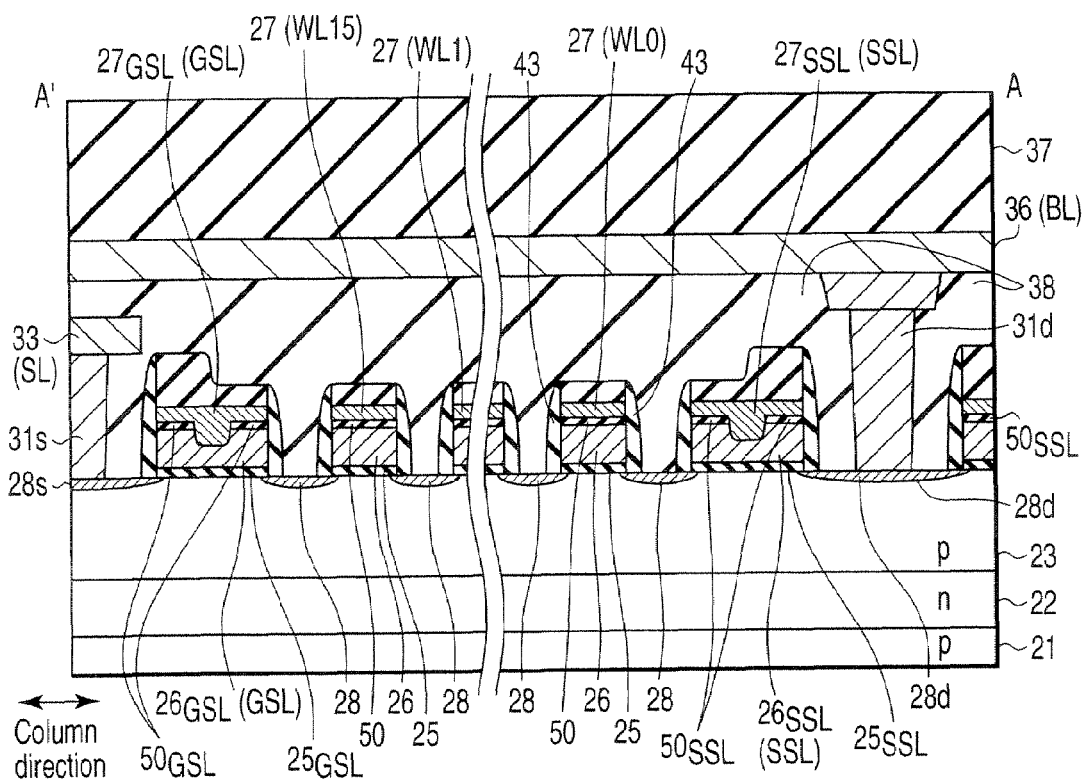
FIG. 53 is a sectional view taken along a line A-A' in FIG. 51 and showing a region including a NAND memory cell block and selection gate transistors.
Figure 54:
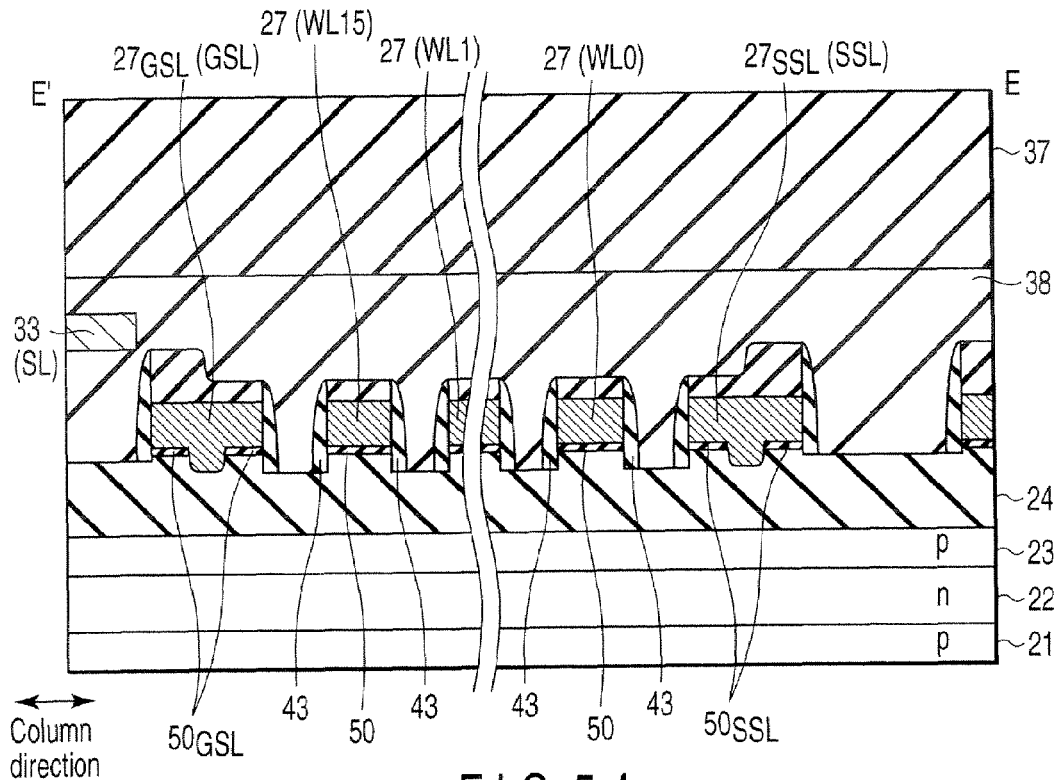
FIG. 54 is a sectional view taken along a line E-E' in FIG. 51 and showing an isolation.

FIGS. 53 and 54 are sectional views taken along lines A-A' and E-E', respectively, in FIG. 51. FIG. 53 is a sectional view of a region including a NAND memory cell block and selection gate transistors. FIG. 54 is a sectional view of isolations.

FIG. 52 shows well contact portions 34 formed along the row direction parallel to the NAND strings having data transfer line contacts shown in FIG. 51. The well contact portion 34 is a contact formed to hold a cell p-well region 23 at a constant potential.

FIGS. 55 and 56 are sectional views taken along lines H-H' and I-I', respectively, in FIG. 52. Sectional views taken along lines K-K' and J-J' in FIG. 52 are the same as FIGS. 35 and 36, respectively, so explanations of these sectional views will be omitted.

The first to sixth embodiments are examples of etching the memory cell portions without etching the data transfer line contacts and source line contacts when etching the isolation insulating film 24.

By contrast, in the nonvolatile semiconductor storage device according to the seventh embodiment of the present invention, an isolation insulating film 24 is not selectively etched. Instead, when etching a control gate electrode 27, a second electrode layer $27_{SSL}$, a fourth electrode layer $27_{GSL}$, interpoly insulating films 50 (a second insulating film), $50_{SSL}$ (a third insulating film), and $50_{GSL}$ (a fourth insulating film), the floating gate electrode 26, a first electrode layer $26_{SSL}$, and a third electrode layer $26_{GSL}$, the isolation insulating film 24 in the data transfer line contacts and source line contacts is not etched, and the isolation insulating film 24 in the memory cell portions is etched.

This embodiment patterns and anisotropically etches the control gate electrode 27, second electrode layer $27_{SSL}$, fourth electrode layer $27_{GSL}$, interpoly insulating films 50, $50_{SSL}$, and $50_{GSL}$, floating gate electrode 26, first electrode layer $26_{SSL}$, and third electrode layer $26_{GSL}$ by using a resist and lithography process. When exposing the semiconductor substrate in the source and drain electrode portions, therefore, this embodiment etches the isolation insulating film 24 in the memory cell portions without etching the isolation insulating film 24 in the data transfer line contacts and source line contacts.

Referring to FIGS. 51 and 52, a line denoted by "Boundary on gate" indicates the etching boundary. This boundary need only be formed above the selection gate transistors S1 and S2. It is of course also possible to combine this structure with the structures of the first to third embodiments.

As shown in FIGS. 54 and 56, the use of the structure of the nonvolatile semiconductor storage device according to this embodiment can give a constant height to the second and fourth electrode layers $27_{SSL}$ and $27_{GSL}$ formed on the isolation insulating film 24 via the third and fourth insulating films $50_{SSL}$ and $50_{GSL}$.

Generally, as micropatterning progresses, the length in the A-A' direction of the semiconductor region 23 for forming a data transfer line contact $31_d$ and source line contact $31_s$ becomes much larger than 3F, i.e., a triple of a minimum design width F of the cell. Accordingly, when non-masking isolation etch back is performed on the isolation insulating film 24, the micro-loading effect of anisotropic etching for gate electrode processing etches the surfaces of the isolation 24 on the sides of the data transfer line contact $31_d$ and source line contact $31_s$ deeper than the surface of the isolation 24 on the memory cell side.

Also, when anisotropically etching gate sidewall insulating films 43, if the gate sidewall insulating films 43 are made of a silicon oxide film and the isolation insulating film 24 is made of a silicon oxide film, the gate sidewall micro-loading effect etches the element isolating insulating film 24 deeper than the gate sidewall insulating films 43.

Since this embodiment performs gate etching in only the cell portions, it is possible to alleviate the problem that the micro-loading effect deeply etches the isolation insulating film 24.

In the semiconductor region 23 for forming the data line contacts and source line contacts as shown in FIGS. 8 and 9, this embodiment can also hold the upper surface of the isolation insulating film 24 higher than that in the prior art with respect to the side surfaces of the p-well region 23. Therefore, this embodiment can achieve the same effects as in the first embodiment in the memory cell string portions.

Also, as shown in FIG. 35, in the semiconductor region 23 for forming the cell well contacts 34, this embodiment can hold the isolation insulating film 24 higher than that in the prior art shown in FIG. 41 with respect to the side surfaces of the cell p-well region 23.

As in the fourth embodiment, therefore, it is possible to prevent, when elements are micropatterned, a defect formed by overlapping of the bottom corner of the isolation and the $n^+$-type or $p^+$-type region formed in the source/drain region or well contact region.

This makes it possible to prevent leakage or a breakdown voltage defect caused by a dislocation line, and improve the reliability of the semiconductor storage element. In addition, the breakdown voltage between a $p^+$-type region $70_d$ and n-type source/drain region $28_d$ can also be secured.

Other embodiments of the present invention are as follows. As the isolation insulating film formation method or the insulating film formation method, it is also possible to use, e.g., a method of implanting oxygen ions into deposited silicon and a method of oxidizing deposited silicon, instead of the method of converting silicon into a silicon oxide film or silicon nitride film. As the insulating film, it is also possible to use $TiO_2$, $Al_2O_3$, HFAlO, HFSiO, a tantalum oxide film, strontium titanate, barium titanate, lead zirconium titanate, or a stacked film of these materials.

The above embodiments use a p-type Si substrate as the semiconductor substrate. However, it is also possible to use an n-type Si substrate, an SOI substrate, or another single-crystal semiconductor substrate containing silicon, such as SiGe mixed crystal or SiGeC mixed crystal.

Furthermore, the control gate electrode 27, second electrode layer $27_{SSL}$, and fourth electrode layer $27_{GSL}$ can be made of a silicide or polycide such as SiGe mixed crystal, SiGeC mixed crystal, TiSi, NiSi, CoSi, TaSi, WSi, or MoSi, or a metal such as Ti, Al, Cu, TiN, or W, and may also be made of a polycrystalline material or have a stacked structure of these materials.

The floating gate electrode 26, first electrode layer $26_{SSL}$, and third electrode layer $26_{GSL}$ can be made of amorphous Si, amorphous SiGe, or amorphous SiGeC, and may also have a stacked structure of these materials.

One aspect of the present invention can provide a nonvolatile semiconductor storage device which improves the memory cell write characteristics by preventing the decrease in selection gate transistor threshold value.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor storage device comprising a plurality of juxtaposed NAND strings, each of said plurality of NAND strings comprising:

a memory cell block obtained by connecting current paths of a plurality of nonvolatile memory cells in series, each of said plurality of nonvolatile memory cells comprising a floating gate electrode formed on a first insulating film on a device area isolated by an isolation insulating film which forms an isolation in a semiconductor substrate, and a control gate electrode formed on a second insulating film on the floating gate electrode to cover side surfaces and an upper surface of the floating gate electrode;

a first selection gate transistor comprising a first gate electrode in which a first electrode layer made of the same electrode material as the floating gate electrode and a second electrode layer made of the same electrode material as the control gate electrode are formed in direct contact with each other through a first hole formed in a portion of a third insulating film made of the same insulating material as the second insulating film, a current path of the first selection gate transistor comprising one end connected to one end of current paths of series-connected nonvolatile memory cells in the memory cell block, and the other end connected to a data transfer line via a data transfer line contact; and a second selection gate transistor comprising a second gate electrode in which a third electrode layer made of the same electrode material as the floating gate electrode and a fourth electrode layer made of the same electrode material as the control gate electrode are formed in direct contact with each other through a second hole formed in a portion of a fourth insulating film made of the same insulating material as the second insulating film, a current path of the second selection gate transistor comprising one end connected to the other end of the current paths of the series-connected nonvolatile memory cells in the memory cell block, and the other end connected to a source line via a source line contact, wherein an upper surface of the isolation insulating film between the data transfer line contacts included in adjacent NAND strings is higher than a major surface of the semiconductor substrate in a device area between the other end of the current path of the first selection gate transistor and the data transfer line contact, or an upper surface of the isolation insulating film between the source line contacts included in adjacent NAND strings is higher than a major surface of the semiconductor substrate in a device area between the other end of the current path of the second selection gate transistor and the source line contact.

2. A nonvolatile semiconductor storage device comprising:

a memory cell block obtained by connecting current paths of a plurality of nonvolatile memory cells in series, each of said plurality of nonvolatile memory cells comprising a floating gate electrode formed on a first insulating film on a device area isolated by an isolation insulating film which forms an isolation in a semiconductor substrate, and a control gate electrode formed on a second insulating film on the floating gate electrode to cover side surfaces and an upper surface of the floating gate electrode;

a first selection gate transistor comprising a first gate electrode in which a first electrode layer made of the same electrode material as the floating gate electrode and a second electrode layer made of the same electrode material as the control gate electrode are formed in direct contact with each other through a first hole formed in a portion of a third insulating film made of the same insulating material as the second insulating film, a current path of the first selection gate transistor comprising one end connected to one end of current paths of series-connected nonvolatile memory cells in the memory cell block, and the other end connected to a data transfer line via a data transfer line contact; and a second selection gate transistor comprising a second gate electrode in which a third electrode layer made of the same electrode material as the floating gate electrode and a fourth electrode layer made of the same electrode material as the control gate electrode are formed in direct contact with each other through a second hole formed in a portion of a fourth insulating film made of the same insulating material as the second insulating film, a current path of the second selection gate transistor comprising one end connected to the other end of the current paths of the series-connected nonvolatile memory cells in the memory cell block, and the other end connected to a source line via a source line contact, wherein a bottom surface of the third insulating film formed in contact with the first hole on the isolation is higher than a bottom surface of the second insulating film formed on the isolation, or a bottom surface of the fourth insulating film formed in contact with the second hole on the isolation is higher than the bottom surface of the second insulating film formed on the isolation.

3. A nonvolatile semiconductor storage device comprising a plurality of juxtaposed NAND strings, each of said plurality of NAND strings comprising:

a memory cell block obtained by connecting current paths of a plurality of nonvolatile memory cells in series, each of said plurality of nonvolatile memory cells comprising a floating gate electrode formed on a first insulating film on a device area isolated by an isolation insulating film which forms an isolation in a semiconductor substrate, and a control gate electrode formed on a second insulating film on the floating gate electrode to cover side surfaces and an upper surface of the floating gate electrode;

a first selection gate transistor comprising a first gate electrode in which a first electrode layer made of the same electrode material as the floating gate electrode and a second electrode layer made of the same electrode material as the control gate electrode are formed in direct contact with each other through a first hole formed in a portion of a third insulating film made of the same insulating material as the second insulating film, a current path of the first selection gate transistor comprising one end connected to one end of current paths of series-connected nonvolatile memory cells in the memory cell block, and the other end connected to a data transfer line via a data transfer line contact; and a second selection gate transistor comprising a second gate electrode in which a third electrode layer made of the same electrode material as the floating gate electrode and a fourth electrode layer made of the same electrode material as the control gate electrode are formed in direct contact with each other through a second hole formed in a portion of a fourth insulating film made of the same insulating material as the second insulating film, a current path of the second selection gate transistor comprising one end connected to the other end of the current paths of the series-connected nonvolatile memory cells in the memory cell block, and the other end connected to a source line via a source line contact, wherein an upper surface of the isolation insulating film between the data transfer line contacts included in adjacent NAND strings is higher than an upper surface of the isolation insulating film in a region which is sandwiched between the same electrode materials as the control gate electrode and connects the control gate electrodes included in the adjacent NAND strings, or an upper surface of the isolation insulating film between the source line contacts included in adjacent NAND strings is higher than an upper surface of the isolation insulating film in a region which is sandwiched between the same electrode materials as the control gate electrode and connects the control gate electrodes included in the adjacent NAND strings.

4. A nonvolatile semiconductor storage device comprising a plurality of juxtaposed NAND strings, each of said plurality of NAND strings comprising:

a memory cell block obtained by connecting current paths of a plurality of nonvolatile memory cells in series, each of said plurality of nonvolatile memory cells comprising a floating gate electrode formed on a first insulating film on a device area isolated by an isolation insulating film which forms an isolation in a semiconductor substrate, and a control gate electrode formed on a second insulating film on the floating gate electrode to cover side surfaces and an upper surface of the floating gate electrode;

a first selection gate transistor comprising a first gate electrode in which a third insulating film made of the same insulating material as the second insulating film covers at least a portion of an upper surface of a first electrode layer made of the same electrode material as the floating gate electrode, and a second electrode layer made of the same electrode material as the control gate electrode is formed in direct contact with the first electrode layer to cover an upper surface of the third insulating film, a current path of the first selection gate transistor comprising one end connected to one end of current paths of series-connected nonvolatile memory cells in the memory cell block, and the other end connected to a data transfer line via a data transfer line contact; and a second selection gate transistor comprising a second gate electrode in which a fourth insulating film made of the same insulating material as the second insulating film covers at least a portion of an upper surface of a third electrode layer made of the same electrode material as the floating gate electrode, and a fourth electrode layer made of the same electrode material as the control gate electrode is formed in direct contact with the third electrode layer to cover an upper surface of the fourth insulating film, a current path of the second selection gate transistor comprising one end connected to the other end of the current paths of the series-connected nonvolatile memory cells in the memory cell block, and the other end connected to a source line via a source line contact, wherein an upper surface of the isolation insulating film between the data transfer line contacts included in adjacent NAND strings is higher than a major surface of the semiconductor substrate in a device area between the other end of the current path of the first selection gate transistor and the data transfer line contact, or an upper surface of the isolation insulating film between the source line contacts included in adjacent NAND strings is higher than a major surface of the semiconductor substrate in a device area between the other end of the current path of the second selection gate transistor and the source line contact.

5. A device according to claim 1, wherein the second electrode layer is in direct contact with the first electrode layer, the second electrode layer is formed to a position lower than a bottom surface of the third insulating film in the device area, or the fourth electrode layer is in direct contact with the third electrode layer, the fourth electrode layer is formed to a position lower than a bottom surface of the fourth insulating film in the device area.

6. A device according to claim 2, wherein
the second electrode layer is in direct contact with the first electrode layer, the second electrode layer is formed to a position lower than a bottom surface of the third insulating film in the device area, or
the fourth electrode layer is in direct contact with the third electrode layer, the fourth electrode layer is formed to a position lower than a bottom surface of the fourth insulating film in the device area.

7. A device according to claim 3, wherein
the second electrode layer is in direct contact with the first electrode layer, the second electrode layer is formed to a position lower than a bottom surface of the third insulating film in the device area, or
the fourth electrode layer is in direct contact with the third electrode layer, the fourth electrode layer is formed to a position lower than a bottom surface of the fourth insulating film in the device area.

8. A device according to claim 4, wherein
the second electrode layer is in direct contact with the first electrode layer, the second electrode layer is formed to a position lower than a bottom surface of the third insulating film in the device area, or
the fourth electrode layer is in direct contact with the third electrode layer, the fourth electrode layer is formed to a position lower than a bottom surface of the fourth insulating film in the device area.

9. A device according to claim 1, further comprising:
a well contact to hold a potential of a semiconductor region below the first insulating film constant,
in which the well contact is formed in another device area equal in width to the device area and juxtaposed with the NAND string via another isolation equal in width to the isolation.

10. A device according to claim 3, further comprising:
a well contact to hold a potential of a semiconductor region below the first insulating film constant,
in which the well contact is formed in another device area equal in width to the device area and juxtaposed with the NAND string via another isolation equal in width to the isolation.

11. A device according to claim 4, further comprising:
a well contact to hold a potential of a semiconductor region below the first insulating film constant,
in which the well contact is formed in another device area equal in width to the device area and juxtaposed with the NAND string via another isolation equal in width to the isolation.

12. A device according to claim 5, wherein
the second electrode layer is in direct contact with the isolation insulating film, the second electrode layer is formed to a position lower than a bottom surface of the third insulating film in the isolation, or
the fourth electrode layer is in direct contact with the isolation insulating film, the fourth electrode layer is formed to a position lower than a bottom surface of the fourth insulating film in the isolation.

13. A device according to claim 6, wherein
the second electrode layer is in direct contact with the isolation insulating film, the second electrode layer is formed to a position lower than a bottom surface of the third insulating film in the isolation, or
the fourth electrode layer is in direct contact with the isolation insulating film, the fourth electrode layer is formed to a position lower than a bottom surface of the fourth insulating film in the isolation.

14. A device according to claim 7, wherein
the second electrode layer is in direct contact with the isolation insulating film, the second electrode layer is formed to a position lower than a bottom surface of the third insulating film in the isolation, or
the fourth electrode layer is in direct contact with the isolation insulating film, the fourth electrode layer is formed to a position lower than a bottom surface of the fourth insulating film in the isolation.

15. A device according to claim 1, further comprising:
a plurality of data transfer lines formed parallel to each other on the NAND strings in one-to-one correspondence therewith;

a plurality of data select lines which are parallel to each other and perpendicular to the data transfer lines, and connect the control gate electrodes of the nonvolatile memory cells in said plurality of memory cell blocks isolated by the isolation;

a first control line which is parallel to said plurality of data select lines and connects the first gate electrodes of a plurality of first selection gate transistors isolated by the isolation; and a second control line which is parallel to said plurality of data select lines and connects the second gate electrodes of a plurality of second selection gate transistors isolated by the isolation.

16. A device according to claim 2, further comprising:

a plurality of memory cell blocks juxtaposed to each other via the isolation;

a plurality of data transfer lines formed parallel to each other on the memory cell blocks in one-to-one correspondence therewith;

a plurality of data select lines which are parallel to each other and perpendicular to the data transfer lines, and connect the control gate electrodes of the nonvolatile memory cells in said plurality of memory cell blocks isolated by the isolation;

a first control line which is parallel to said plurality of data select lines and connects the first gate electrodes of a plurality of first selection gate transistors isolated by the isolation; and a second control line which is parallel to said plurality of data select lines and connects the second gate electrodes of a plurality of second selection gate transistors isolated by the isolation.

17. A device according to claim 3, further comprising:

a plurality of data transfer lines formed parallel to each other on the NAND strings in one-to-one correspondence therewith;

a plurality of data select lines which are parallel to each other and perpendicular to the data transfer lines, and connect the control gate electrodes of the nonvolatile memory cells in said plurality of memory cell blocks isolated by the isolation;

a first control line which is parallel to said plurality of data select lines and connects the first gate electrodes of a plurality of first selection gate transistors isolated by the isolation; and a second control line which is parallel to said plurality of data select lines and connects the second gate electrodes of a plurality of second selection gate transistors isolated by the isolation.

18. A device according to claim 4, further comprising:

a plurality of data transfer lines formed parallel to each other on the NAND strings in one-to-one correspondence therewith;

a plurality of data select lines which are parallel to each other and perpendicular to the data transfer lines, and connect the control gate electrodes of the nonvolatile memory cells in said plurality of memory cell blocks isolated by the isolation;

a first control line which is parallel to said plurality of data select lines and connects the first gate electrodes of a plurality of first selection gate transistors isolated by the isolation; and a second control line which is parallel to said plurality of data select lines and connects the second gate electrodes of a plurality of second selection gate transistors isolated by the isolation.

19. A device according to claim 1, which further comprises a conductive well in the semiconductor substrate, and in which the memory cell block, the first selection gate transistor, and the second selection gate transistor are formed in the conductive well.

20. A device according to claim 2, which further comprises a conductive well in the semiconductor substrate, and in which the memory cell block, the first selection gate transistor, and the second selection gate transistor are formed in the conductive well.

* * * * *